(12) United States Patent  (10) Patent No.: US 8,587,087 B2
Arai et al.  (45) Date of Patent: Nov. 19, 2013

(54) SEMICONDUCTOR DEVICE AND MANUFACTURING METHOD OF THE SAME

(75) Inventors: Daisuke Arai, Kanagawa (JP); Yoshito Nakazawa, Kanagawa (JP); Norio Hosoya, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 204 days.

(21) Appl. No.: 13/060,737

(22) PCT Filed: Feb. 25, 2010

(86) PCT No.: PCT/JP2010/052990
§ 371 (c)(1),
(2), (4) Date: Feb. 25, 2011

(87) PCT Pub. No.: WO2011/104850
PCT Pub. Date: Sep. 1, 2011

(65) Prior Publication Data
US 2011/0204413 A1  Aug. 25, 2011

(51) Int. Cl.
*H01L 29/74* (2006.01)
(52) U.S. Cl.
USPC .......................... 257/526; 257/517; 257/565
(58) Field of Classification Search
USPC .......................... 257/517, 526, 565
See application file for complete search history.

(56) References Cited

U.S. PATENT DOCUMENTS

| 6,246,104 | B1 * | 6/2001 | Tsuda et al. | 257/558 |
| 6,734,500 | B2 * | 5/2004 | Ebina | 257/347 |
| 7,476,942 | B2 * | 1/2009 | Watanabe et al. | 257/370 |
| 2007/0235804 | A1 | 10/2007 | Watanabe et al. | |
| 2008/0179663 | A1 | 7/2008 | Terashima | |
| 2009/0050932 | A1 | 2/2009 | Lu et al. | |
| 2009/0057712 | A1 | 3/2009 | Terashima | |

FOREIGN PATENT DOCUMENTS

| JP | 2-271679 | A | 11/1990 |
| JP | 8-097413 | A | 4/1996 |
| JP | 10-163496 | A | 6/1998 |
| JP | 2006-100779 | A | 4/2006 |
| JP | 2006-237553 | A | 9/2006 |
| JP | 2007-281293 | A | 10/2007 |
| JP | 2008-153454 | A | 7/2008 |
| JP | 2008-186921 | A | 8/2008 |
| JP | 2008-532257 | A | 8/2008 |
| JP | 2010-062262 | A | 3/2010 |

OTHER PUBLICATIONS

Akio Nakagawa, "Theoretical Investigation of Silicon Limit Characteristics of IGBT", Proceedings of the 18th International Symposium on Power Semiconductor Devices & IC's Jun. 4-8, 2006 Naples, Italy.
Japanese Office Action issued Jun. 4, 2013 in corresponding Japanese Patent Application No. 2008-225031.

* cited by examiner

*Primary Examiner* — Eugene Lee
(74) *Attorney, Agent, or Firm* — Miles & Stockbridge P.C.

(57) ABSTRACT

In order to improve characteristics of an IGBT, particularly, to reduce steady loss, turn-off time and turn-off loss, a thickness of a surface semiconductor layer is set to about 20 nm to 100 nm in an IGBT including: a base layer; a buried insulating film provided with an opening part; the surface semiconductor layer connected to the base layer below the opening part; a p type channel forming layer formed in the surface semiconductor layer; an $n^+$ type source layer; a $p^+$ type emitter layer; a gate electrode formed over the surface semiconductor layer via a gate insulating film; an $n^+$ type buffer layer; and a p type collector layer.

38 Claims, 73 Drawing Sheets

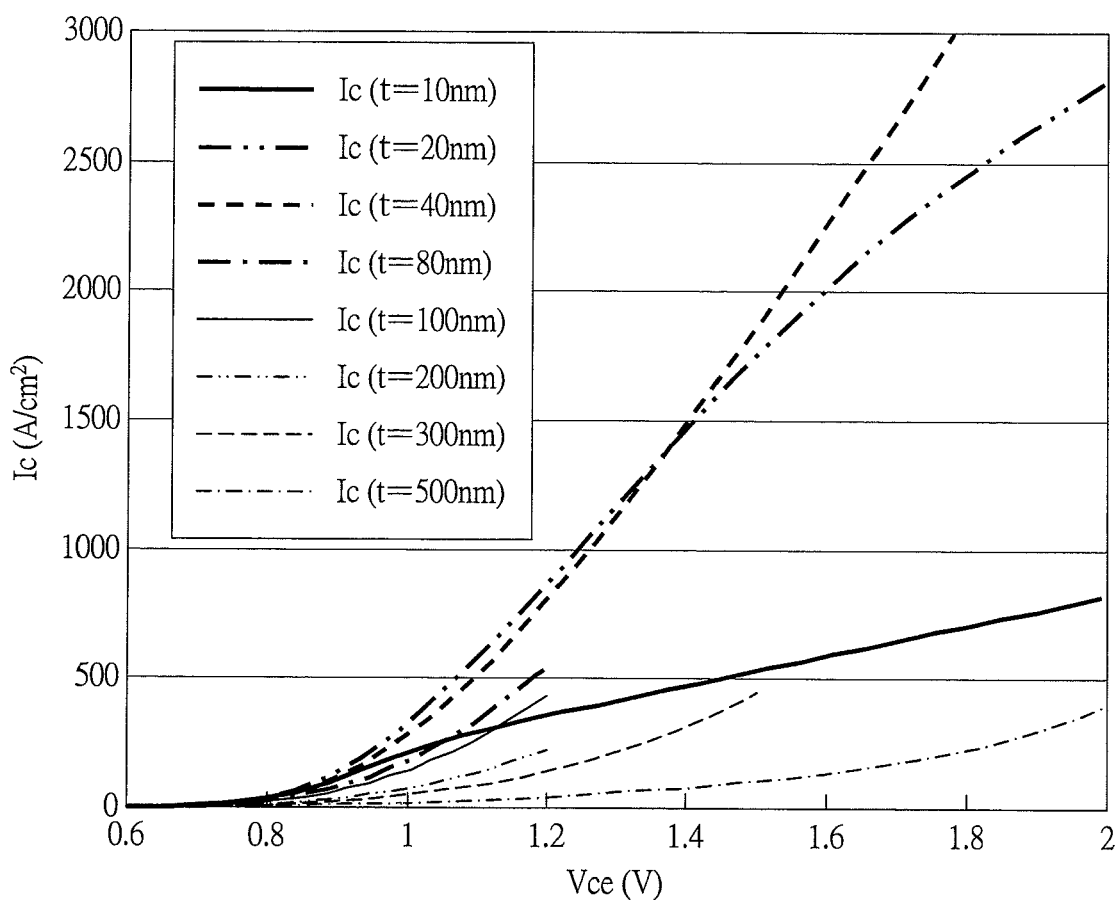

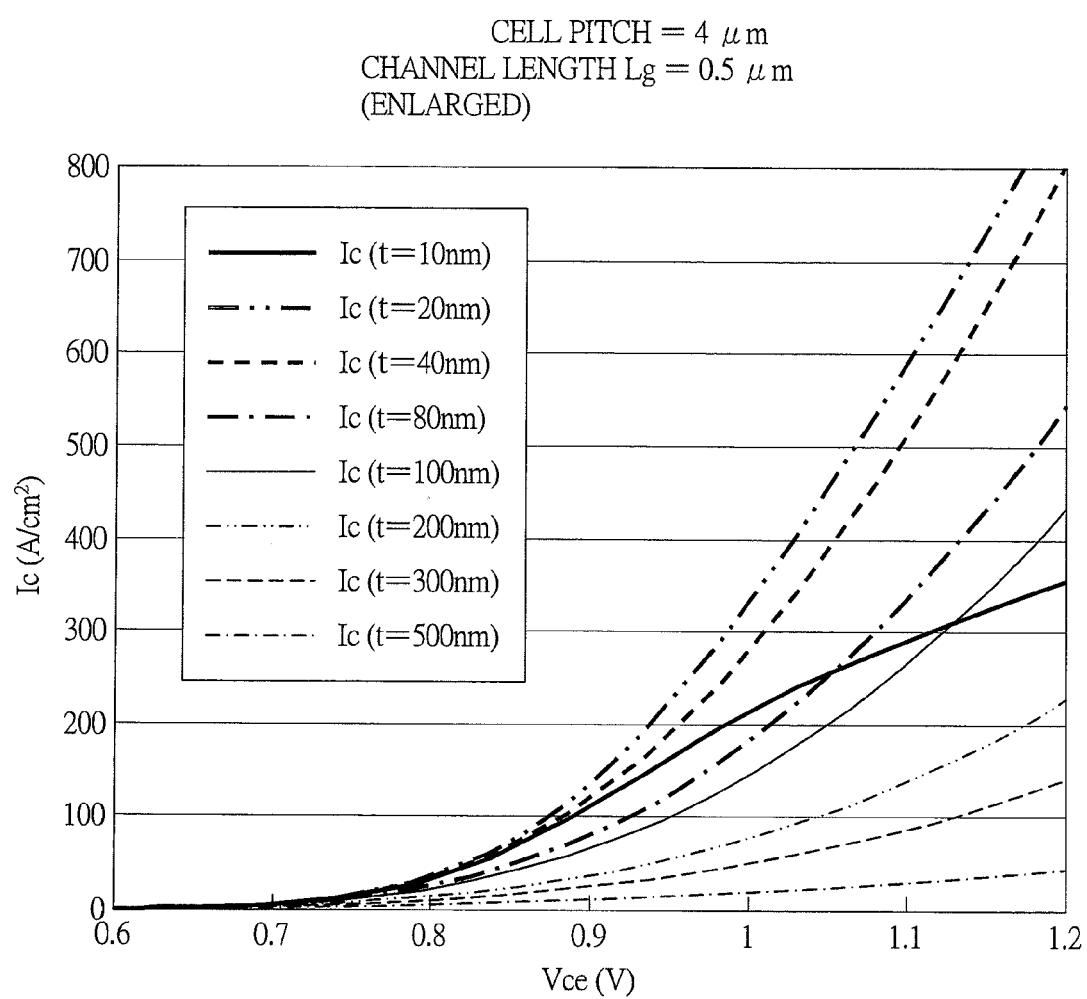

t = 40nm t = 300nm

BACKGROUND ART

BACKGROUND ART

BACKGROUND ART

BACKGROUND ART

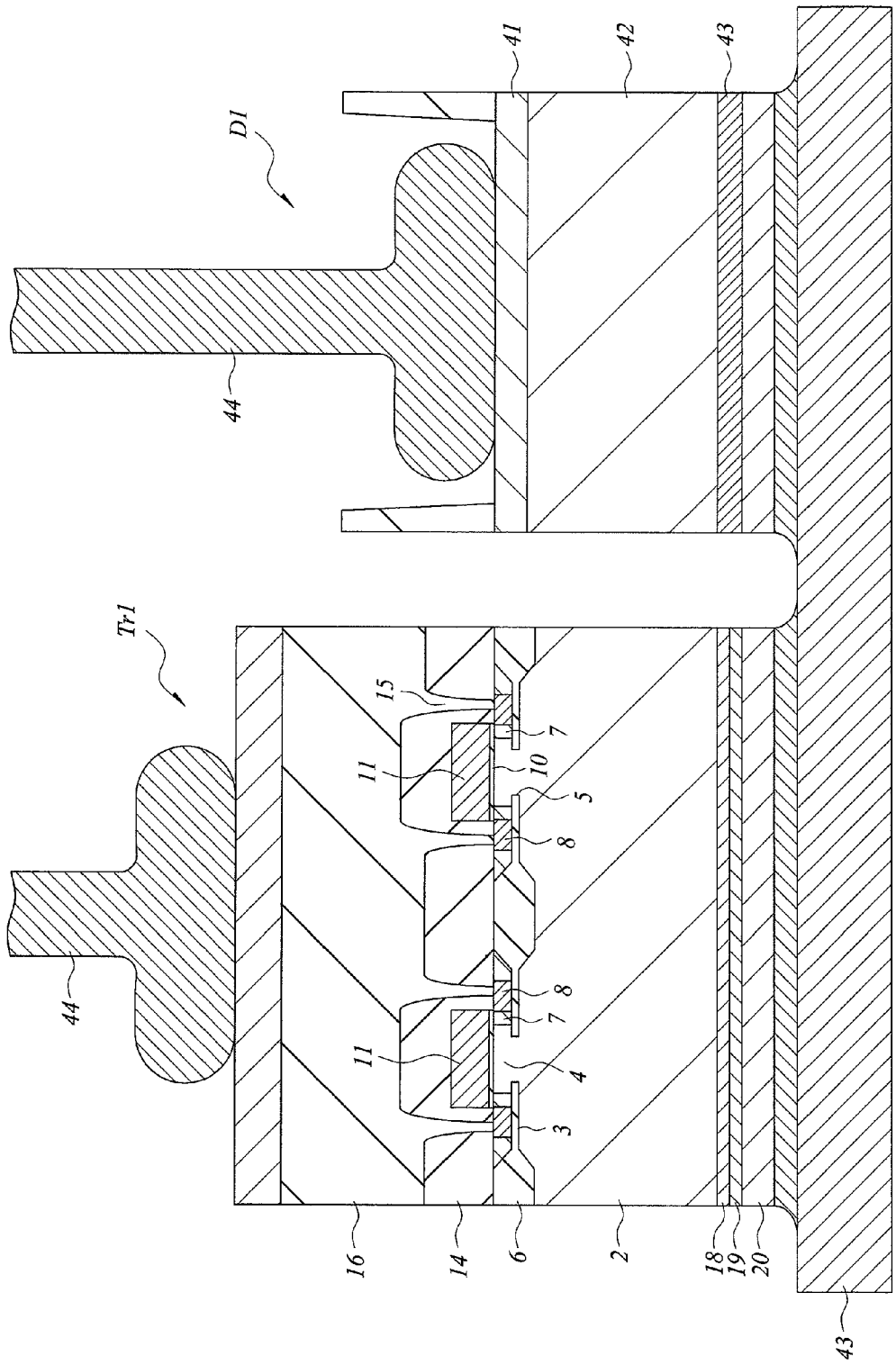

SEMICONDUCTOR DEVICE AND MANUFACTURING METHOD OF THE SAME

TECHNICAL FIELD

The present invention relates to a semiconductor device and a manufacturing technology of the same, and more particularly to a technology effectively applied to a planar gate IGBT (Insulated Gate Bipolar Transistor) and its manufacture.

BACKGROUND ART

Since an IGBT is provided with a control gate terminal of a MOS structure having excellent controllability and exhibits a low on-voltage by conductivity modulation based on bipolar operation, it is widely applied from industrial use to consumer use, mainly to an intermediate-capacity inverter, and plays a major role of a switching device for power electronics.

FIG. 75 is a cross-sectional view of the principal part showing an example of a trench gate IGBT, and FIG. 76 is an explanatory drawing showing the relation between the substrate depth at the positions along the line A-A of FIG. 75 and the carrier density in an on-state.

In the trench gate IGBT as shown in FIG. 75, in an on-state, holes (positive holes) are actively injected from a p$^+$ type semiconductor substrate 101 (including a collector metal electrode 120 on the lower surface thereof) of the rear surface side to an n$^-$ type base layer 102 via an n type buffer layer 118. Also, the main surface side has a structure in which the holes pass through a p type channel layer 107 and a p$^+$ type emitter layer 109 and are withdrawn to an emitter metal electrode 116. The emitter metal electrode 116 has a structure which penetrates through an n$^+$ type source region 108 to reach the p$^+$ type emitter layer 109 therebelow. As a result, in the on-state, the carrier (hole) density distribution is concentrated on the collector side (rear surface side) compared with the emitter side (see FIG. 76). The reference numeral 110 in FIG. 75 denotes a gate insulating film.

In the above-described trench gate IGBT, when turned off from its on-state, the holes present at a higher density on the collector side than that on the emitter side pass through the thick n type base layer 102 and flow into the emitter electrode 116 further through the p type channel layer 107 and the p$^+$ type emitter layer 109. Herein, since the moving speed of the holes is slow, the time required for the turn-off is extended, so that there are the problems that switching operation of the trench gate IGBT becomes slow and turn-off loss (thermal loss) is increased.

As a countermeasure for such problems, Japanese Patent Application Laid-Open Publication No. 2006-100779 (Patent Document 1) discloses an example of a planar gate IGBT. FIG. 77 is a cross-sectional view of the principal part showing an example of the planar gate IGBT, and FIG. 78 is an explanatory drawing showing the relation between the substrate depth at the positions along the line A-A of FIG. 77 and the carrier density in an on-state.

In the planar gate IGBT as shown in FIG. 77, an n$^-$ type surface semiconductor layer 104 is formed on a main surface of an n$^-$ type base layer 102 via a buried insulating film 103. Also, since a p type collector layer 119 (including a collector metal electrode 120 on the lower surface thereof) having a lower impurity concentration than that of the p$^+$ type semiconductor substrate 101 of the above-described trench gate IGBT is used, the efficiency of injection of holes (positive holes) from the p type collector layer 119 to the n$^-$ type base layer 102 is lowered in an on-state. On the other hand, since the holes are blocked by the buried insulating film 103 and the holes flow in only from an opening part 105 formed in the buried insulating film 103 on the main surface side, the hole current is limited and the holes are easily accumulated on the emitter side in this structure. Therefore, in the on-state, the density distribution of the carriers (holes) is concentrated on the emitter side (main surface side) compared with that of the base side (rear surface side) (see FIG. 78).

In the above-described planar gate IGBT, since the holes are accumulated immediately below the buried insulating film 103 in the on-state, the so-called IE (Injection Enhancement) effect that injection of electrons from the n$^+$ type source region 108 to the n$^-$ base layer 102 via a channel inversion layer (p type channel layer 107) is activated to improve the electric conductivity appears. When turned off from the on-state like this, most of the holes are present in the vicinity of the emitter and therefore quickly flow into the emitter metal electrode 116. As a result, in the planar gate IGBT shown in FIG. 77, switching operation is speeded up, and turn-off loss can also be reduced.

Furthermore, "Akio Nakagawa, "Theoretical Investigation of Silicon Limit Characteristics of IGBT", Proceedings of the 18th International Symposium on Power Semiconductor Devices & IC's Jun. 4-8, 2006 Naples, Italy" (Non-Patent Document 1) discloses the technology in which, in a trench gate IGBT, the distance between adjacent gate electrodes is reduced and a p type channel layer with the narrowed width is completely inverted, thereby bringing the hole current close to 0 to intensify the above-described IE effect.

Patent Document 1: Japanese Patent Application Laid-Open Publication No. 2006-100779

Non-Patent Document 1: Akio Nakagawa, "Theoretical Investigation of Silicon Limit Characteristics of IGBT", Proceedings of the 18th International Symposium on Power Semiconductor Devices & IC's Jun. 4-8, 2006 Naples, Italy

SUMMARY OF THE INVENTION

Problems to be Solved by the Invention

Incidentally, FIG. 79 and FIG. 80 are explanatory drawings showing the relation between the on-voltage Vce (sat) and the turn-off loss (thermal loss) Eoff in an IGBT and the relation between the turn-off time tf and the on-voltage Vce (sat) therein, respectively. IC and VGS in FIG. 80 denote a collector current and a voltage between a gate and a source, respectively.

As shown in FIG. 79 and FIG. 80, the relation between the on-voltage Vce (sat) and the turn-off loss (thermal loss) Eoff and the relation between the turn-off time tf and the on-voltage Vce (sat) in the IGBT are in a trade-off relation, and these two relations vary in close association with each other. More specifically, when it is designed so that the on-voltage Vce (sat) is reduced for reducing the steady loss of the IGBT, the turn-off time and the turn-off loss (switching loss) are increased, and when it is designed so that the turn-off time and the turn-off loss can be reduced, the steady loss is increased.

From the viewpoint of reducing the steady loss, the turn-off time and the turn-off loss in the above-described IGBT, the inventors of the present invention studied the technologies disclosed in the above-described Patent Document 1 and Non-Patent Document 1.

In the technology disclosed in Patent Document 1, when the above-described IE effect appears, the switching operation is speeded up, and the turn-off loss can also be reduced. However, no definition about the thickness of the p type channel layer 107 (see FIG. 77) is disclosed and suggested therein. In other words, there is no consideration about the complete inversion of the p type channel layer 107 in the on-state of the IGBT. When the p type channel layer 107 is not completely inverted, the hole current cannot be reduced to a predetermined value or less even though the path of the hole current is limited by the buried insulating film 103 to achieve the structure in which the holes are easily accumulated. Therefore, since the sufficient IE effects cannot be obtained, although the speed-up of the switching operation and the reduction in the turn-off loss can be achieved to some extent, the further speed-up and reduction are difficult to achieve.

As described above, in the technology disclosed in Non-Patent Document 1, the distance between the adjacent gate electrodes is reduced and the p type channel layer with the narrowed width is completely inverted, thereby bringing the hole current close to 0 to intensify the IE effect. However, in order to obtain a sufficient IE effect, the distance between the adjacent gate electrodes has to be reduced to the level at which processing thereof is difficult or almost impossible.

An object of the present invention is to provide the technology capable of improving the characteristics of an IGBT, in particular, the technology capable of reducing the steady loss, turn-off time and turn-off loss.

The above and other objects and novel characteristics of the present invention will be apparent from the description of the present specification and the accompanying drawings.

Means for Solving the Problems

The following is a brief description of an outline of the typical invention disclosed in the present application.

A semiconductor device according to the present invention is a semiconductor device including an IGBT, and the IGBT includes:

(a) a p type collector layer;

(b) an n type buffer layer formed over the p type collector layer;

(c) an n type base layer formed over the n type buffer layer and having a higher resistance than that of the n type buffer layer;

(d) a surface semiconductor layer formed over the n type base layer and electrically connected to the n type base layer;

(e) a p type channel forming layer formed in a part of the surface semiconductor layer;

(f) a plurality of insulating films partially made of a gate insulating film and formed so as to sandwich at least a part of the p type channel forming layer;

(g) a p type emitter layer formed in the surface semiconductor layer so as to be electrically connected to the p type channel forming layer and having a higher p type impurity concentration than that of the p type channel forming layer;

(h) an n type source layer formed in a part of the surface semiconductor layer and electrically connected to both the p type channel forming layer and the p type emitter layer;

(i) a gate electrode formed over the gate insulating film;

(j) a collector electrode formed below the p type collector layer and electrically connected to the p type collector layer; and (k) an emitter electrode formed over the p type emitter layer and the n type source layer and electrically connected to the p type emitter layer and the n type source layer, and in a region in which the p type channel forming layer is sandwiched by the plurality of insulating films, a thickness of the p type channel forming layer in a region in which the plurality of insulating films are closest to each other is 20 nm to 100 nm.

Effects of the Invention

The effects obtained by typical embodiments of the invention disclosed in the present application will be briefly described below.

An IGBT capable of reducing steady loss, turn-off time and turn-off loss can be manufactured by easy and stable manufacturing process.

BRIEF DESCRIPTIONS OF THE DRAWINGS

FIG. 2B is a graph showing the relations (DC output characteristics) between the on-voltages and collector currents obtained by simulations for each of the thicknesses of a surface semiconductor layer in the IGBT (cell pitch: 4 μm, channel length Lg: 0.5 μm) of the first embodiment of the present invention;

FIG. 2C is a graph showing the low-bias-voltage/low-current-density region of FIG. 2B in an enlarged manner;

FIG. 15 is an explanatory drawing showing the operation in a case in which the conductivity type of a p type channel forming layer is inverted to form an n type inverted layer when the IGBT is on;

Figure 80:
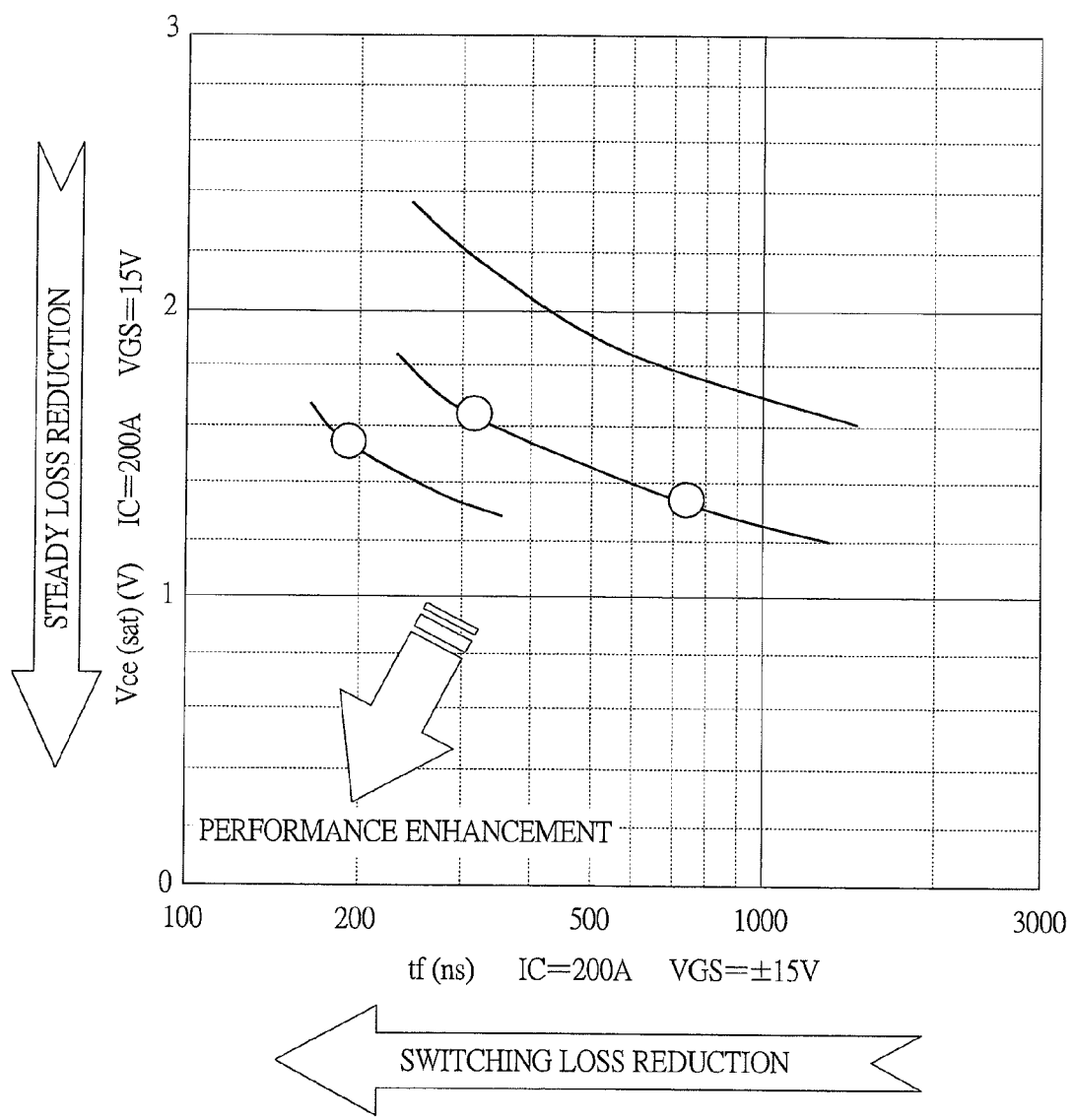

FIG. 80 is an explanatory drawing showing the relation between the turn-off time and the on-voltage in the trench gate IGBT and the planar gate IGBT studied by the inventors of the present invention; and FIG. 81 is a cross-sectional view showing a principal part of a package structure in which a chip having an IGBT formed therein and a chip having a diode formed therein are mounted on a lead frame.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are of course not excluded except the case where it is particularly specified that A is the only element thereof.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Still further, when the materials and the like are mentioned, the specified material is a main material unless otherwise stated or except the case where it is not so in principle or situationally, and the secondary components, additives, additional components and the like are not excluded. For example, a silicon material includes not only the case of pure silicon but also secondary and ternary alloys (for example, SiGe) and the like formed of additive impurities and silicon as the main component unless otherwise stated.

Also, components having the same function are denoted by the same reference symbols throughout the drawings for describing the embodiments, and the repetitive description thereof is omitted.

Also, in the drawings used in the embodiments, hatching is used even in a plan view so as to make the drawings easy to see.

As the definitions of terms in the embodiments, "turn on" refers to the operation for changing a switching element (IGBT in the embodiments) to a conductive state, and "on" refers to the state in which the switching element is actually conductive. Moreover, "turn off" refers to the operation for changing the switching element to a non-conductive state, and "off" refers to the state in which the switching element is actually non-conductive.

The embodiments of the present invention will be described below in detail with reference to the drawings.

First Embodiment

Figure 1:
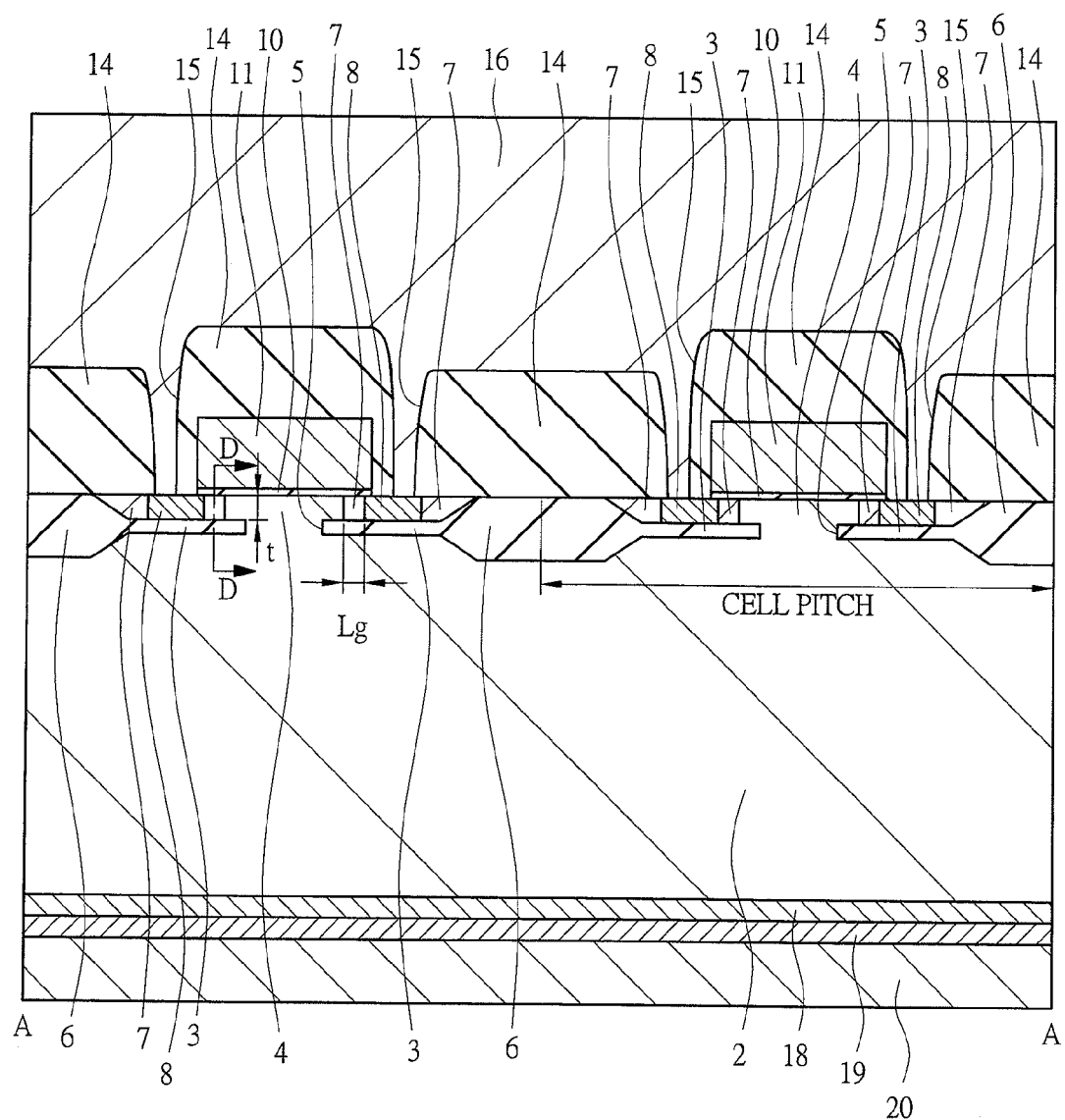
FIG. 1 is a cross-sectional view of the principal part of a chip having an IGBT which is a semiconductor device of a first embodiment of the present invention.

FIG. 1 shows a cross-sectional view of an IGBT of the first embodiment. The IGBT of the first embodiment has a structure in which a plurality of surface semiconductor layers 4 made of $n^-$ type single-crystal silicon are formed on a main surface of a base layer 2 made of, for example, $n^-$ type single-crystal silicon via a buried insulating film (thin-film part) 3, and the base layer 2 and the surface semiconductor layer 4 are connected to each other in an opening part (separation part) 5 formed in the buried insulating film 3. On the main surface of the base layer 2, a plurality of active regions are defined by a plurality of thick field insulating films (thick-film parts of the buried insulating film) 6, and the surface semiconductor layer 4 is formed in each of the plurality of active regions, respectively.

In the surface semiconductor layer 4 on the buried insulating film 3, a p type channel forming layer 7, an $n^+$ type source layer 8 and a $p^+$ type emitter layer 9 are formed. An $n^+$ type buffer layer 18, a p type collector layer 19 and a collector electrode 20 are formed on the rear surface of the base layer 2 in this order from the side close to the base layer 2. Further details will be described later.

Figure 77:
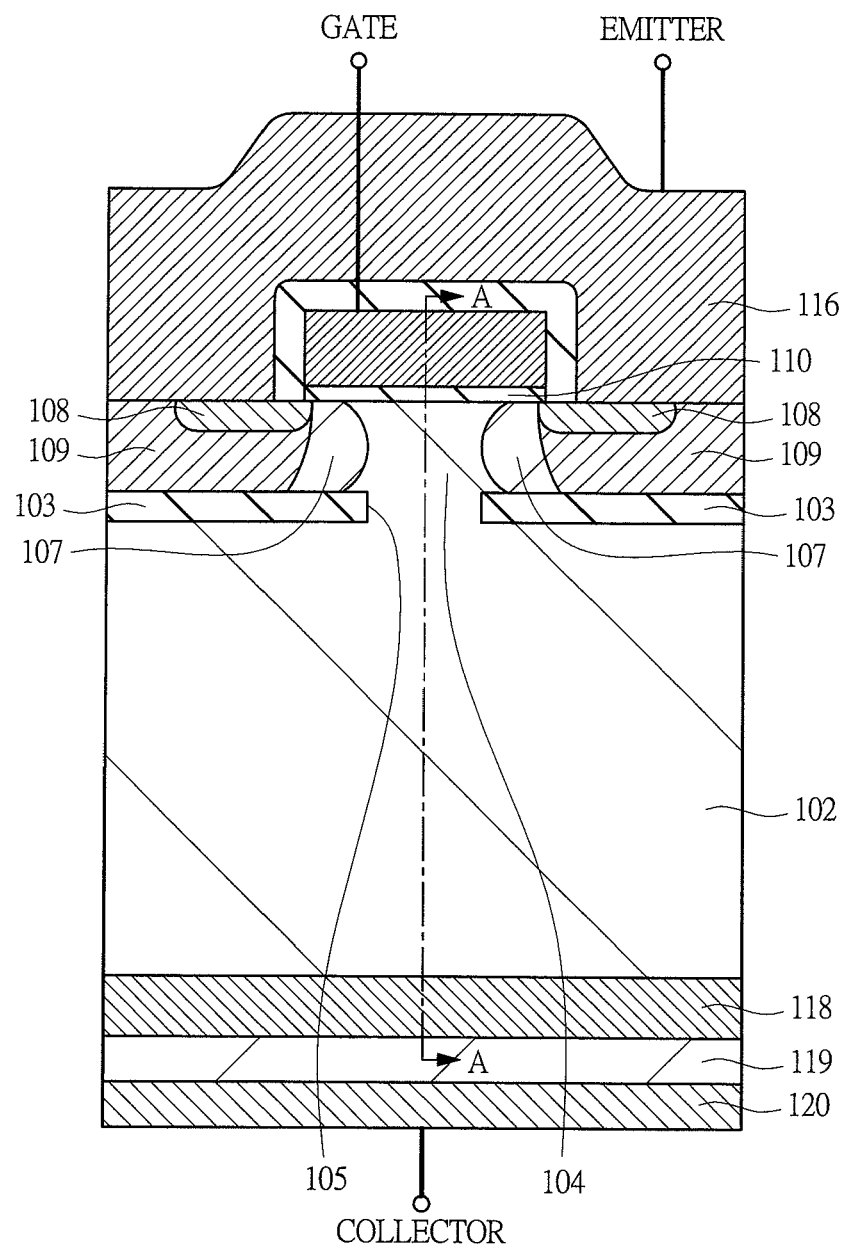
FIG. 77 is an explanatory drawing showing a cross section of the principal part showing an example of a planar gate IGBT and a carrier density in a substrate thereof studied by the inventors of the present invention.
Figure 78:
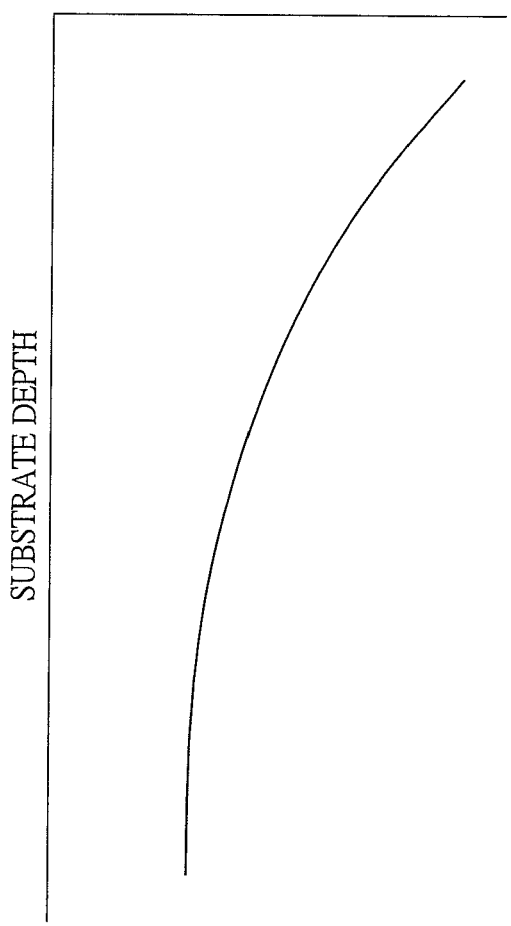
FIG. 78 is an explanatory drawing showing the relation between the substrate depth and the carrier density in the planar gate IGBT studied by the inventors of the present invention.
Figure 79:
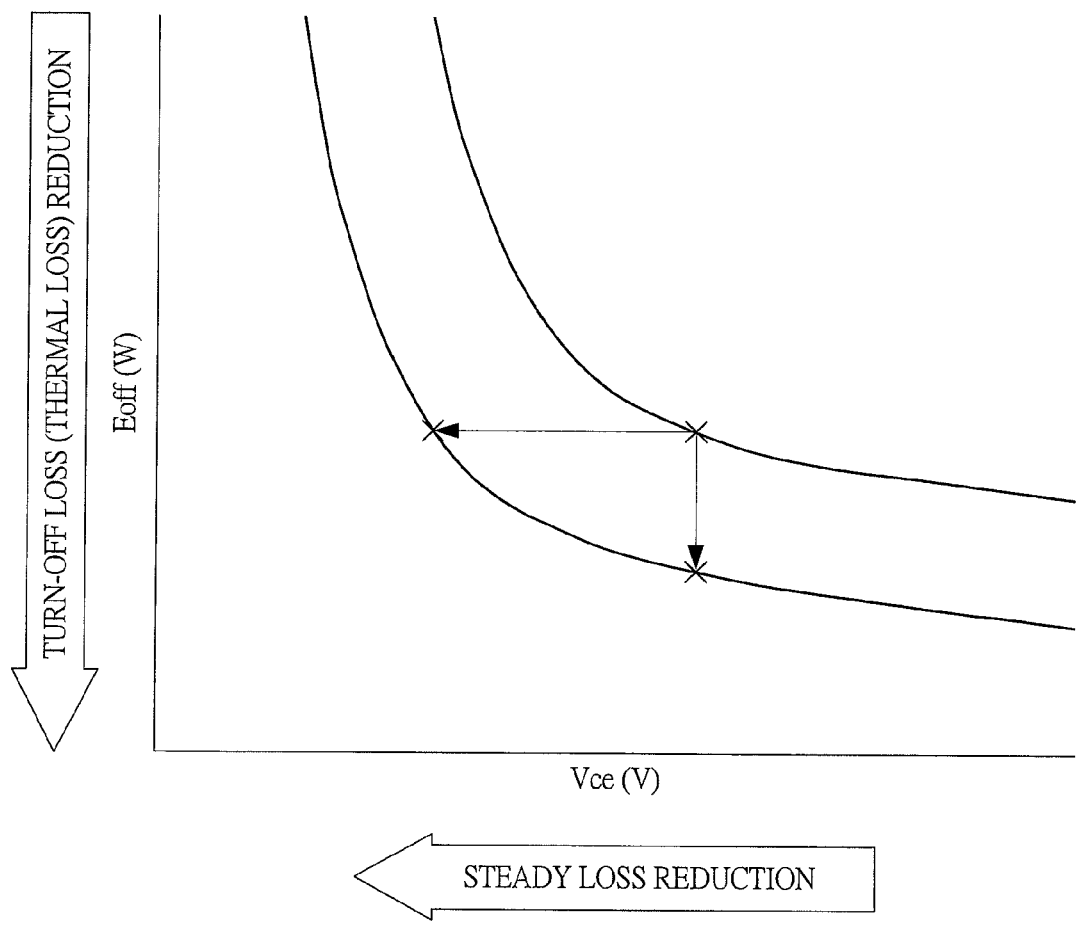
FIG. 79 is an explanatory drawing showing the relation between the on-voltage and the turn-off loss (thermal loss) in the trench gate IGBT and the planar gate IGBT studied by the inventors of the present invention.

In order to achieve the objects of reducing the steady loss, turn-off time and turn-off loss in the IGBT, the inventors of the present invention focused on the relation between the on-voltage Vce (sat) of the IGBT and the thickness t of the surface semiconductor layer 4 (corresponding to the thickness of the p type channel layer 107 in FIG. 77).

Figure 2A:
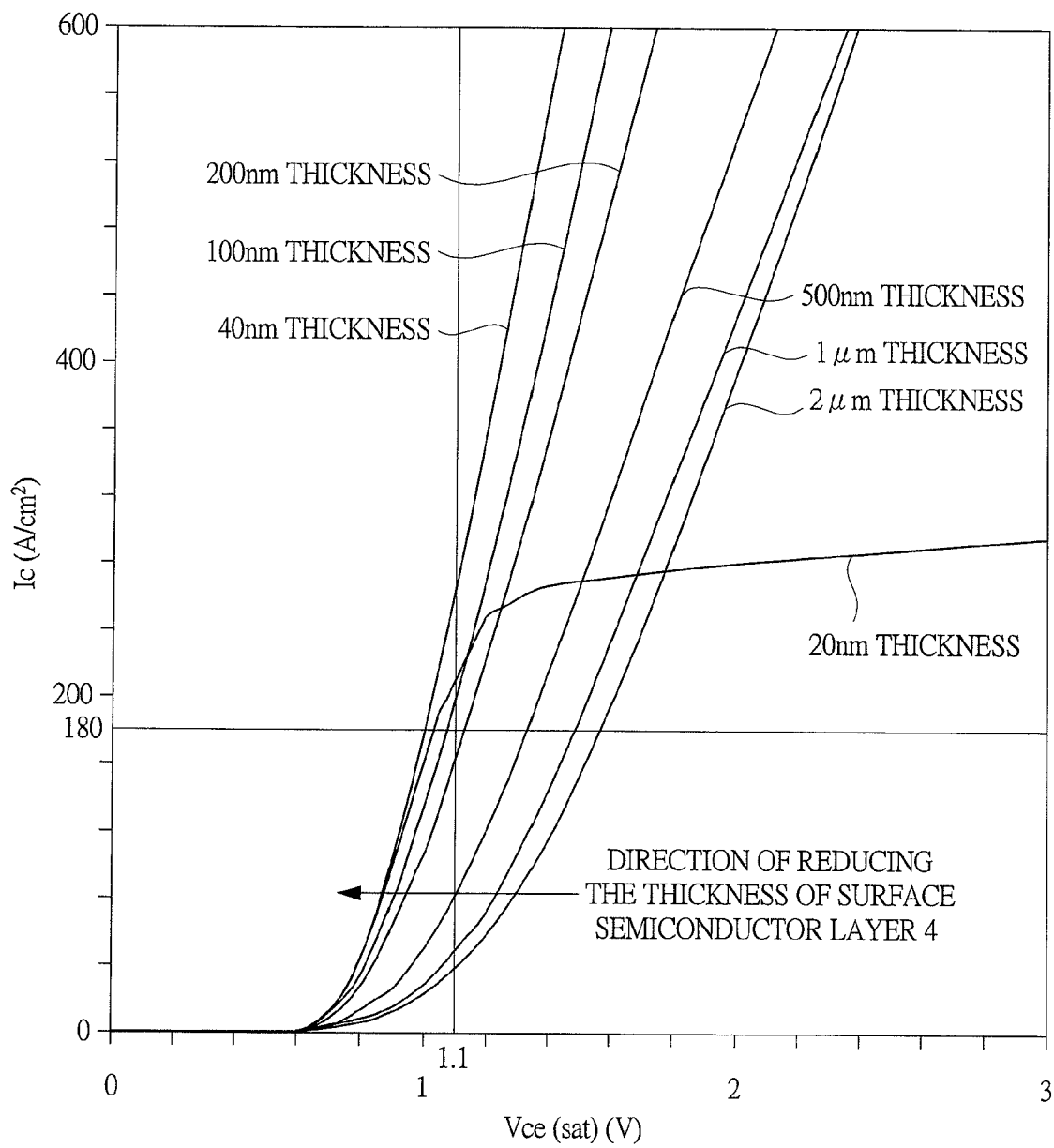
FIG. 2A is a graph showing the relations (DC output characteristics) between the on-voltages and collector currents obtained by simulations for each of the thicknesses of a surface semiconductor layer in the IGBT (cell pitch: 16 μm, channel length Lg: 2.8 μm) of the first embodiment of the present invention.

The inventors of the present invention calculated the output characteristics of the IGBT by simulations while changing the thickness t of the above-described surface semiconductor layer 4. As the structural parameters thereof other than the thickness t, the case with a cell pitch of 16 µm and a channel length Lg of 2.8 µm and the case with a cell pitch of 4 µm and a channel length Lg of 0.5 µm were calculated. The output characteristics at a gate voltage Vge of 15 V (horizontal axis: on-voltage Vce, vertical axis: output current density Ic) are shown in FIGS. 2A and 2B. FIG. 2C shows the low-bias-voltage/low-current-density region of FIG. 2B in an enlarged manner. In each of the comparisons of FIGS. 2A to 2C, the only changed condition was the thickness t of the surface semiconductor layer 4, and the simulation calculations were carried out without changing any of the other conditions that affect the characteristics of the IGBT such as lifetime, thickness of the rear-surface collector layer and impurity concentration and the results thereof were then compared.

It can be understood that the smaller the thickness t of the surface semiconductor layer 4, the lower the on-voltage Vce at which the output current rises regardless of the values of the cell pitch and the channel length. In other words, it can be understood that a large current flows with a low on-voltage Vce.

When the thickness t of the surface semiconductor layer 4 is reduced, the output current rises with a lower on-voltage Vce, and at the same time, saturation of the output current density Ic caused by MOS characteristics can be observed in the region of high on-voltage Vce. This prevents the flow of an overcurrent in the load short-circuit and has an effect of temporarily protecting elements.

Figure 3A:
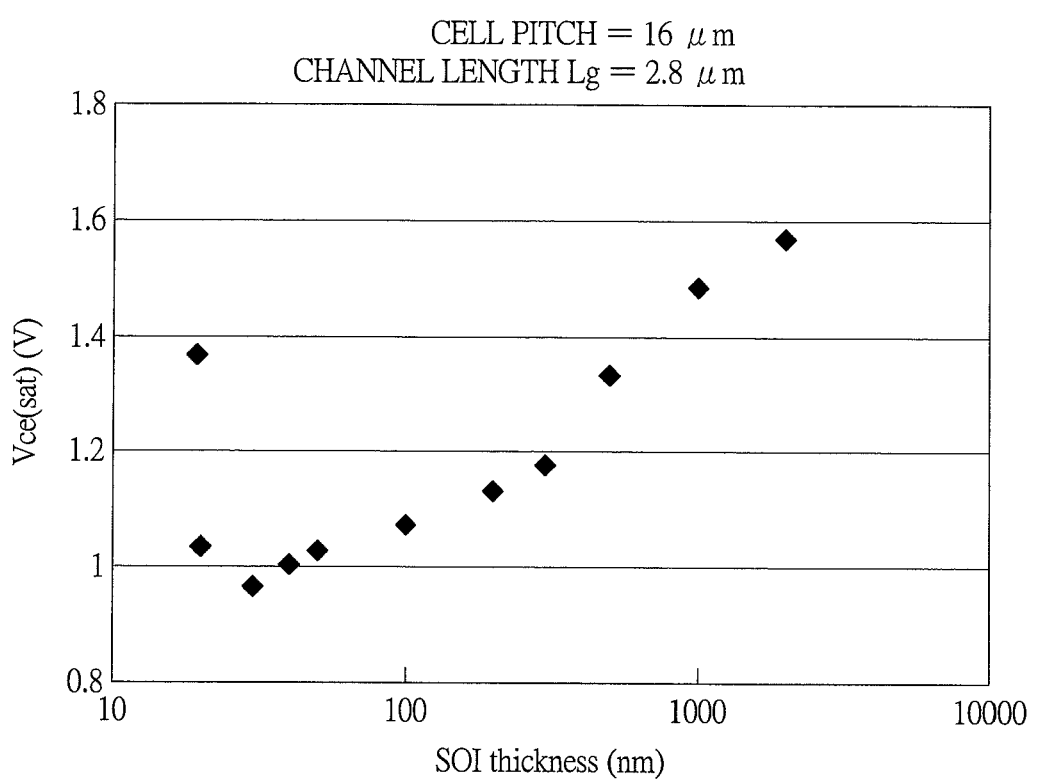
FIG. 3A is a graph showing the relations between the thicknesses of the surface semiconductor layer 4 and on-voltages obtained by simulations in the IGBT (cell pitch: 16 μm, channel length Lg: 2.8 μm) of the first embodiment of the present invention.
Figure 3B:
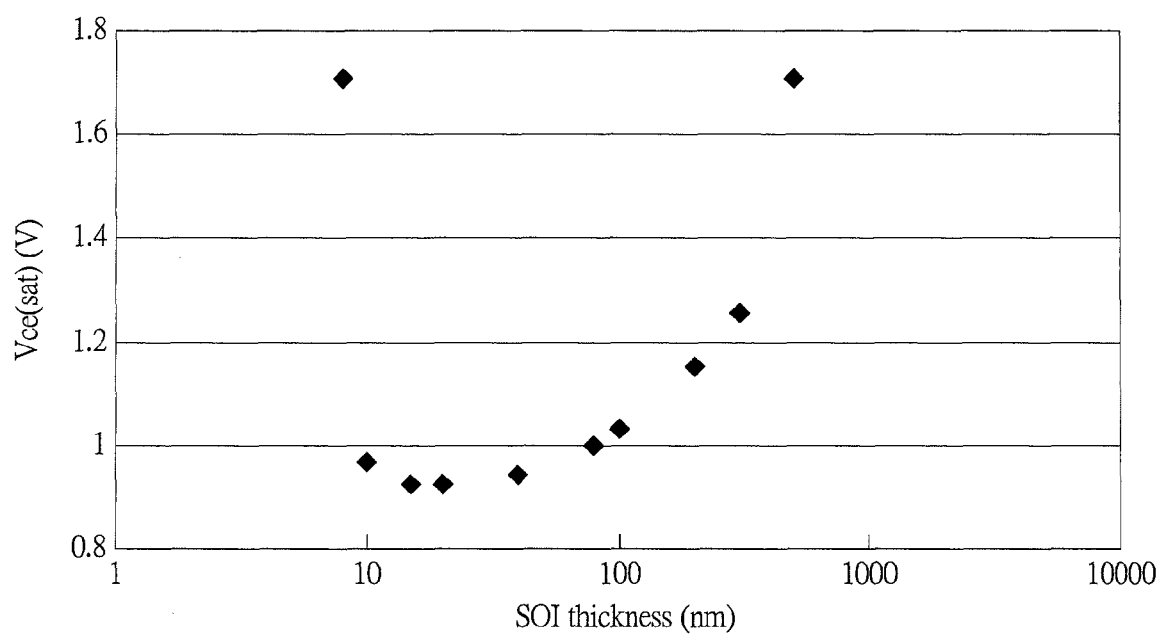
FIG. 3B is a graph showing the relations between the thicknesses of the surface semiconductor layer 4 and on-voltages obtained by simulations in the IGBT (cell pitch: 4 μm, channel length Lg: 0.5 μm) of the first embodiment of the present invention.

Next, FIGS. 3A and 3B show the results of obtaining the on-voltage Vce (sat) at the points of the output current density IC of 180 A/cm$^2$ in FIG. 2A to FIG. 2C. Herein, the on-voltage Vce (sat) does not depend on the value of the gate voltage Vge and refers to the voltage between the collector and the emitter when the output current density Ic is approximately constant.

FIGS. 3A and 3B are graphs showing the relation between the thickness t of the above-described surface semiconductor layer 4 and the on-voltage Vce (sat) obtained by the inventors of the present invention by simulations. Also, FIGS. 4A and 4B are graphs showing the trade-off relation between the on-voltage Vce (sat) and the turn-off loss Eoff, in which trade-off curves at various thicknesses t of the surface semiconductor layer 4 are shown.

Incidentally, it was found out from FIGS. 3A and 3B that, when the film thickness t of the surface semiconductor layer 4 is reduced, the on-voltage Vce (sat) can be significantly reduced. This means that steady loss can be significantly reduced during the operation of an inverter utilizing the IGBT. However, it makes no sense if the turn-off loss Eoff is increased in return for it. Then, the increase/decrease in the turn-off loss was confirmed and the results thereof are shown in FIGS. 4A and 4B.

Figure 4A:
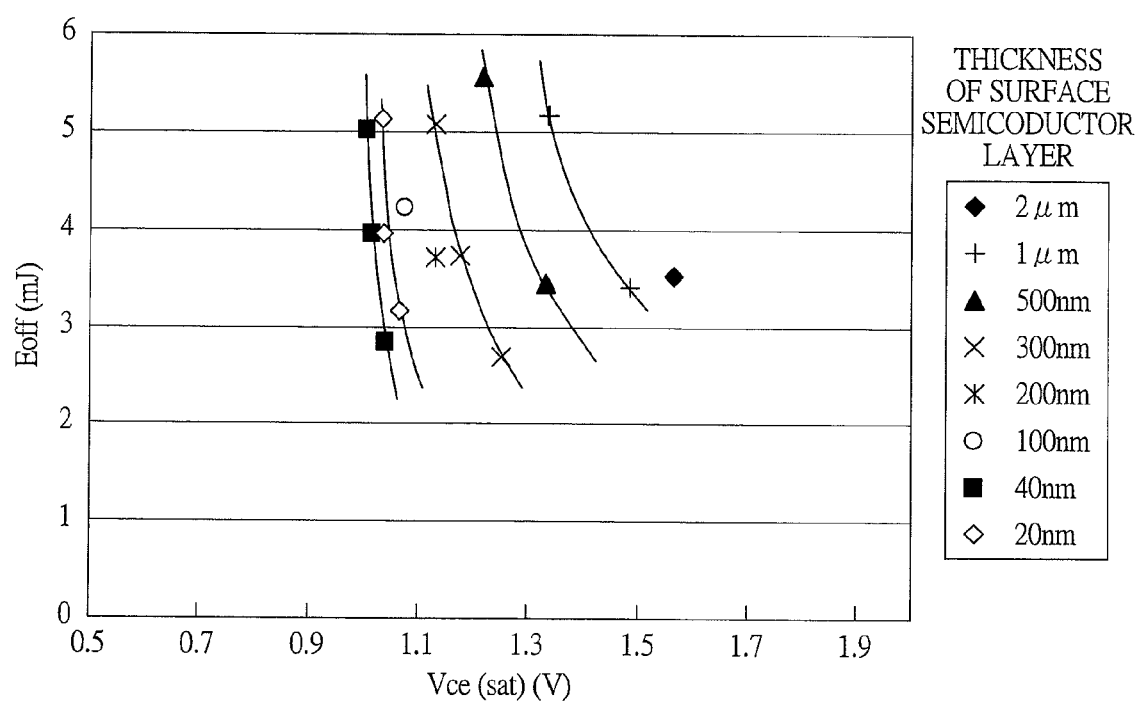
FIG. 4A is a graph showing the trade-off relation of the on-voltage and turn-off loss in the IGBT (cell pitch 16 μm, channel length Lg: 2.8 μm) of the first embodiment of the present invention.
Figure 4B:
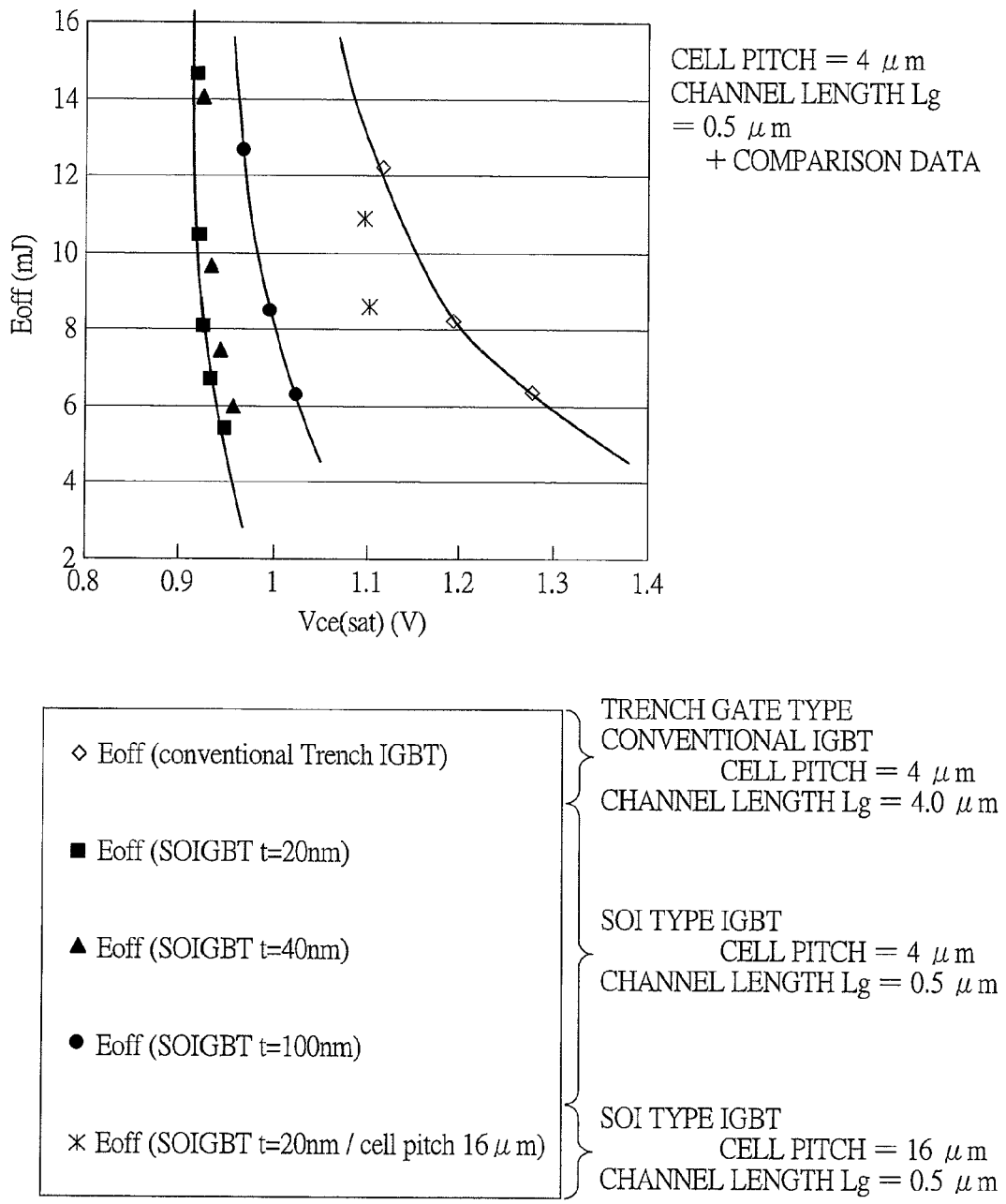
FIG. 4B is a graph showing the trade-off relation of the on-voltage and turn-off loss in the IGBT (cell pitch 4 μm, channel length Lg: 0.5 μm) of the first embodiment of the present invention.

FIGS. 4A and 4B show the trade-off relations of the on-voltage Vce (sat) and the turn-off loss Eoff in the cases in which the thickness t of the surface semiconductor layer 4 is variously changed. In FIGS. 4A and 4B, the trade-off curves are obtained by changing the impurity concentration of the rear-surface collector layer (p type collector layer 19). It can be understood from FIGS. 4A and 4B that, when viewed while setting the thickness t of the surface semiconductor layer 4 of the IGBT at a fixed constant value, each trade-off curve is formed under the relation that the on-voltage Vce (sat) is increased and simultaneously the turn-off loss Eoff is reduced when the p type impurity concentration of the rear-surface collector layer is reduced and that the on-voltage Vce (sat) is reduced and simultaneously the turn-off loss Eoff is increased when the p type impurity concentration of the rear-surface collector layer is increased reversely.

In FIGS. 4A and 4B, it can be understood that the trade-off curves are moved toward the left (or toward the lower left) as the thickness t of the surface semiconductor layer 4 is reduced. In other words, when compared at the same on-voltage Vce (sat), the smaller turn-off loss Eoff can be designed as the thickness t of the surface semiconductor layer 4 becomes smaller. Moreover, when compared at the same turn-off loss Eoff, the lower on-voltage Vce (sat) can be designed as the thickness t of the surface semiconductor layer 4 becomes smaller.

Thus, the effects exerted as a result of reducing the thickness t of the surface semiconductor layer 4 are not limited to the effect of reducing the on-voltage Vce (sat) as shown in FIGS. 3A and 3B, and it can be understood from FIGS. 4A and 4B that the trade-off curve is moved in the direction capable of reducing the thermal loss including the turn-off loss Eoff, and the IGBT which has low thermal loss and facilitates the design for heat dissipation can be provided.

Further, when the cell pitch and the channel length Lg are smaller in size, the on-voltage Vce (sat) is readily reduced, and the above-described improving effects of the trade-off curves are larger. However, regarding the above-described saturability of the output current density Ic exhibited in the load short-circuit, since the stronger saturability is exhibited when the cell pitch and the channel length are larger, the manufacture with small sizes is not always good from the viewpoint of element protection.

Incidentally, the on-voltage Vce (sat) of a current IGBT is about 1.2 V to 2.0 V in the case of a product with a breakdown voltage of 600 V and is about 1.6 V to 2.5 V in the case of a product with a breakdown voltage of 1200 V. These values are figures achieved by making full use of recently developed surface structures including IEGT (Injection Enhanced Gate Transistor) and recently developed rear surface structures such as application of a thin collector layer. No realistic means capable of significantly reducing the above-described on-voltage Vce (sat) more than the combination of the IEGT structure on the surface and the thin wafer technology on the rear surface without increasing the turn-off loss Eoff has not been found yet.

On the other hand, in the present invention, by setting the thickness t of the surface semiconductor layer 4 to 100 nm or less, more desirably in the range of 40 to 20 nm, for example, the on-voltage Vce (sat) of about 0.9 V to 1.1 V can be achieved in the case of an IGBT having a breakdown voltage of 600 V, and the on-voltage of about 1.0 V to 1.2 V can be achieved even in an IGBT having a breakdown voltage of 1200 V.

The phenomenon occurring in the semiconductor when the thickness t of the surface semiconductor layer 4 is 100 nm or less will be described below in comparison with the case in which the thickness t of the surface semiconductor layer 4 is larger. In the description below, the interior state of a device will be described with taking the case in which a cell pitch is 16 μm and a channel length Lg is 2.8 μm as an example. However, the effects exerted by reducing the thickness t of the surface semiconductor layer 4 are the same also in the case of smaller sizes.

Figure 5:
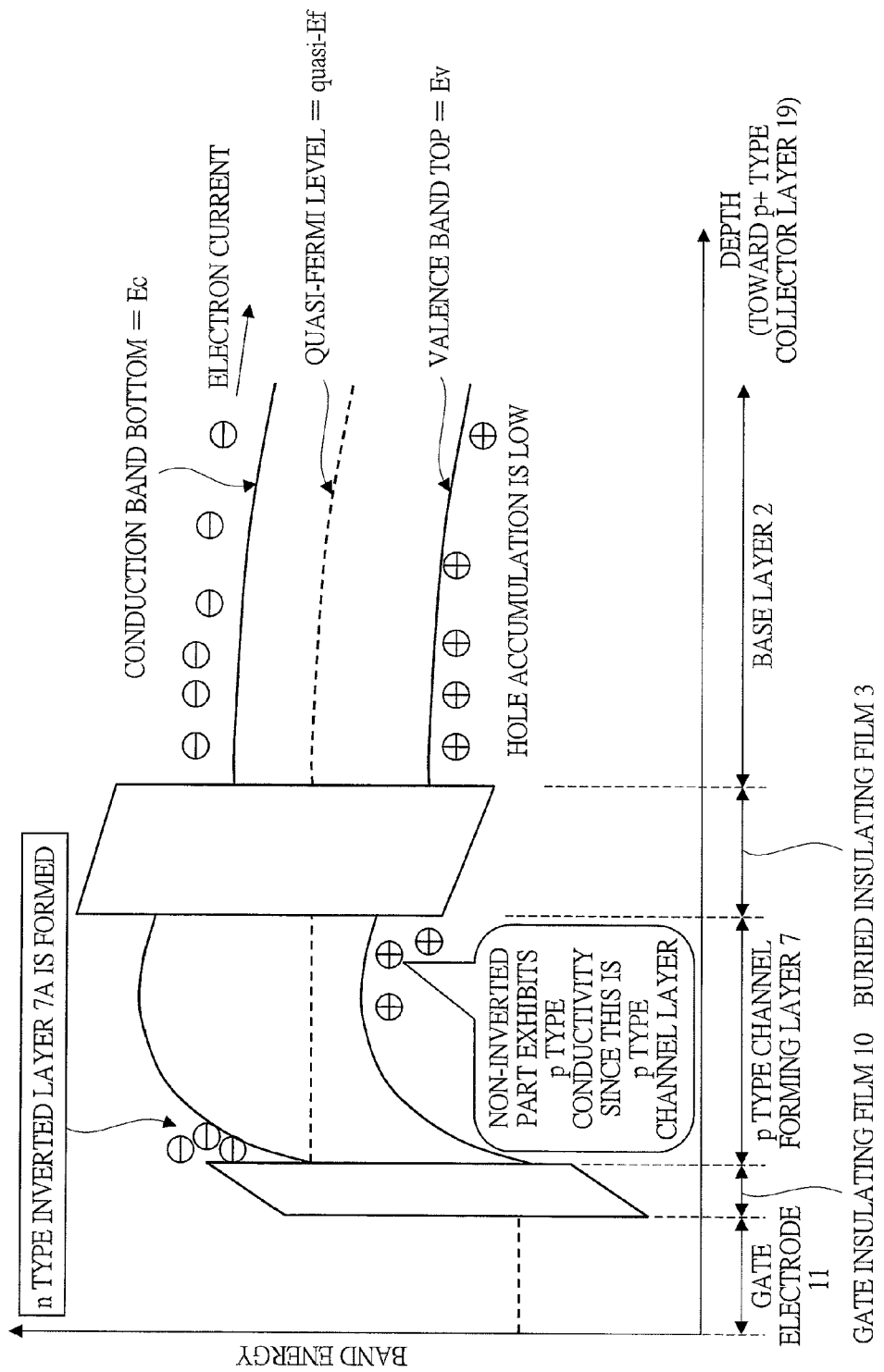
FIG. 5 is an energy band diagram for describing the movement of holes in a planar type IGBT in which the thickness of a surface semiconductor layer exceeds 100 nm.
Figure 6:
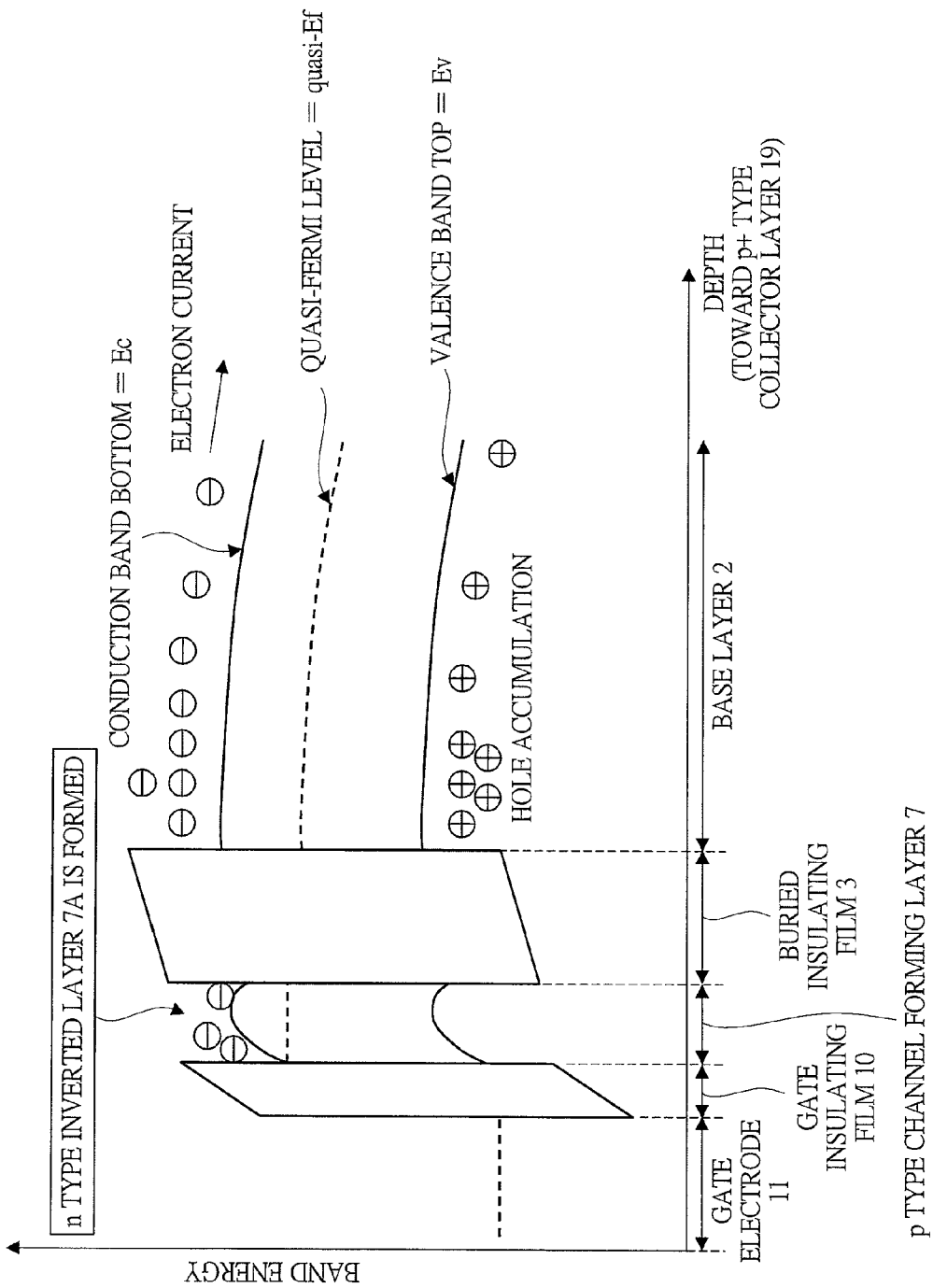
FIG. 6 is an energy band diagram for describing the movement of holes in a planar type IGBT in which the thickness of a surface semiconductor layer is about 40 nm.
Figure 7:
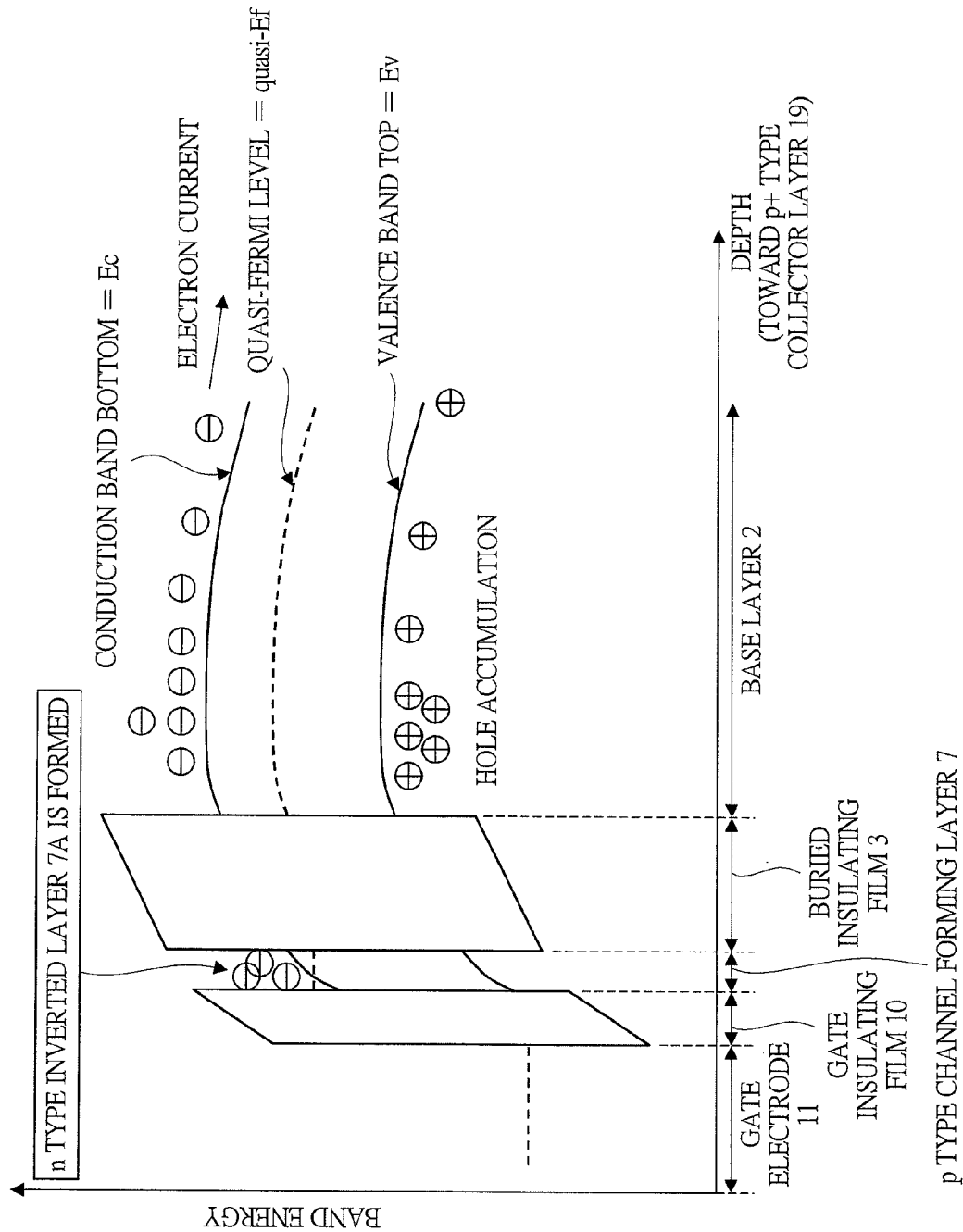
FIG. 7 is an energy band diagram for describing the movement of holes in a planar type IGBT in which the thickness of a surface semiconductor layer is about 20 nm.

FIG. 5 to FIG. 7 show energy band diagrams on the section line along the line D-D shown in FIG. 1 in an on-state of the IGBT. FIG. 5 to FIG. 7 respectively show the case in which the thickness t of the surface semiconductor layer 4 exceeds 100 nm, the case in which the thickness t is about 40 nm, and the case in which the thickness t is about 20 nm.

Figure 8:
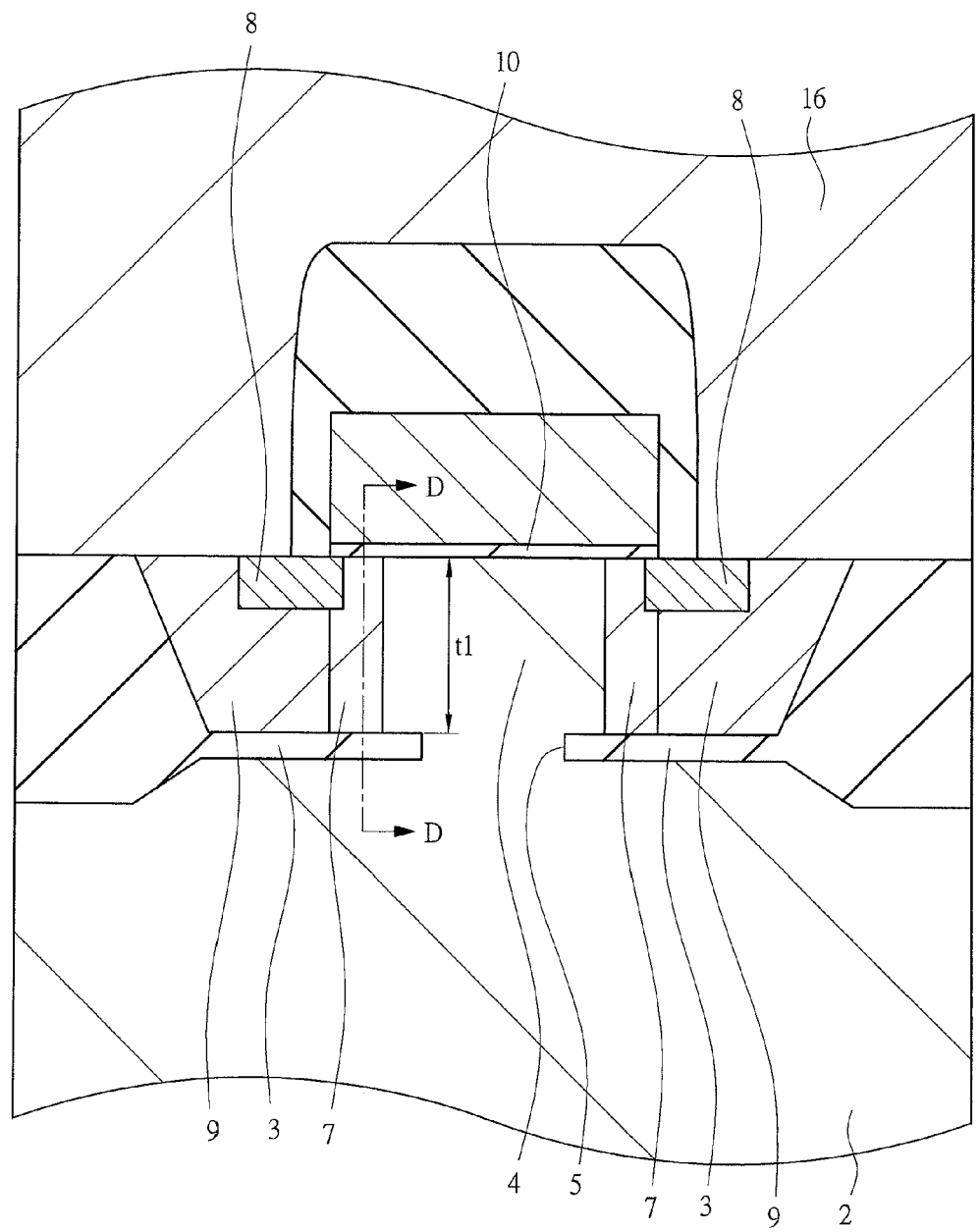
FIG. 8 is a cross-sectional view of the principal part of a chip having an IGBT in which the thickness of a surface semiconductor layer exceeds 100 nm.
Figure 14:
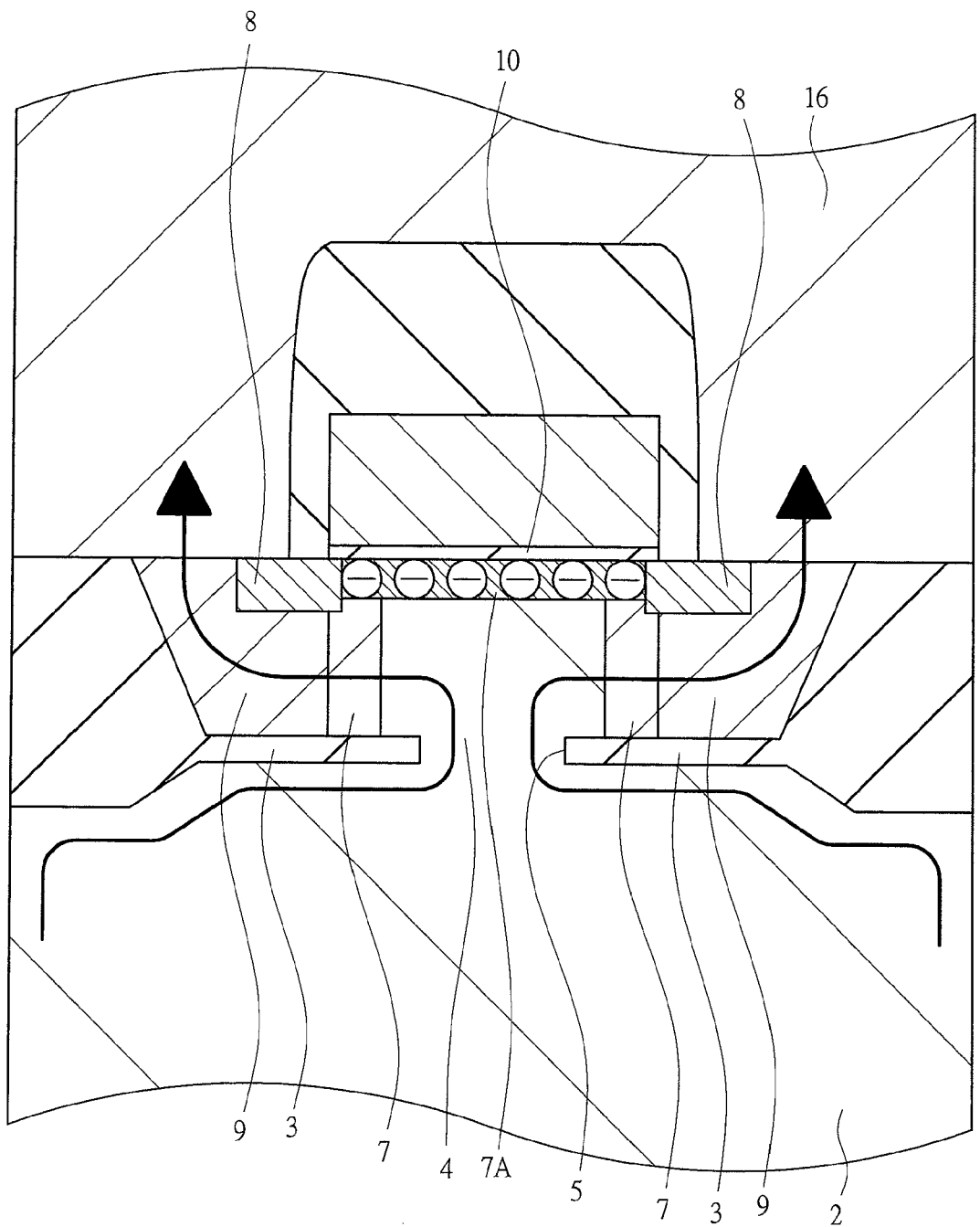
FIG. 14 is an explanatory drawing showing an operation in an on-state of an IGBT in which the thickness of the surface semiconductor layer exceeds 100 nm.

When the thickness (t1 shown in FIG. 8) of the surface semiconductor layer 4 exceeds 100 nm, as shown in FIG. 5, the conductivity type of the p type channel forming layer 7 below the gate electrode 11 is not completely inverted, and only about 20 nm from the interface with a gate insulating film 10 becomes an n type inverted layer 7A. Therefore, the p type channel forming layer 7 whose conductivity type has not been inverted is in the state in which holes can pass therethrough (exhibiting p type conduction) when the IGBT is on. Therefore, as shown in FIG. 14, holes flow into the p type channel forming layer 7 from the base layer 2 through an opening part 5 of the buried insulating film 3, and the holes further pass through the $p^+$ type emitter layer 9 and flow into the emitter electrode 16. As a result, the holes are not readily accumulated in the base layer 2 below the buried insulating film 3.

On the other hand, as shown in FIG. 6 and FIG. 7, when the thickness t of the surface semiconductor layer 4 is small and the conductivity type of the p type channel forming layer 7 below the gate electrode 11 is completely inverted and becomes an n type inverted layer 7A when the IGBT is on, passage of the holes from the base layer 2 to the $p^+$ type emitter layer 9 and the emitter electrode 16 is prevented by the presence of the n type inverted layer 7A when the IGBT is on. Therefore, the state in which the holes are accumulated in the base layer 2 below the buried insulating film 3 is achieved.

When the thickness t of the surface semiconductor layer 4 is about 40 nm (FIG. 6), in practice, the conductivity type of the p type channel forming layer 7 below the gate electrode 11 is not completely inverted when the IGBT is on, and the p type channel forming layer 7 whose conductivity type has not been inverted remains slightly. However, for example, because of the effect of reducing the energy band by the buried insulating film 3, an $n^-$ type inverted layer which is gently inverted to the n type compared with the n type inverted layer 7A is formed therein, and therefore, the holes which flow thereinto from the base layer 2 through the opening part 5 of the buried insulating film 3 can be further limited than the case in which the thickness t of the surface semiconductor layer 4 is about 100 nm.

Figure 9:
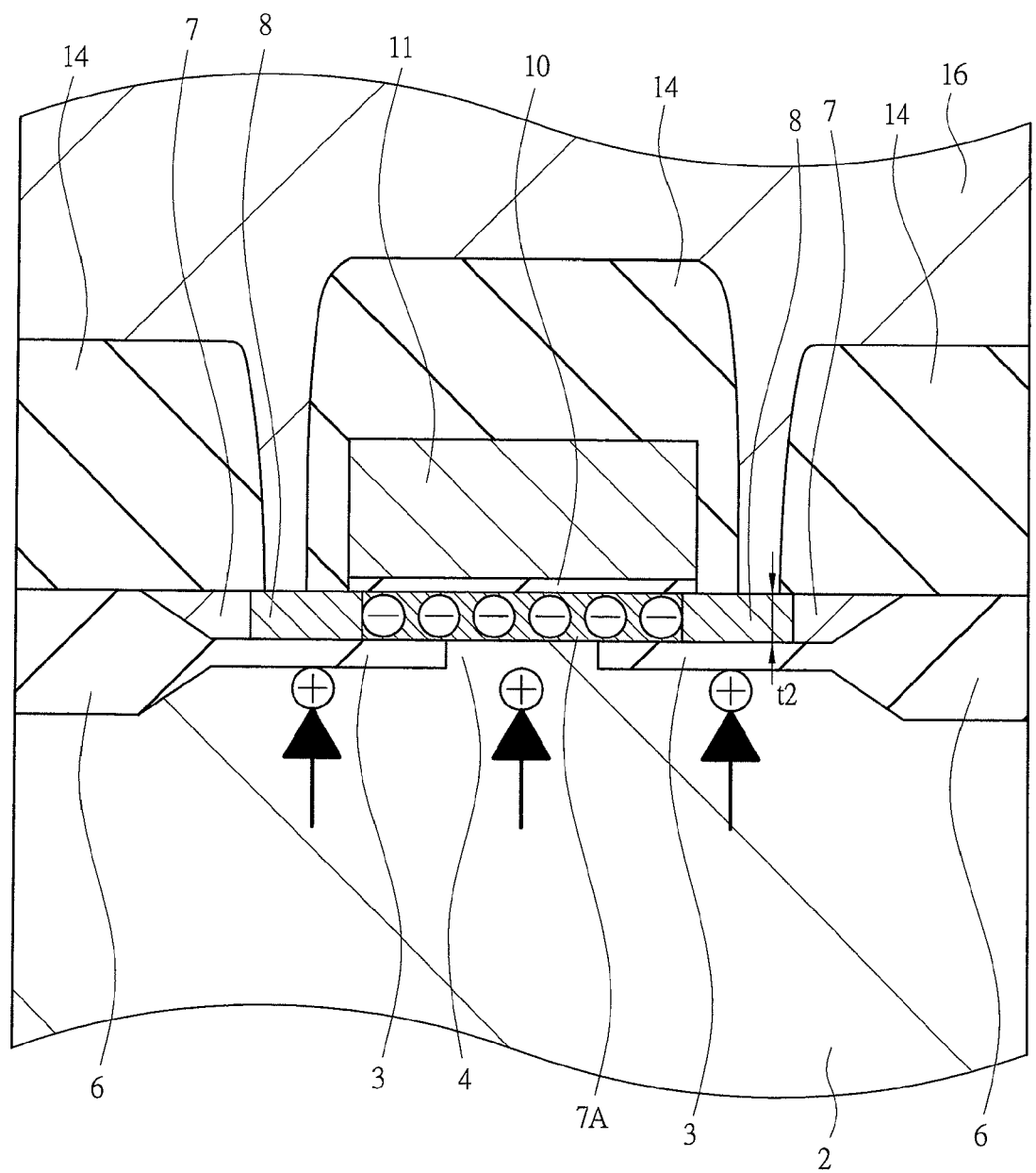
FIG. 9 is an explanatory drawing showing an operation in an on-state of the IGBT of the first embodiment of the present invention.

Such a state is shown by a cross-sectional view of the principal part shown in FIG. 9. As shown in FIG. 9, in the IGBT of the first embodiment, the thickness t2 of the surface semiconductor layer 4 is smaller than the thickness t1 of the surface semiconductor layer 4 of the IGBT shown in FIG. 8. Therefore, when the IGBT of the first embodiment is in an on-state, the conductivity type of the p type channel forming layer 7 between the buried insulating film 3 and the gate insulating film 10 is completely inverted to form the n type inverted layer 7A. In such a state, the hole current shown by arrows in FIG. 9 is prevented from flowing into the surface semiconductor layer 4 from the collector side of the rear surface of the base layer 2. More specifically, after the holes flowing into the part of the base layer 2 that is immediately below and close to the buried insulating film 3 are accumulated at the moment of turn-on, there is almost no movement of the holes in the semiconductor.

However, since lifetime is finite time in the base layer 2, a part of the accumulated holes is lost by recombination, and a hole current for supplying the lost amount is injected into the base layer 2 from the collector layer 19. Therefore, a slight hole current flows therethrough. However, in an IGBT having a thin collector layer, the lifetime control is not usually carried out today, and the recombination rate of the holes per unit time is low compared with that of a past lifetime-controlled IGBT. Therefore, the hole current which supplies the amount of holes which has been lost by the recombination is also as small as several percent or less compared with a main current.

Figure 10:
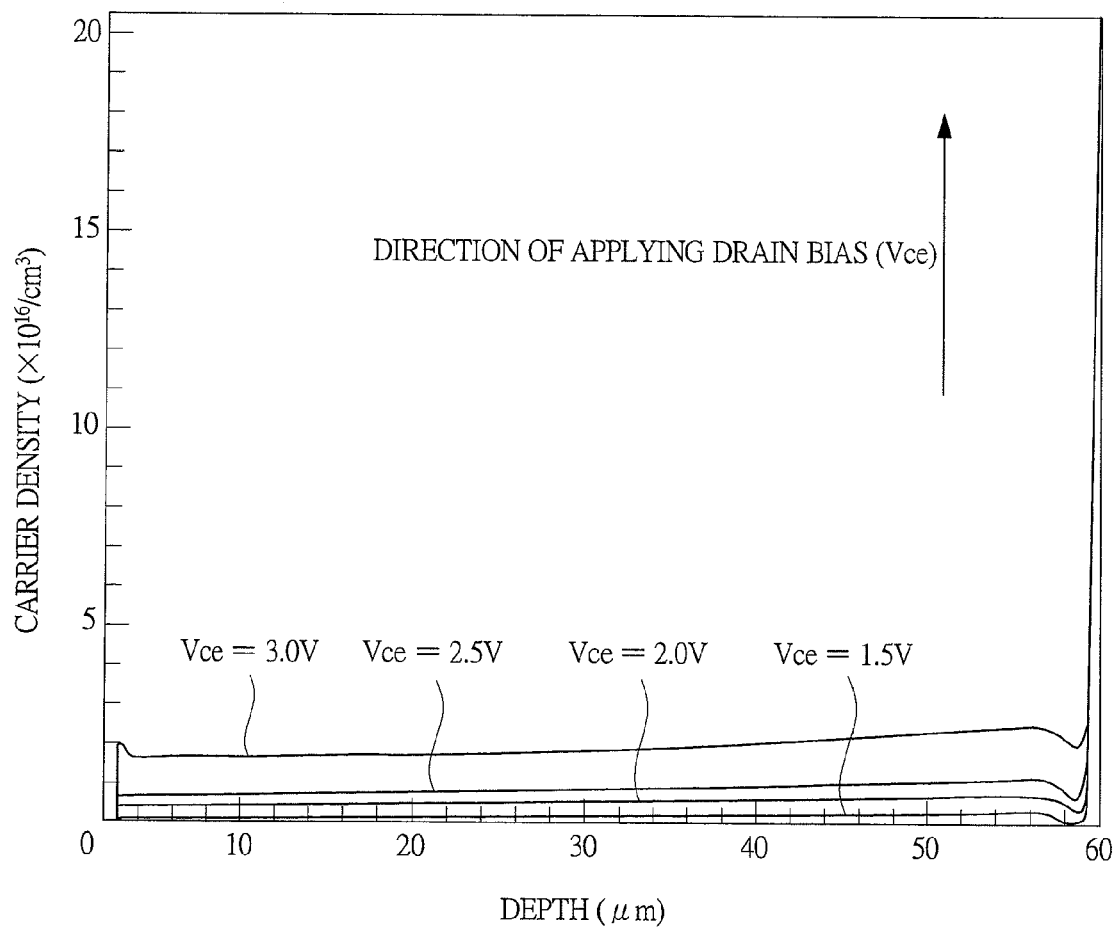
FIG. 10 is an explanatory drawing showing the relation between the depth through a surface semiconductor layer, a base layer, an n+ type buffer layer and a p type collector layer and the carrier density in an IGBT in which the thickness of the surface semiconductor layer is 500 nm.
Figure 11:
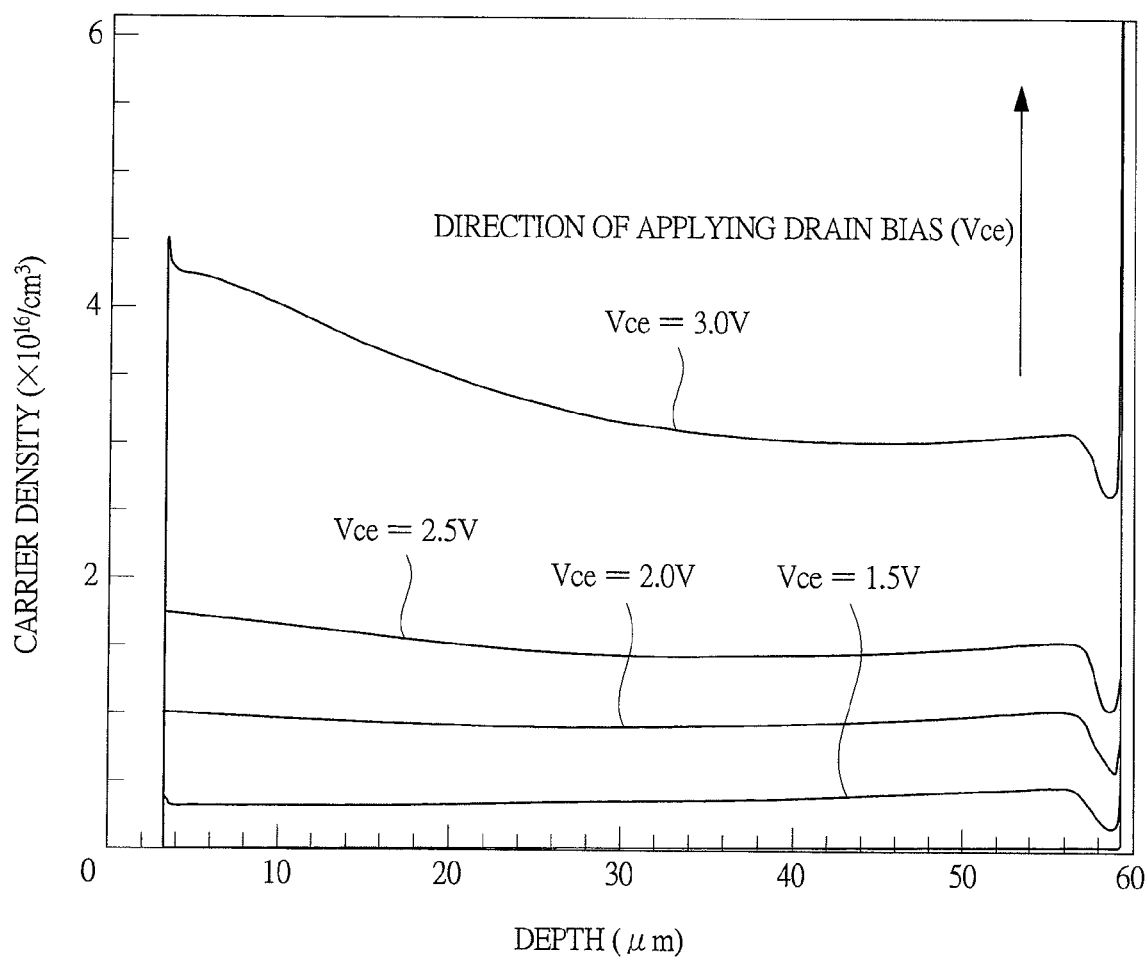
FIG. 11 is an explanatory drawing showing the relation between the depth through a surface semiconductor layer, a base layer, an n+ type buffer layer and a p type collector layer and the carrier density in an IGBT in which the thickness of the surface semiconductor layer is 300 nm.
Figure 12:
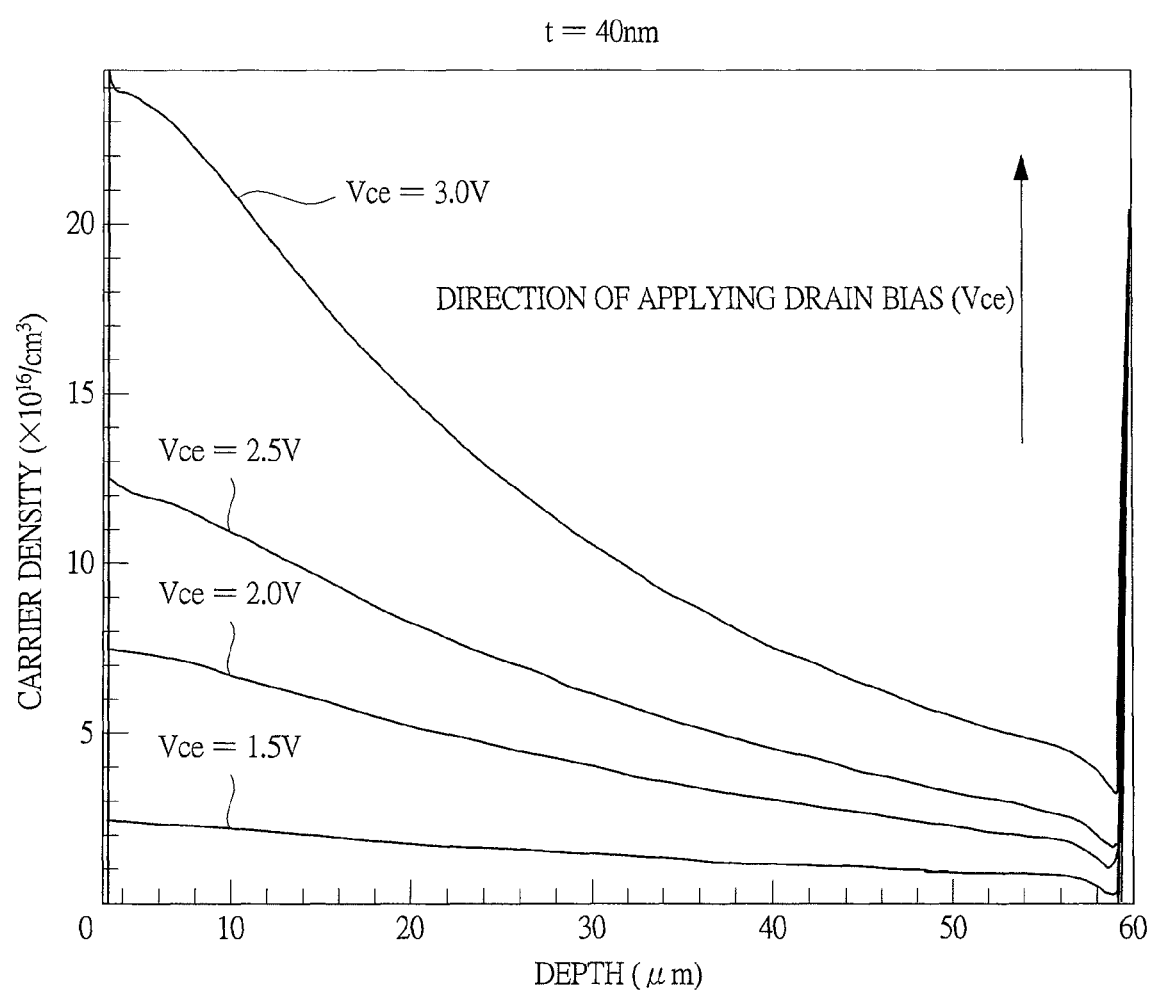
FIG. 12 is an explanatory drawing showing the relation between the depth through a surface semiconductor layer, a base layer, an n+ type buffer layer and a p type collector layer and the carrier density in an IGBT of the first embodiment of the present invention (thickness of the surface semiconductor layer is 40 nm)
Figure 13:
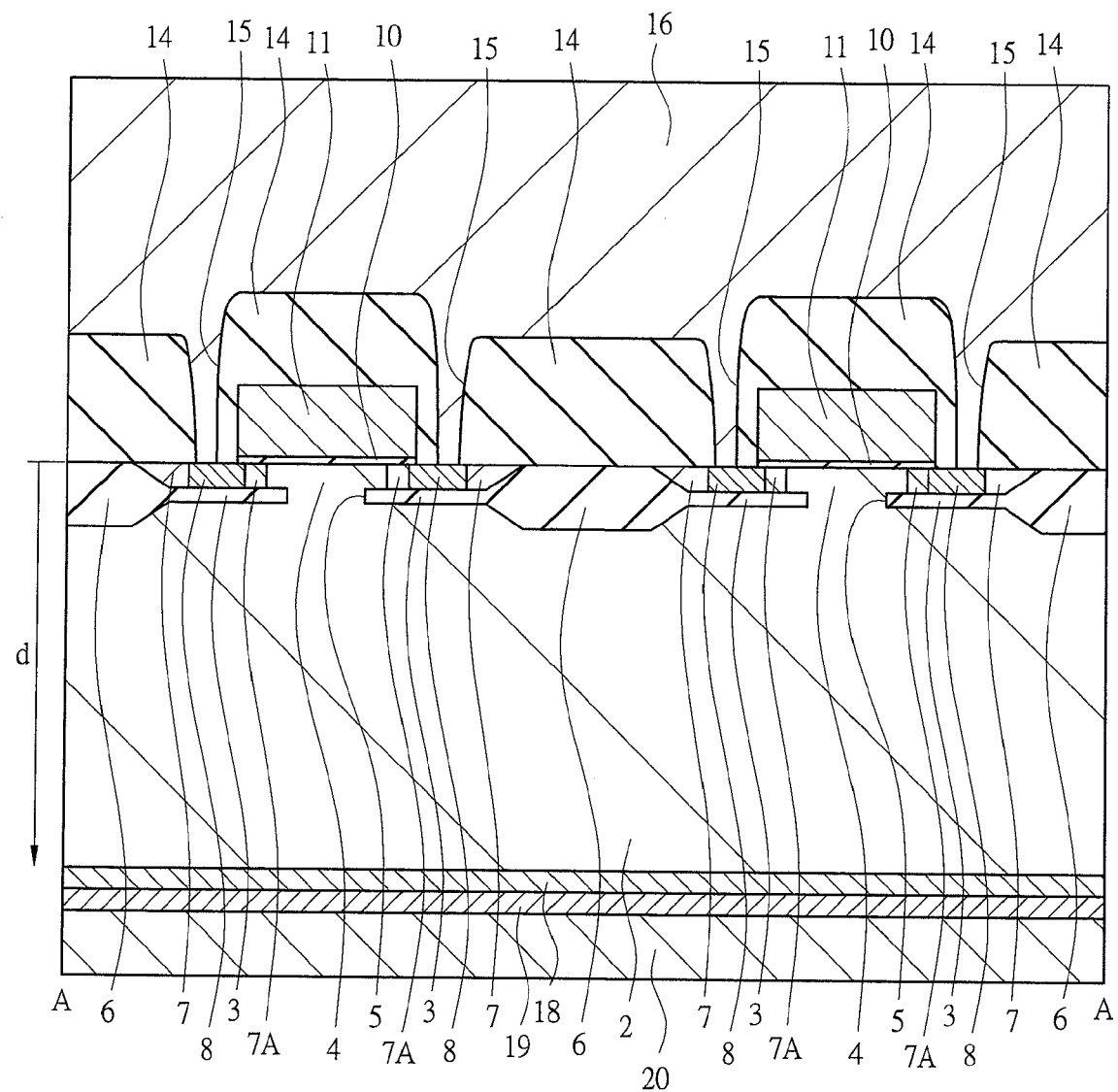
FIG. 13 is a cross-sectional view of the principal part of a chip showing the depth from the surface of the surface semiconductor layer.

FIG. 10, FIG. 11 and FIG. 12 are graphs showing the carrier density in the base layer 2 in the on-state of the IGBT with the horizontal axis representing the depth d (see FIG. 13) from the surface of the surface semiconductor layer 4, and the graphs show the cases in which the thickness t of the surface semiconductor layer 4 is 500 nm, 300 nm and 40 nm, respectively. Each of the graphs shows the relations between the depth d and the carrier density when the voltage (on-voltage Vce) between the collector and the emitter is changed to 1.5 V, 2.0 V, 2.5 V and 3.0 V. Herein, it is considered that the cases in which the thickness t of the surface semiconductor layer 4 is 500 nm and 300 nm and the case in which the thickness is 40 nm correspond to the structures of FIG. 8 and FIG. 9, respectively. The on-voltage Vce (sat) at an actual operating point is around 0.9 to 1.1 V, but up to the slightly higher on-voltages Vce (sat) are plotted because the characteristics of the carrier distribution are obviously exhibited.

As shown in FIG. 10 and FIG. 11, in the IGBT in which the thickness t of the surface semiconductor layer 4 is large, as described above, the holes flowing in from the collector side are not accumulated below the buried insulating film 3 and flow into the emitter electrode 16 in the on-state. As a result, there is a tendency that the carrier density becomes low on the surface side close to the emitter (the side of shallow d) and becomes high on the rear surface side close to the collector (the side of deep d). When the thickness t of the surface semiconductor layer 4 is 300 nm, the path of the hole current shown in FIG. 14 is somewhat narrowed, and as a result, the effect of accumulating the holes is slightly generated compared with the case in which the thickness t is 500 nm, and the carrier density immediately below the buried insulating film 3 is somewhat increased. However, the accumulation effect of this level is not sufficient for significantly reducing the on-voltage Vce (sat).

On the other hand, in the IGBT in which the thickness t of the surface semiconductor layer 4 is 40 nm, the carrier density is high on the surface side close to the emitter and is low on the rear surface side close to the collector. The reason why the carrier distribution concentrated on the emitter side is obtained when the thickness t is small is that the hole current is blocked by the n type inverted layer 7A, the holes are accumulated immediately below the buried insulating film 3 of the surface, and the accumulated holes have the effect of drawing electrons from a source region 8 via the n type inverted layer 7A. Thus, according to the IGBT of the first embodiment in which the thickness t of the surface semiconductor layer 4 is small (see FIG. 1 and FIG. 9), a considerably larger IE effect (Injection Enhancement) can be obtained compared with the comparison-target IGBTs in which the thickness t of the surface semiconductor layer 4 is large (see FIG. 8 and FIG. 14). As a result, according to the IGBT of the first embodiment, compared with the IGBT having a structure like that of FIG. 8, the switching operation can be speeded up and the turn-off loss Eoff can also be reduced while reducing the on-voltage Vce (sat).

Incidentally, when only the point that the conductivity type of the p type channel forming layer 7 is completely inverted to form the n type inverted layer 7A when the IGBT is on is taken into consideration, further reduction of the thickness t of the surface semiconductor layer 4 to about 20 nm or smaller is also conceivable. In such a case, however, even the electron current in the n type inverted layer 7A is also limited, and this region has a high serial resistance component, so that the on-voltage Vce (sat) is increased. If the on-voltage Vce (sat) is increased, the steady loss of the IGBT is increased. Accordingly, it is preferable that the thickness t of the surface semiconductor layer 4 is set to be about 20 nm or more like in the first embodiment.

Figure 15:
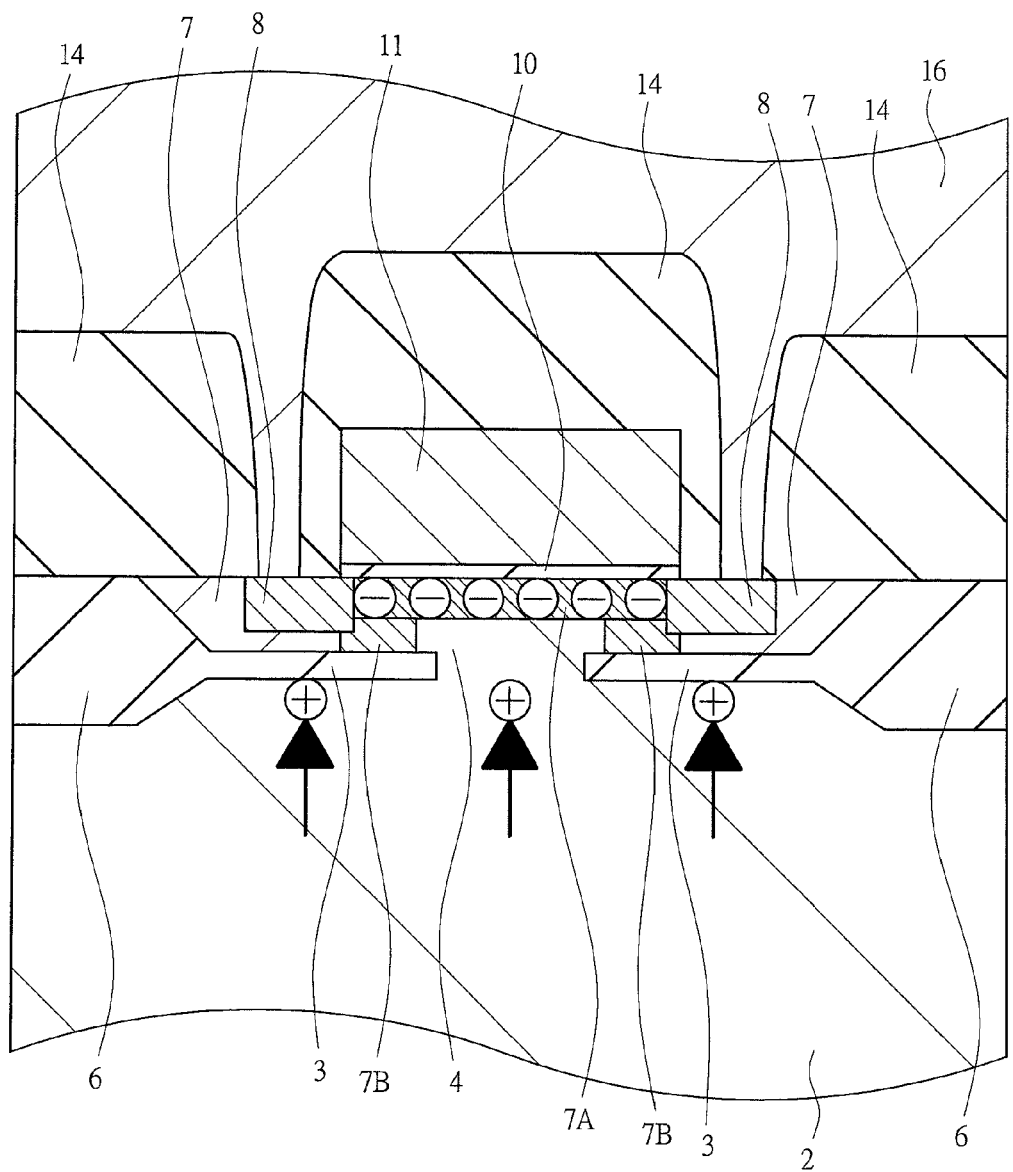

Furthermore, when the thickness t of the surface semiconductor layer 4 is about 100 nm, as shown in FIG. 15, the formation of the n type inverted layer 7A is limited to the region having a thickness of about 20 nm from the interface with the gate insulating film 10. However, the buried insulating film 3 is present on the surface opposed to the gate insulating film 10, and this has the effect of slightly reducing the band energy. Therefore, since electrons are spread and flow also in the remaining region with a thickness of about 80 nm which has not been changed to the n type inverted layer 7A in the surface semiconductor layer 4 due to the influence by the band structure of the n type inverted layer 7A, an n⁻ type inverted layer 7B gently inverted to the n type compared with the n type inverted layer 7A is formed therein. As a result, the inflow of the holes from the collector side of the rear surface of the base layer 2 to the surface semiconductor layer 4 can be made difficult.

Accordingly, it is preferable that the thickness t of the surface semiconductor layer 4 is set to be about 100 nm or less like in the first embodiment. Furthermore, from the viewpoint that the conductivity type of the p type channel forming layer 7 is completely inverted to form the n type inverted layer 7A, the thickness t of the surface semiconductor layer 4 is desirably set to be about 40 nm or less.

The inventors of the present invention evaluated the details of the hole current Ih and the electron current Ie constituting an emitter current IE by simulations. Herein, the relation of IE=Ih+Ie is established.

Figure 16:
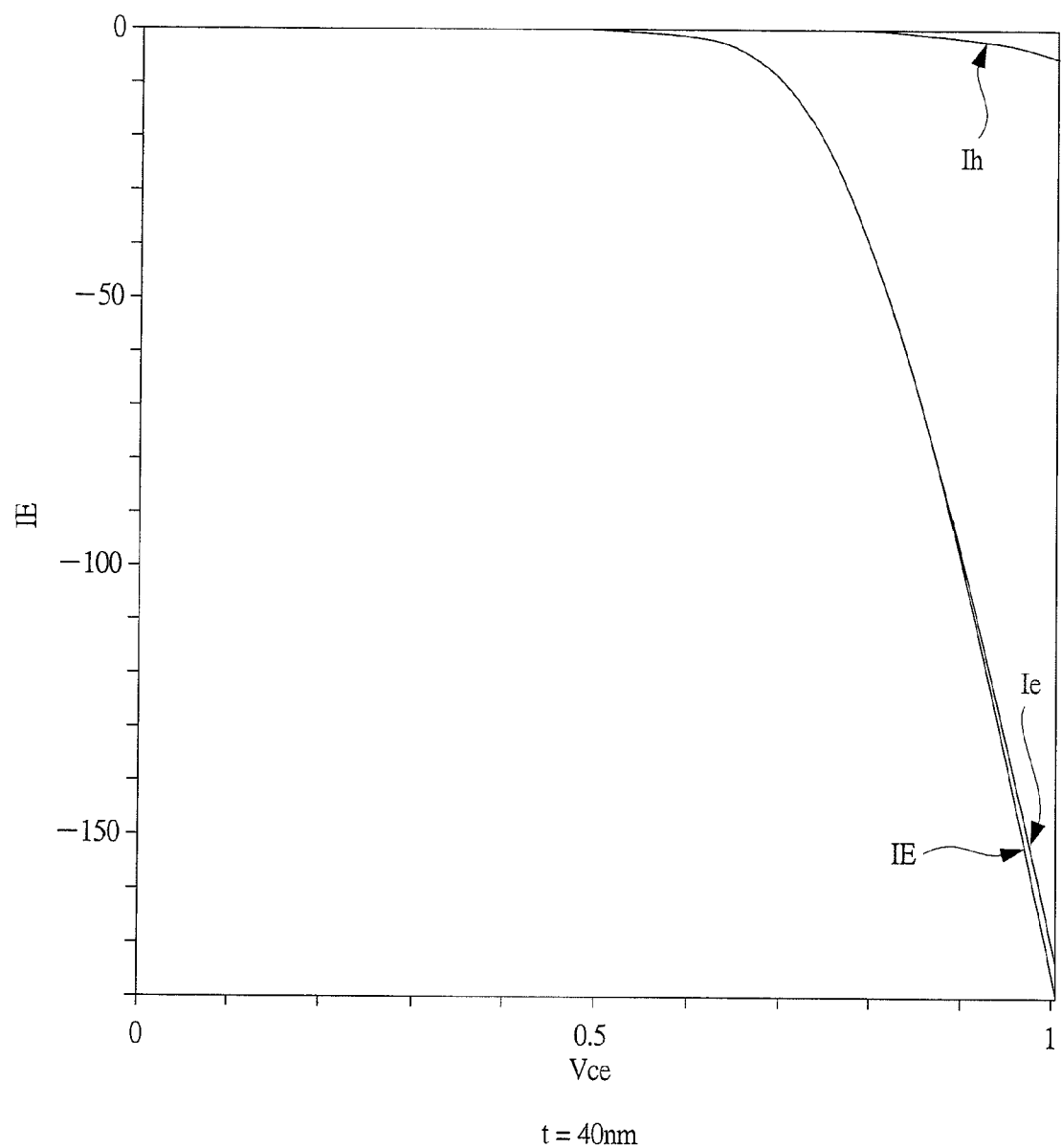
FIG. 16 is an explanatory drawing showing the details of an emitter current with respect to an operating voltage in the IGBT (thickness of the surface semiconductor layer is 40 nm) of the first embodiment of the present invention.
Figure 17:
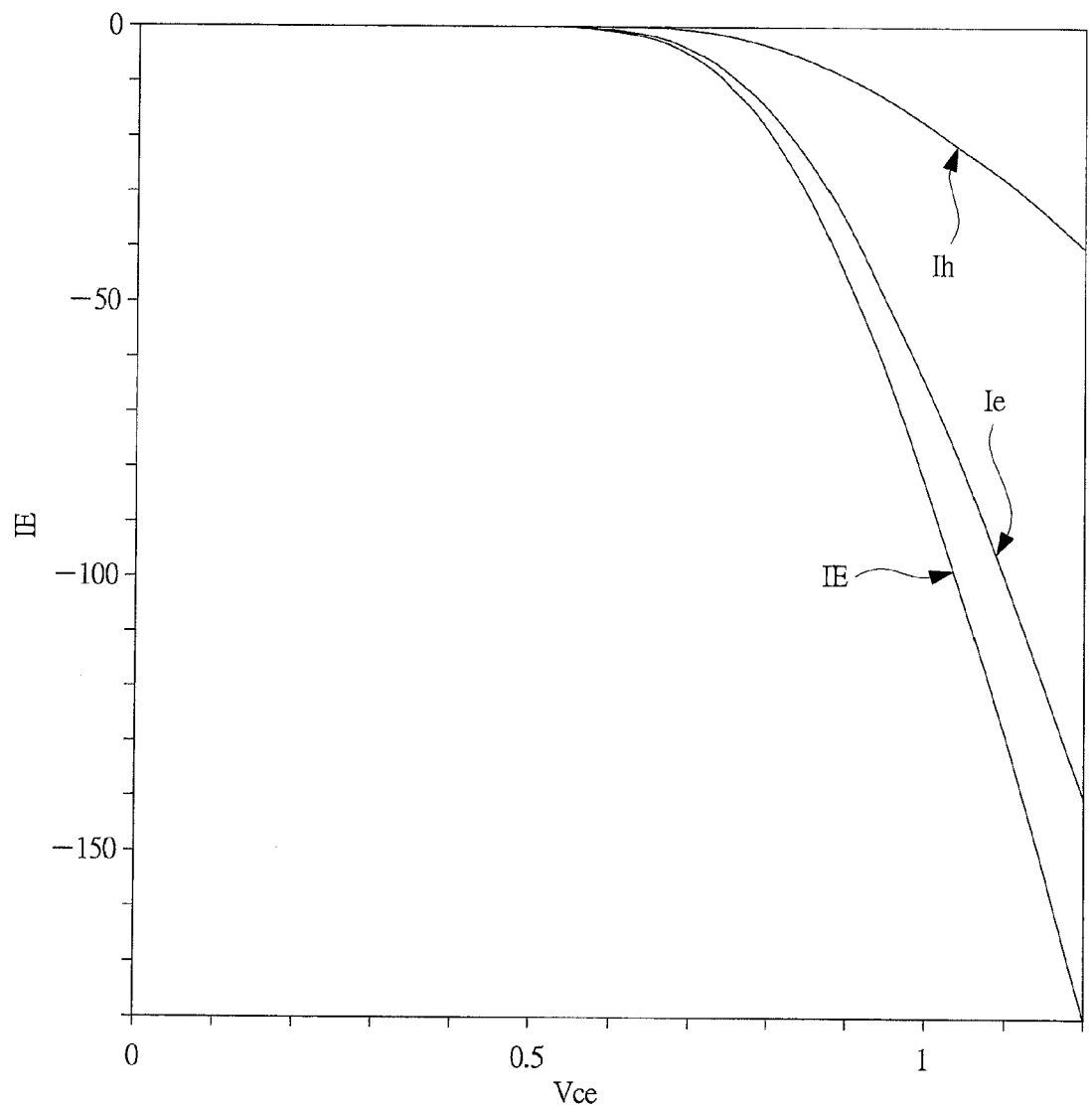
FIG. 17 is an explanatory drawing showing the details of an emitter current with respect to an operating voltage in the IGBT in which the thickness of the surface semiconductor layer is 300 nm.
Figure 18:
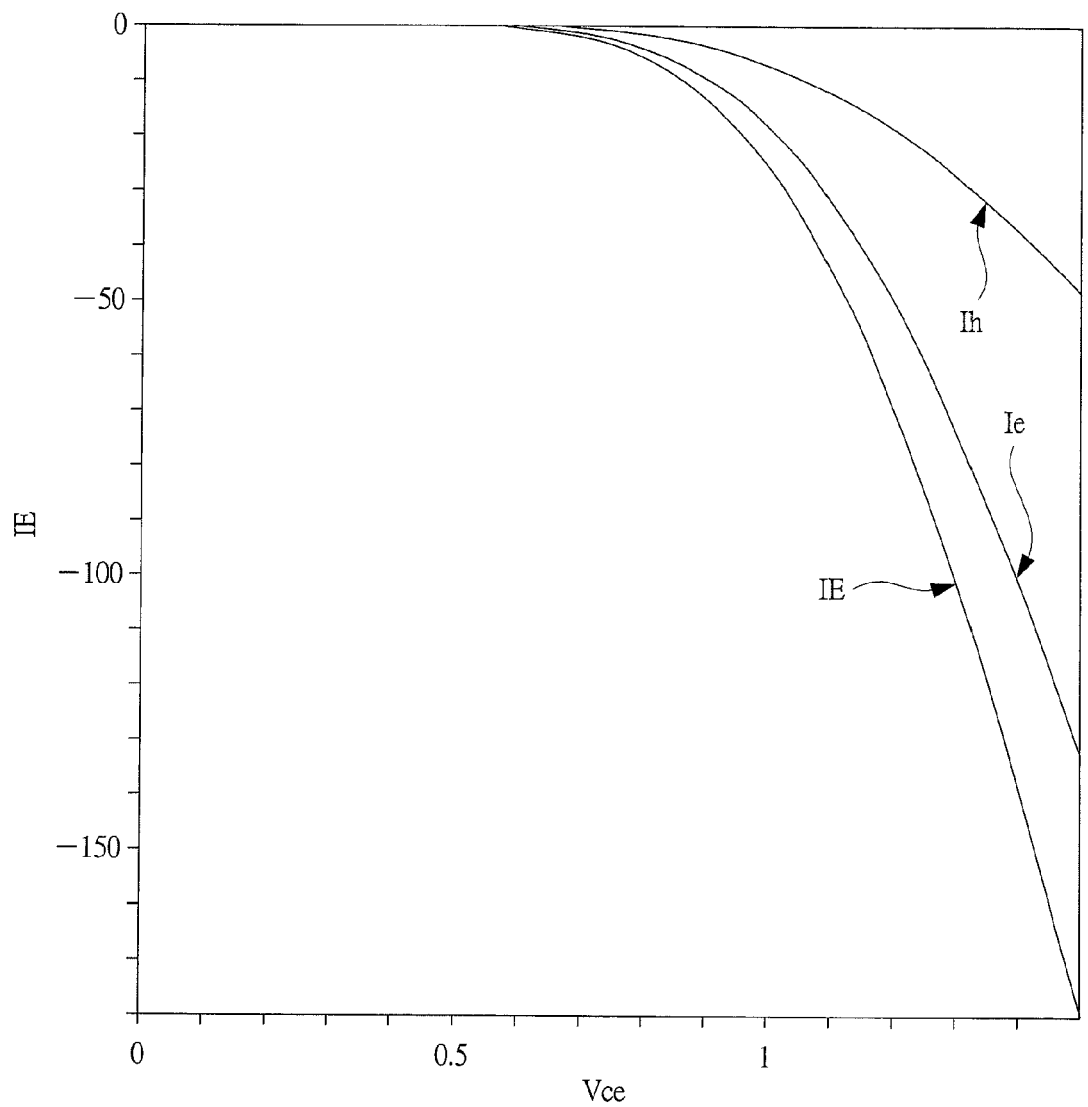
FIG. 18 is an explanatory drawing showing the details of an emitter current with respect to an operating voltage in the IGBT in which the thickness of the surface semiconductor layer is 1 μm.

FIG. 16 shows the total emitter current IE of an IGBT corresponding to the first embodiment in which the thickness t of the surface semiconductor layer 4 is 40 nm and the details of the hole current Ih and the electron current Ie constituting the emitter current IE, with the horizontal axis representing the bias voltage Vce between the collector and the emitter. FIG. 17 and FIG. 18 respectively show the total emitter currents IE of the IGBTs in which the thickness t of the surface semiconductor layer 4 is 300 nm and 1 μm and the details of the hole current Ih and the electron current Ie constituting the emitter current IE, with the horizontal axis representing the bias voltage (Vce) between the collector and the emitter.

As described above, since the hole current Ih flowing into the surface semiconductor layer 4 through the opening part 5 of the buried insulating film 3 flows into an emitter pad (emitter electrode 16) in the IGBT in which the surface semiconductor layer 4 is thick, the ratio of the hole current Ih in the total emitter current IE becomes high.

On the other hand, in the IGBT of the first embodiment, when turned on, the conductivity type of the p type channel forming layer 7 between the buried insulating film 3 and the gate insulating film 10 is completely inverted to form the n type inverted layer 7A. Therefore, the hole current Ih cannot pass therethrough and cannot reach the emitter pad (emitter electrode 16). As a result, the electron current Ie occupies most of the components of the emitter current IE, and the hole current Ih becomes 0 or extremely small.

As a result, the hole current Ih does not flow almost at all in FIG. 16, and on the other hand, the ratio of the hole current Ih component with respect to the total emitter current IE is extremely high in FIG. 17 and FIG. 18. Herein, both of them are compared with each other at the operating point at which the emitter current IE is 180 A/cm². In the IGBT serving as a comparative example in which the thickness t of the surface semiconductor layer 4 is 300 nm, the hole current Ih component and the electron current Ie component are about 41 A and about 139 A, respectively, and the current composition ratios of the hole current Ih component and the electron current Ie component are about 23% and about 77%, respectively.

Meanwhile, in the IGBT in which the thickness t of the surface semiconductor layer 4 is 1 μm, the hole current Ih component and the electron current Ie component are about 48 A and about 132 A, respectively, and the current composition ratios of the hole current Ih component and the electron current Ie component are about 27% and about 73%, respectively. It can be understood that the composition ratio of the hole current Ih is increased as the surface semiconductor layer 4 becomes thicker. The increase of the composition ratio of the hole current Ih means that the IE (injection Enhancement) effect is lost and the performance of the IGBT is lowered (Vice (sat) is increased and turn-off loss Eoff is increased) as the surface semiconductor layer 4 becomes thicker.

Even when the surface semiconductor layer 4 becomes as thick as 1 μm, the hole current Ih is not drastically increased to exceed the electron current Ie. This is because the p type collector layer 19 of the rear surface is formed to be thin (about 5 μm or less) and to have a low p type impurity concentration. Therefore, the efficiency of hole injection from the p type collector layer 19 on the rear surface to the base layer 2 is low from the beginning. It can be said that the current IGBT has succeeded in considerably reducing the composition ratio of the hole current Ih by the inventiveness to the rear surface. However, suppression of the hole current Ih by the inventiveness to the rear surface has reached its limit, and the introduction of the structure to further reduce the composition ratio of the hole current Ih is required also in the front surface by reducing the thickness t of the surface semiconductor layer 4 as shown in the present invention.

On the other hand, as shown in FIG. 16, in the IGBT of the first embodiment in which the thickness t of the surface semiconductor layer 4 is 40 nm, the current composition ratio of the hole current Ih with respect to the total emitter current IE is reduced to about 5%. More specifically, according to the IGBT of the first embodiment, it can be confirmed from the simulation results shown in FIG. 16 to FIG. 18 that the holes flowing in from the collector side in the on-state are accumulated below the buried insulating film 3 and the inflow thereof into the emitter electrode 16 can be prevented.

Figure 61:
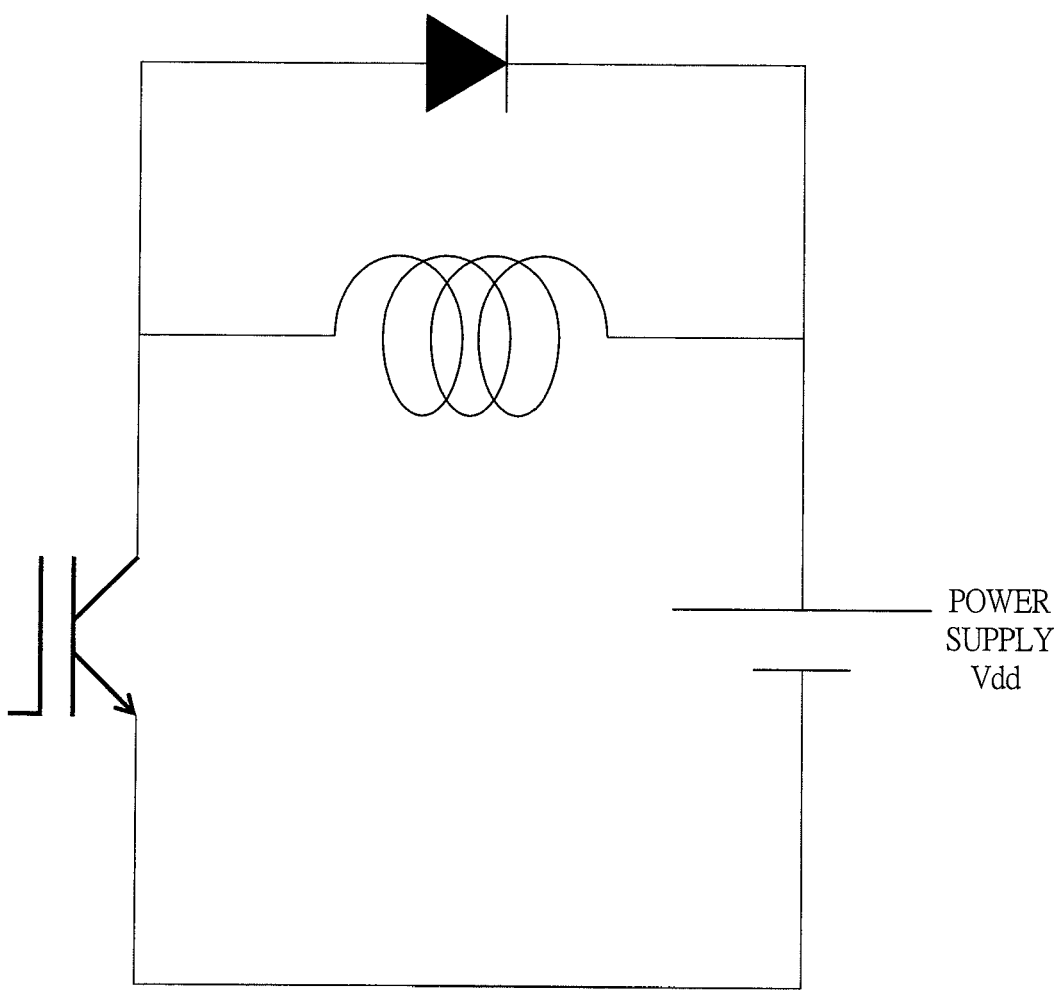
FIG. 61 is an equivalent circuit diagram showing a chopper circuit used in evaluation of the turn-off loss and switching waveforms of IGBTs.

Next, switching waveforms of IGBTs will be described. The above-described calculations of the turn-off loss Eoff and the switching waveforms described below were evaluated by using a chopper circuit shown in FIG. 61. Herein, a free wheel diode is treated as an ideal diode in simulation calculations, and the reverse recovery characteristics of the diode were excluded from the calculations.

Figure 62:
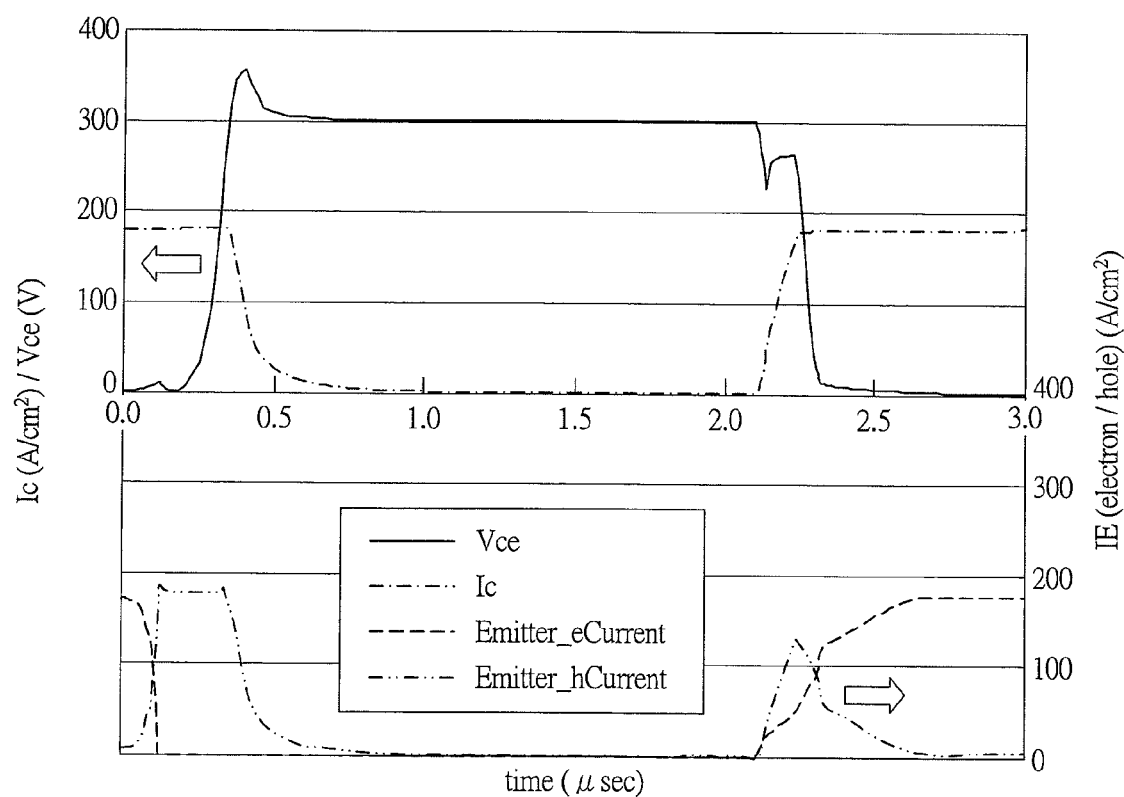
FIG. 62 is a graph showing the time transitions of the electron current component and the hole current component in the case where each of the turn-off and the turn-on is carried out once in the IGBT (cell pitch: 4 μm, channel length Lg: 0.5 μm) of the first embodiment of the present invention.
Figure 63:
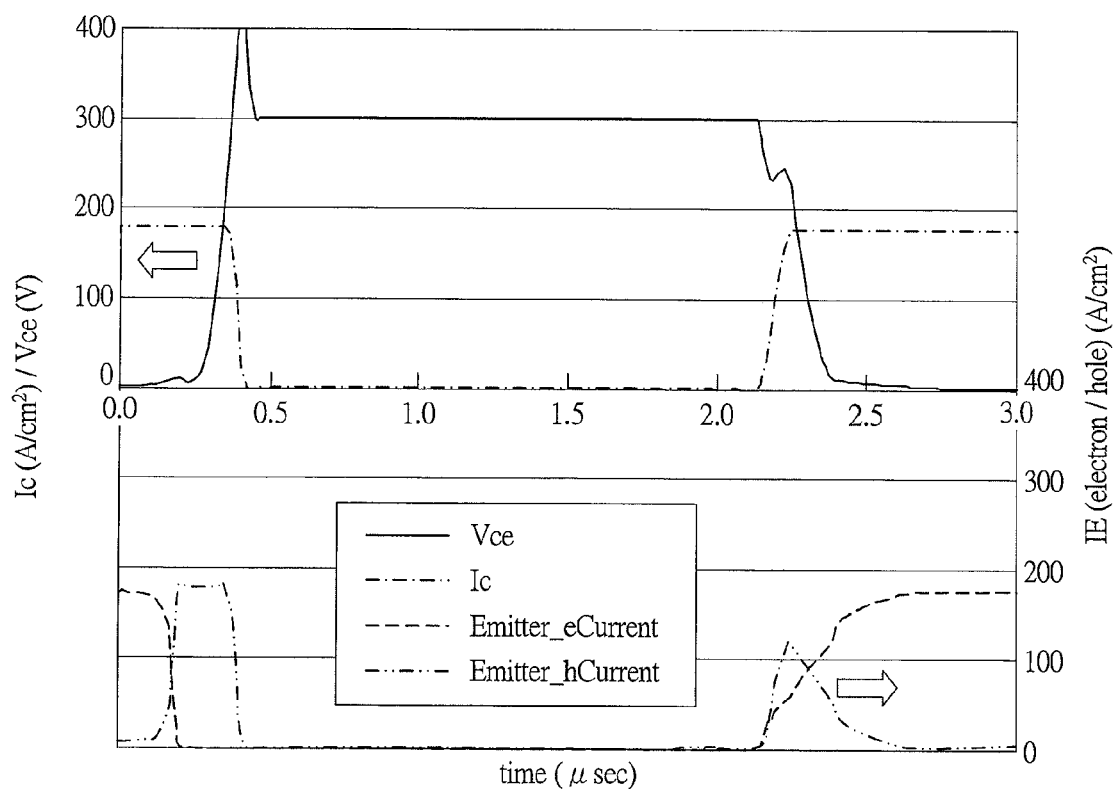
FIG. 63 is a graph showing the time transitions of the electron current component and the hole current component in the case where each of the turn-off and the turn-on is carried out once in the IGBT (cell pitch: 16 μm, channel length Lg: 2.8 μm) of the first embodiment of the present invention.
Figure 64:
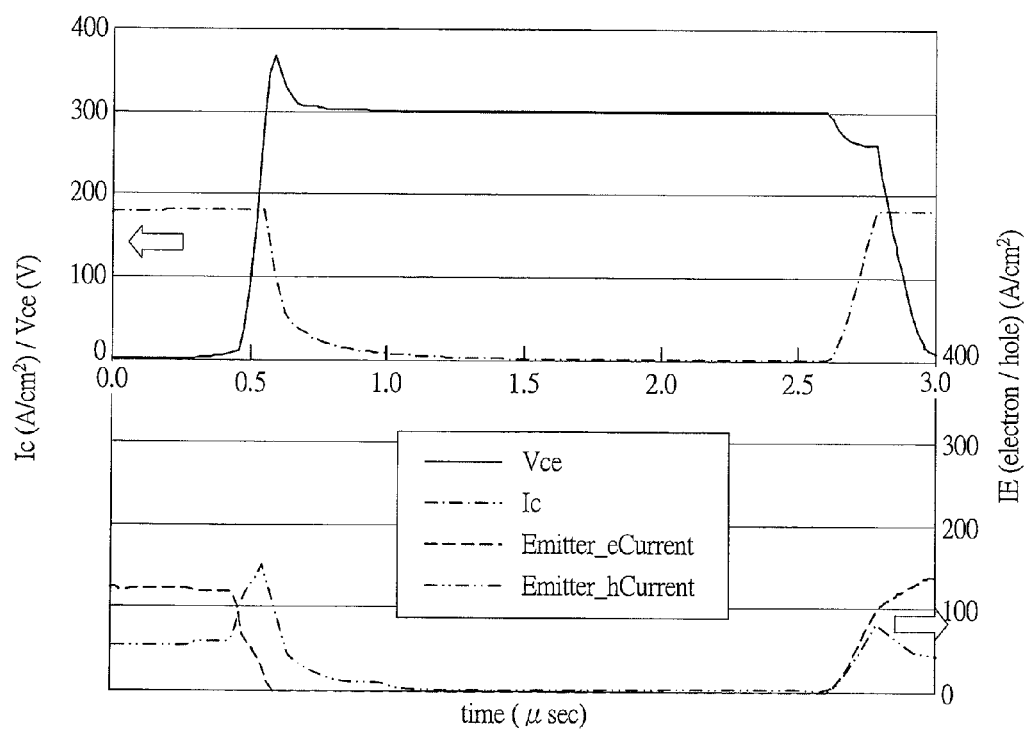
FIG. 64 is a graph showing the time transitions of the electron current component and the hole current component in the case where each of the turn-off and the turn-on is carried out once in a trench gate IGBT having the cell pitch of 4 μm.

In FIG. 62 to FIG. 64, the transition of the collector voltage Vice, the collector current Ic, the electron current Ie component of the emitter current IE and the hole current Ih component of the emitter current IE in the case where the chip area of the respective IGBTs is assumed to 1 $cm^2$ and the turn-on and the turn-off are each carried out once from the conduction state at 180 A/$cm^2$ is shown by graphs with the horizontal axis representing the time. FIG. 62 shows the case of the IGBT of the first embodiment of the present invention having a cell pitch of 4 μm and a channel length Lg of 0.5 μm, FIG. 63 shows the case of the IGBT of the first embodiment of the present invention having a cell pitch of 16 μm and a channel length Lg of 2.8 μm, and FIG. 64 shows the case of a trench gate IGBT having a cell pitch of 4 μm.

On the time axis of the simulation calculations, a gate input voltage Vge was assumed to be changed from 15 V to −15 V to carry out the turn-off after 10 nsec from the start, returned from −15 V to 0 V after 1.8 μsec, and changed from 0 V to 15 V to carry out the turn-on after 2 μsec.

It has been known that the factor that most strongly determines the turn-off loss Eoff in the turn-off is decay of a current. However, when the details of the current that is in a decay period are monitored by the emitter electrode 16, it can be understood that the turn-off loss is determined completely by the hole current Ih.

Also in the IGBT in which the thickness t of the surface semiconductor layer 4 is small, as is already described, the electron current Ie becomes predominant and the hole current Ih is suppressed to an extremely small amount in a normal conductive state, whereby the on-voltage Vce (sat) is reduced, and thus the steady loss can be reduced. However, in a transient state of turn-off, reversely, the current is quickly replaced by the hole current Ih, and the decay of the hole current Ih determines the decay of the entire current and the turn-off loss Eoff.

The factor that determines the decay of the hole current Ih is the injection amount of the holes from the p type collector layer 19. Therefore, it can be understood that the reduction of the injection efficiency by means of the reduction of the p type impurity concentration of the p type collector layer 19 directly leads to the reduction in the turn-off loss Eoff. Furthermore, as is already described, even when the injection efficiency of the holes from the p type collector layer 19 is reduced, if the thickness t of the surface semiconductor layer 4 is small, the on-voltage Vce (sat) can be maintained to be low by the carrier accumulation effect.

As shown in FIG. 64, in the switching waveforms of the conventional trench gate IGBT, it takes a long time before the state of electron current Ie predominance is switched to the state of hole current Ih predominance in the turn-off and decay of the hole current Ih is slow, so that the turn-off time becomes long and the turn-off loss Eoff is increased as a result. Moreover, the turn-on time also becomes long.

Figure 19:
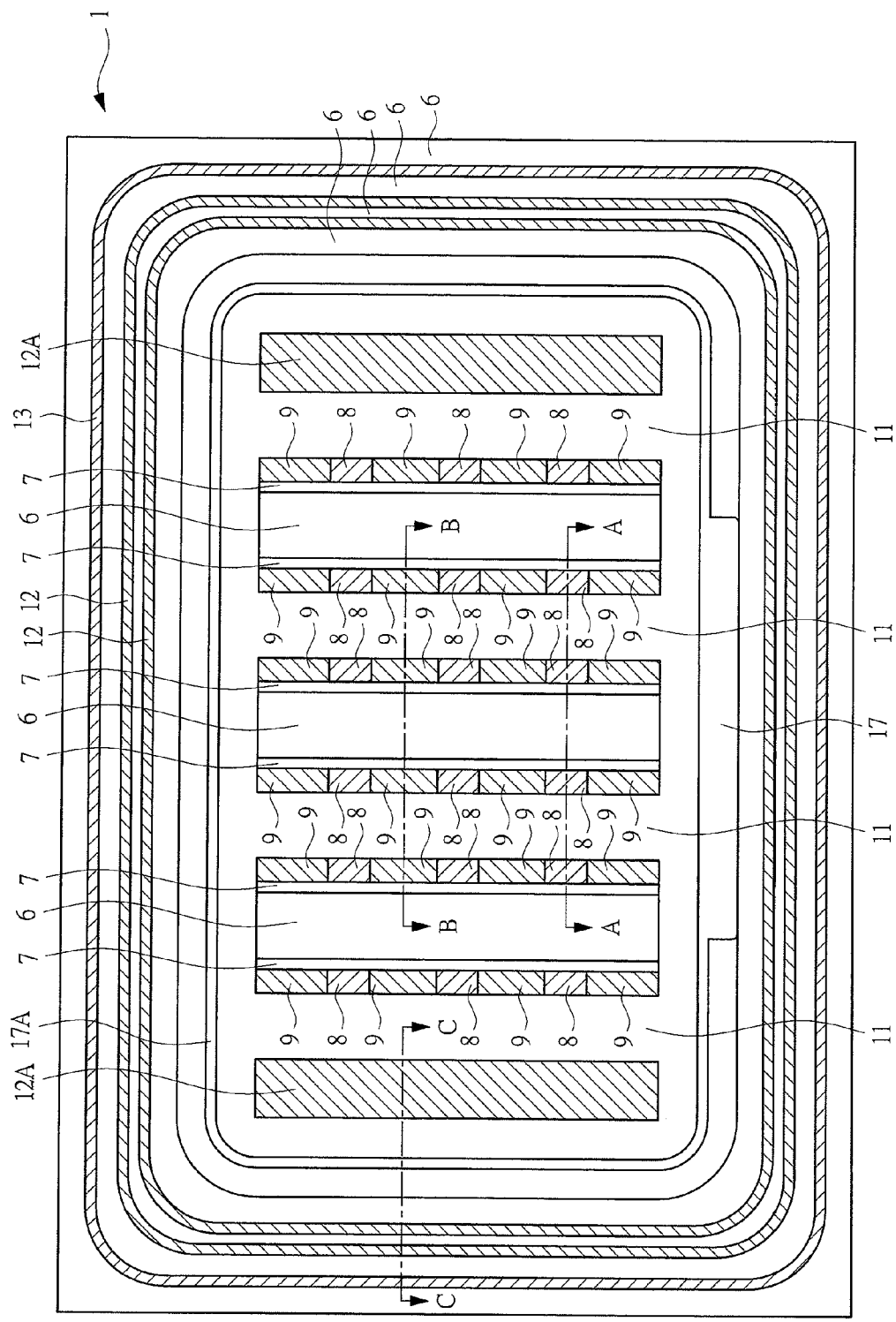
FIG. 19 is a plan view of the principal part of the chip having the IGBT which is a semiconductor device of the first embodiment of the present invention.

Next, a semiconductor device including the IGBT of the present invention will be described in detail. FIG. 19 is a plan view of the principal part of a semiconductor chip (hereinafter, simply referred to as "chip") 1 for forming the IGBT of the first embodiment, and FIG. 1 described above shows the cross section along the line A-A in FIG. 19.

As described above, the IGBT of the first embodiment has a structure in which a plurality of surface semiconductor layers 4 made of $n^-$ type single-crystal silicon are formed on a main surface of a base layer 2 made of, for example, $n^-$ type single-crystal silicon via a buried insulating film (thin-film part) 3, and the base layer 2 and the surface semiconductor layer 4 are connected to each other in an opening part (separation part) 5 formed in the buried insulating film 3. On the main surface of the base layer 2, a plurality of active regions are defined by a plurality of thick field insulating films (thick-film parts of the buried insulating film 3) 6, and the surface semiconductor layer 4 is formed in each of the plurality of active regions, respectively. The thickness of the base layer 2 is, for example, about 60 μm to 150 μm, but the thickness is determined in accordance with the breakdown voltage of the IGBT. For example, if the breakdown voltage is 600 V, the thickness is about 60 μm to 100 μm, and if the breakdown voltage is 1200 V, the thickness is about 120 μm to 150 μm. Moreover, as described above, the IGBT of the first embodiment is characterized in that the thickness t of the surface semiconductor layer 4 is about 20 nm to 100 nm.

The p type channel forming layer 7, the $n^+$ type source layer 8 and the $p^+$ type emitter layer 9 are formed in the surface semiconductor layer 4 over the buried insulating film 3. The impurity concentration in the $p^+$ type emitter layer 9 is higher than the impurity concentration in the p type channel forming layer 7. Moreover, the p type channel forming layer 7 on the field insulating film 6 has the function of reducing the stress generated by heat.

The gate electrode 11 made of polycrystalline silicon is patterned on each of the surface semiconductor layers 4 via the gate insulating film 10. As shown in FIG. 19, all the gate electrodes 11 are connected in the planar pattern. Furthermore, a part of the gate electrodes 11 forms the pattern surrounding the plurality of surface semiconductor layers 4 in a plane.

On the outer peripheral side of the chip 1, a plurality of p type field limiting rings 12 are formed so as to surround the plurality of surface semiconductor layers 4 and the gate electrodes 11 in a plane, and an n type guard ring 13 is formed so as to further surround the plurality of p type field limiting rings 12. The p type field limiting rings 12 are brought into the floating state in which the voltage thereof is not fixed. FIG. 19 shows the example in which the two p type field limiting rings 12 are formed, but more field limiting rings may be formed.

By forming the plurality of p type field limiting rings 12 as described above, the largest electric-field part sequentially shifts to the corner parts of the p type field limiting ring 12 on the outer side when the IGBT is off, and breakdown occurs in the outermost p type field limiting ring 12, so that the breakdown voltage of the IGBT of the first embodiment can be increased. The n type guard ring region 13, which is formed to surround the plurality of p type field limiting rings 12, has the function of protecting the IGBT elements in the chip 1 after a semiconductor wafer is diced into pieces of the chip 1.

An insulating film 14 made of, for example, a PSG (Phospho Silicate Glass) film is formed on the surface semiconductor layers 4 and the field insulating films 6 so as to cover the gate electrodes 11. In the insulating films 14, opening parts 15 which reach the $n^+$ type source layer 8 and the $p^+$ type emitter layer 9 and opening parts (omitted in the drawing) which reach the gate electrodes 11 are formed.

In the state in which the opening parts 15 which reach the $n^+$ type source layer 8 and the $p^+$ type emitter layer 9 and the opening parts which reach the gate electrodes 11 are formed, the emitter pads (emitter electrodes) 16 which are connected to the $n^+$ type source layer 8 and the $p^+$ type emitter layer 9 at the bottom parts of the opening parts 15 and gate pads 17 which are connected to the gate electrodes 11 at the bottom parts of the opening parts which reach the gate electrodes 11 are formed on the insulating film 14 so that they are separated from each other. The emitter pad 16 and the gate pad 17 are made of, for example, Al (aluminum). Furthermore, a gate finger 17A which is continuous with the gate pad 17 and is made of, for example, Al is formed over the pattern of the gate electrodes 11 surrounding the plurality of surface semiconductor layers 4. The gate finger 17A is connected to the gate electrode 11 below the opening part formed in the insulating film 14 therebelow.

Although illustration thereof is omitted, a polyimide film is formed so as to cover the emitter pad 16 and the gate pad 17, and opening parts for exposing each part of the surfaces of the emitter pad 16 and the gate pad 17 are formed in the polyimide film. These opening parts serve as bonding pads for connecting bonding wires, which electrically connect the chip 1 to external devices.

The $n^+$ type buffer layer 18, the p type collector layer 19 and the collector electrode 20 are formed on the rear surface of the base layer 2 in this order from the side close to the base layer 2. The p type collector layer 19 has a high specific resistance because the concentration of the p type impurity introduced thereinto is low. Therefore, the layer is required to be thin in order to reduce the serial resistance component owned by the p type collector layer 19, and the thickness thereof is preferably about 5 µm or less. Furthermore, when the fact that the diffusion coefficient of B (boron) serving as the p type impurity introduced into the p type collector layer 19 is small is taken into consideration, the thickness of the p type collector layer 19 is preferably about 1 µm or less.

The collector electrode 20 is formed of a metal film in which an Al film, a Ti (titanium) film, a Ni (nickel) film and an Au (gold) film are stacked in this order from the side close to the p type collector layer 19, a metal film in which a Ni film, a Ti film, a Ni film and an Au film are stacked in this order from the side close to the p type collector layer 19 or a metal film in which a Ti film, a Ni film and an Au film are stacked in this order from the side close to the p type collector layer 19.

Second Embodiment

In a second embodiment, a manufacturing method of the IGBT of the above-described first embodiment will be described with reference to FIG. 20 to FIG. 41. Among FIG. 20 to FIG. 41, FIG. 20, FIG. 22, FIG. 27, FIG. 30, FIG. 33, FIG. 36 and FIG. 39 each shows the cross section in the step at the position along the line C-C in FIG. 19, FIG. 21, FIG. 23, FIG. 24, FIG. 25, FIG. 26, FIG. 28 and FIG. 29 each shows the cross section in the step at the position along the line A-A and the position along the line B-B in FIG. 19, FIG. 31, FIG. 34, FIG. 37 and FIG. 40 each shows the cross section in the step at the position along the line A-A in FIG. 19, and FIG. 32, FIG. 35, FIG. 38 and FIG. 41 each shows the cross section in the step at the position along the line B-B in FIG. 19.

Figure 20:
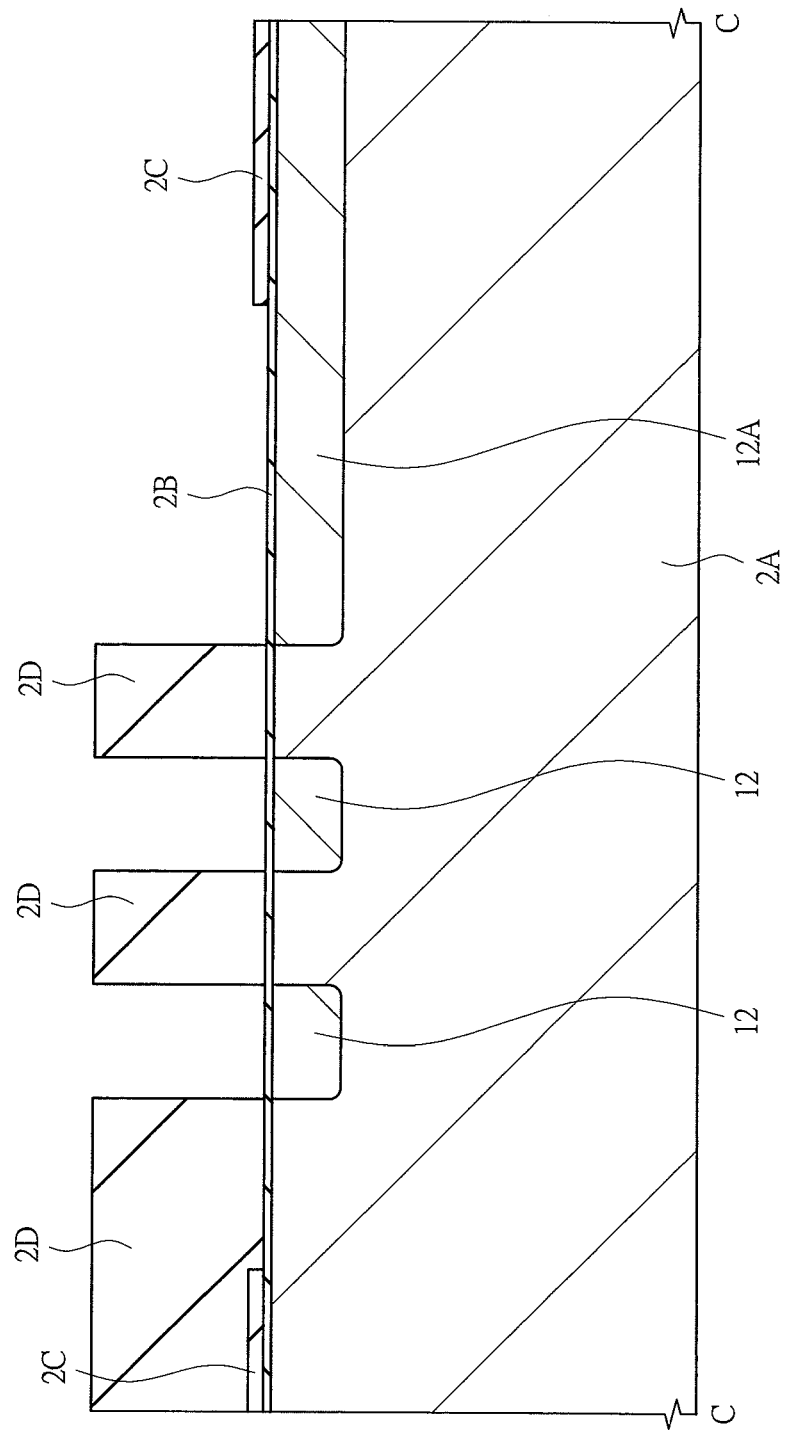
FIG. 20 is a cross-sectional view of the principal part for describing a manufacturing method of an IGBT of a second embodiment of the present invention.
Figure 21:
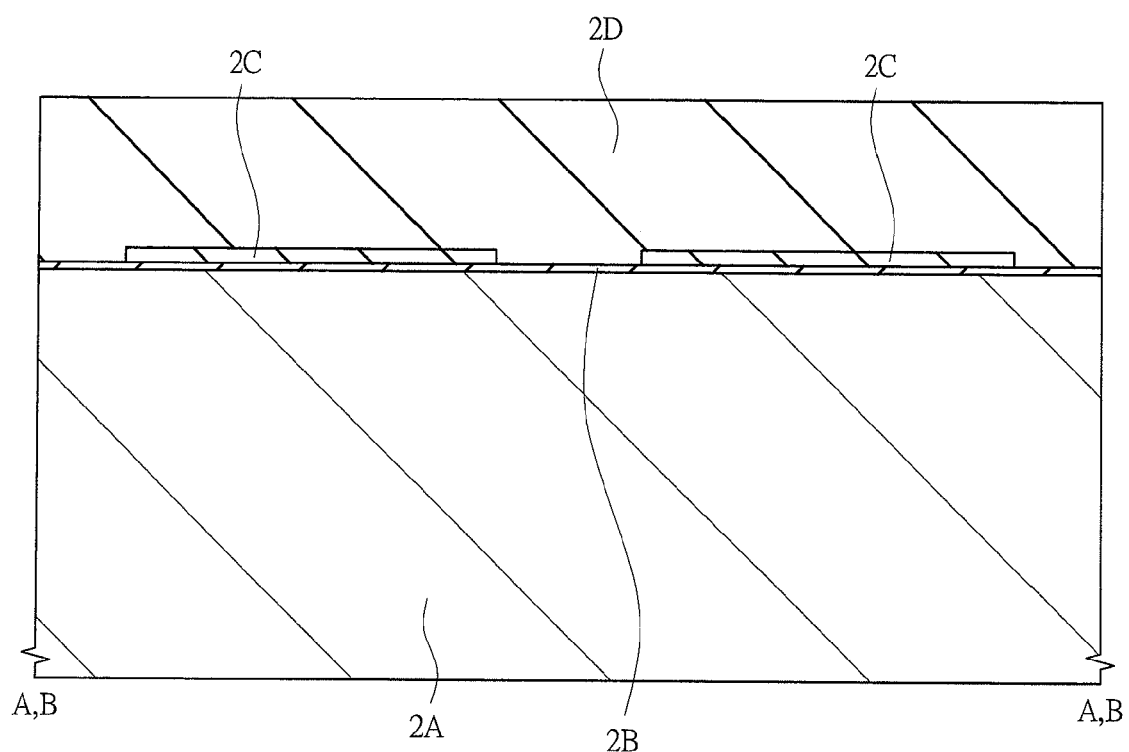
FIG. 21 is a cross-sectional view of the principal part for describing the manufacturing method of the IGBT of the second embodiment of the present invention.

First, as shown in FIG. 20 and FIG. 21, a high-resistance semiconductor substrate (hereinafter, simply referred to as "substrate") 2A made of an $n^-$ type single-crystal silicon is prepared. As the type of the crystal which forms the substrate 2A, FZ (Float Zoning) crystal manufactured by a floating-zone method or CZ (Czochralski) crystal manufactured by a Czochralski method (pulling method) is desired. Regarding the criteria for determining which one of the FZ crystal and the CZ crystal is to be employed, the FZ crystal is preferably employed from the point of obtaining a stable high-resistance substrate 2A at low cost.

However, in the second embodiment, film formation is carried out on the substrate 2A by an epitaxial method in a later step. In general, the FZ crystal has a low content of oxygen atoms and is mechanically soft, and slip dislocations are readily generated therein by thermal stress. Therefore, it can be said that the substrate 2A made of the FZ crystal is not suitable for the introduction to an epitaxial furnace. On the other hand, when the CZ crystal is used to form the substrate 2A, since oxygen atoms are taken into the crystal lattice thereof as an impurity, the mechanical strength thereof is improved. Therefore, it can be said that the substrate 2A made of the CZ crystal is more preferable if the substrate 2A is to be introduced into an epitaxial furnace.

Therefore, in the second embodiment, the following is shown as the examples of the criteria for determining which one of the FZ crystal and the CZ crystal is to be employed as the substrate 2A.

That is, in the FZ crystal, a numerical value of high resistance is stable, the crystal quality is high and stable, and the cost is low for its high quality. In the case of the FZ crystal, by forming an oxide film on the crystal surface by, for example, a LOCOS (local oxidation of silicon) method, the mechanical strength of the substrate 2A can be improved by the reinforcement by the oxide film. Moreover, in the formation of the oxide film by the LOCOS method, a minute amount of oxygen penetrates into the substrate 2A, and the mechanical strength of the substrate 2A can be improved also by the penetration of the minute amount of oxygen. If it can be expected that the mechanical strength of the substrate 2A is enhanced enough to withstand the epitaxial steps as a result of the improvement in the mechanical strength of the substrate by these factors, the selection of the FZ crystal as the substrate 2A with an emphasis on quality can be shown as an example.

On the other hand, compared with the FZ crystal, the numerical value of high resistance is somewhat instable and the crystal quality is not so good in the CZ crystal, but on the other hand, the CZ crystal is lower cost than the FZ crystal and has mechanical strength enough to withstand the epitaxial steps. Therefore, the selection of the CZ crystal as the substrate 2A with an emphasis on low cost and mechanical strength can be shown as an example.

In both of the case in which the FZ crystal is selected as the substrate 2A and the case in which the CZ crystal is selected as the substrate 2A, the crystal orientation of the main surface (element formation surface) is preferably the (100) plane or a plane equivalent to the (100) plane. Herein, examples of the plane equivalent to the (100) plane include the (010) plane and the (001) plane. In the second embodiment, hereinafter, the (100) plane and the planes equivalent to the (100) plane are sometimes described as the {100} planes.

Next, the substrate 2A is subjected to thermal treatment, thereby forming a thin silicon oxide film 2B on the main surface of the substrate 2A. Then, a silicon nitride film 2C is deposited on the silicon oxide film 2B. Subsequently, the silicon nitride film 2C is patterned by the etching using a photoresist film patterned by the photolithography technology as a mask, thereby removing the silicon nitride film 2C in the region in which the field insulating film 6 is to be formed in a later step.

Next, an impurity of p type conductivity (for example, B (boron)) is introduced into the main surface of the substrate 2A with using a photoresist film 2D patterned by the photolithography technology as a mask, thereby forming the p type field limiting rings 12 and p type wells 12A (see also FIG. 19).

Figure 22:
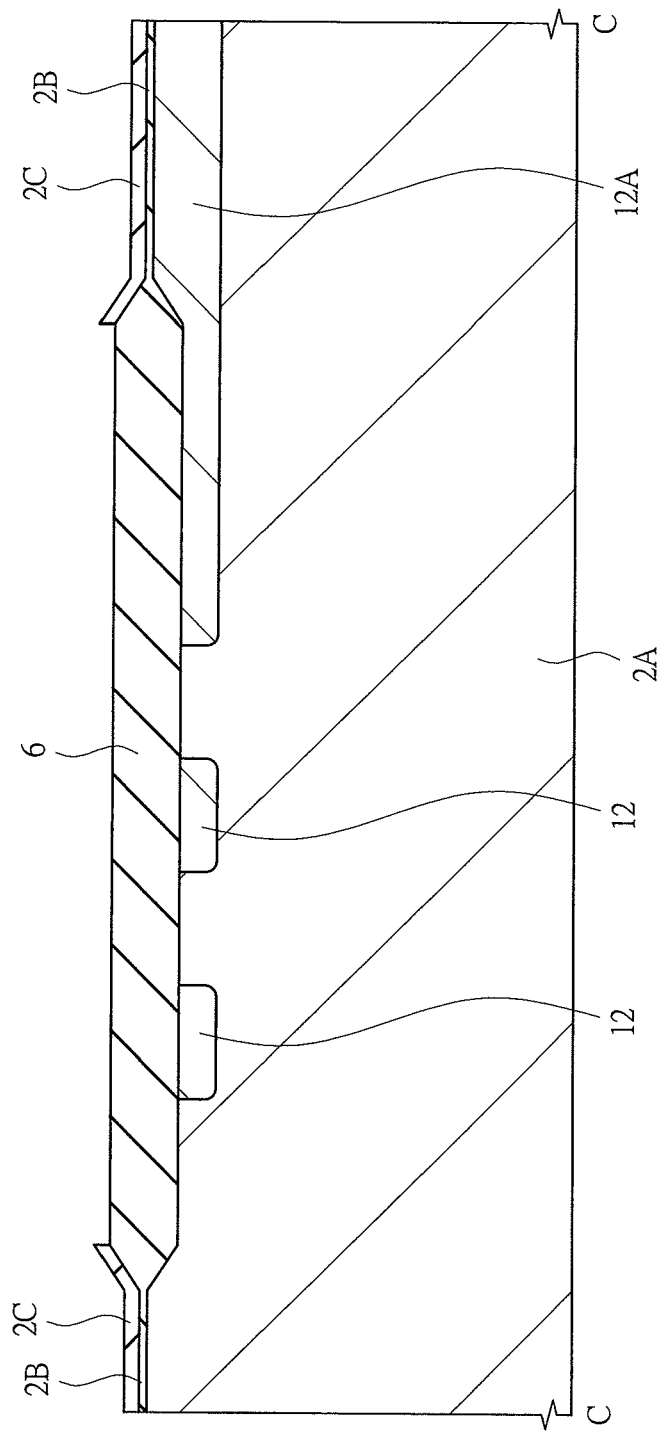
FIG. 22 is a cross-sectional view of the principal part in the manufacturing step of the IGBT continued from FIG. 20.
Figure 23:
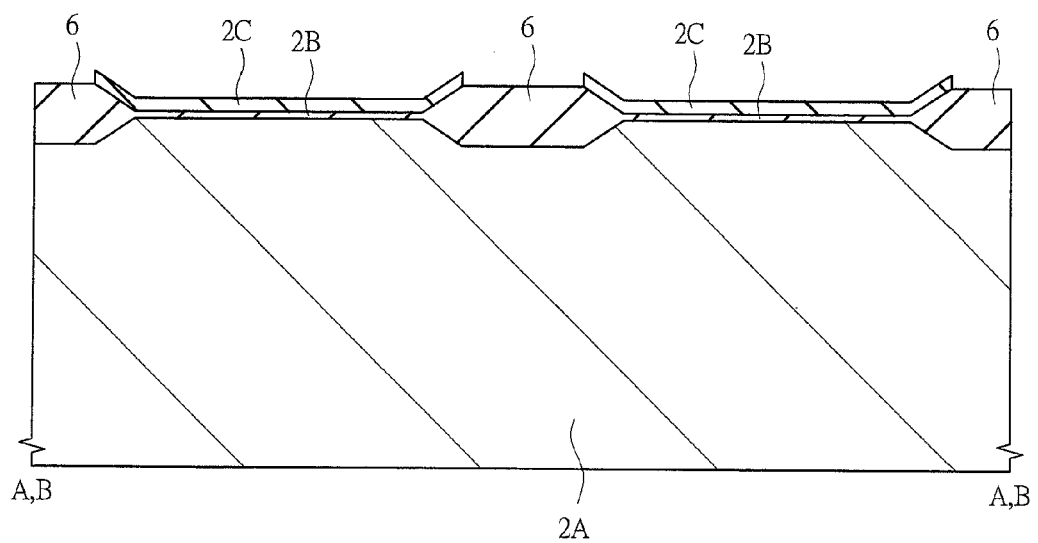
FIG. 23 is a cross-sectional view of the principal part in the manufacturing step of the IGBT continued from FIG. 21.

Next, as shown in FIG. 22 and FIG. 23, the substrate 2A is subjected to thermal treatment by the LOCOS method, thereby forming the field insulating film 6 having a large film thickness. The active regions (regions in which the field insulating film 6 is not present in a plane) are defined in the main surface of the substrate 2A by the field insulating film 6. In the second embodiment, when the field insulating film 6 is formed, the regions in which the field insulating film 6 having the large film thickness is formed and the regions in which the field insulating film 6 is not present (the gate electrodes 11 are disposed in FIG. 19) are alternately arranged in the stripe shape in the active regions of the main surface of the substrate 2A as shown in FIG. 19. The direction of the stripes is selected in accordance with the crystal orientation of the main surface of the substrate 2A, and the reason therefor will be described later.

Figure 24:
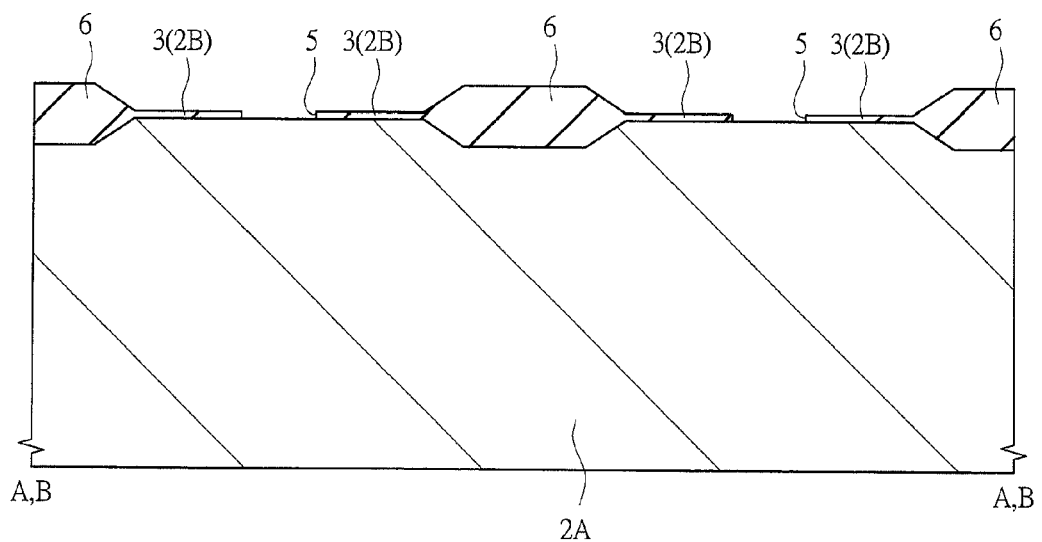
FIG. 24 is a cross-sectional view of the principal part in the manufacturing step of the IGBT continued from FIG. 23.

Next, as shown in FIG. 24, the substrate 2A is cleaned by using a hydrofluoric-acid-based solution, thereby removing the silicon nitride film 2C on the main surface of the substrate 2A. Then, the silicon oxide film 2B is etched with using a photoresist film patterned by the photolithography technology as a mask. By this means, the buried insulating film 3 provided with the opening part 5 can be formed. At this point, the surface of the substrate 2A is exposed from the bottom surface of the opening part 5.

Figure 25:
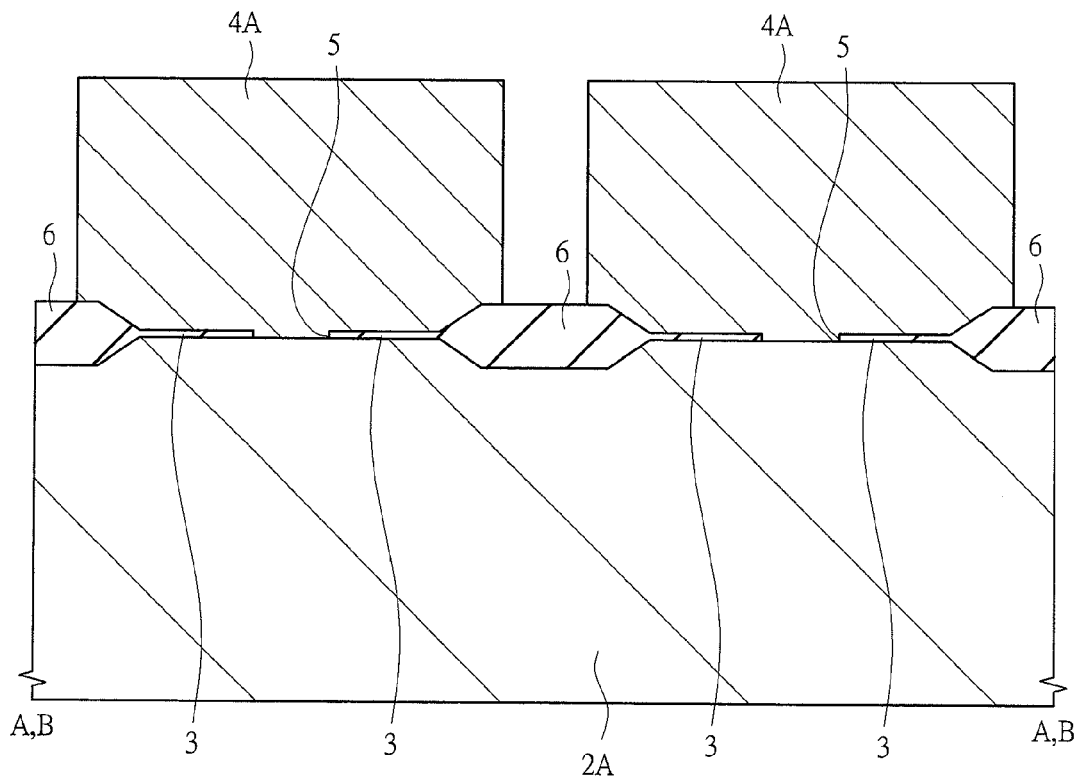
FIG. 25 is a cross-sectional view of the principal part in the manufacturing step of the IGBT continued from FIG. 24.

Next, as shown in FIG. 25, an n$^-$ type single-crystal silicon film 4A having approximately the same specific resistance as that of the substrate 2A is formed by the epitaxial method so that the silicon crystal is continued in a lattice level from the opening part 5 of the buried insulating film 3. In this process, in order to prevent polycrystalline silicon from being deposited on the surface of the buried insulating film 3, epitaxial film formation conditions having selectivity are employed. Specific examples thereof include the means of supplying mixed gas of SiHCl$_3$ (trichlorosilane) and HCl (hydrochloric acid) into a furnace by using carrier gas containing H$_2$ (hydrogen) gas as a main component after the substrate 2A is introduced into the epitaxial furnace and the means of supplying mixed gas of SiH$_2$Cl$_2$ (dichlorosilane) and HCl (hydrochloric acid) into the furnace by using carrier gas containing H$_2$ gas as a main component.

Among the gas introduced into the epitaxial furnace, the HCl gas has low etching characteristics with respect to silicon crystal and is capable of preventing polycrystalline silicon from being deposited on the buried insulating film 3. However, since the etching power of the HCl gas is not strong enough to prevent the epitaxial film formation of crystalline silicon formed continuously from the crystal (substrate 2A) below the opening part 5, selective epitaxial film formation from the opening part 5 can be carried out.

In the above-described epitaxial film formation step of the n$^-$ type single-crystal silicon film 4A, the film formation rate is largely different depending on the crystal plane orientation of the surface of the underlying substrate 2A, in other words, the so-called anisotropy in film formation rate is present. In the second embodiment, since the n$^-$ type single-crystal silicon film 4A is polished by a CMP (Chemical Mechanical Polishing) method in a later step, in order to reduce the load in the CMP step, it is preferable that the n$^-$ type single-crystal silicon film 4A is formed to be thin in the thickness direction of the substrate 2A and to be thick (long) in the direction along the main surface of the substrate 2A. In order to form the n$^-$ type single-crystal silicon film 4A in that manner, the combination of the plane orientation of the main surface of the substrate 2A and the orientation of the stripe pattern formed by the field insulating film 6 in the active regions has to be appropriately selected.

Incidentally, the gate insulating film 10 which is to be formed in a later step is formed on the (100) plane. Therefore, the substrate 2A is presupposed to use a crystal substrate having the (100) plane as the main surface. Due to this presupposition, the direction of the stripe pattern formed by the field insulating film 6 in the active regions is restricted.

Therefore, as an experiment, the inventors of the present invention formed the stripe patterns made by the field insulating film 6 extending in various directions on the substrate 2A having the (100) plane as the main surface and further formed the n$^-$ type single-crystal silicon film 4A by the selective epitaxial film formation, and then examined the direction of the stripe patterns made by the field insulating film 6 on which the n$^-$ type single-crystal silicon film 4A is formed to be thick (long) in the direction along the main surface of the substrate 2A compared with that in the thickness direction of the substrate 2A. As a result, in the second embodiment, the following conditions can be shown as examples.

More specifically, the extending direction of the stripe pattern made by the field insulating film 6 is set to the <010> direction or the <001> direction equivalent to the <010> direction. Herein, for example, the (100) plane represents the crystal plane having the <100> direction as a normal vector, and the <010> direction represents the direction of a vector itself. That is, in the second embodiment, the extending direction of each field insulating film 6 which forms the stripe pattern in the active region of the substrate 2A is set to the <010> direction or the <001> direction. By this means, the film formation thicknesses of the n type single-crystal silicon film 4A in the thickness direction of the substrate 2A and in the direction along the main surface of the substrate 2A can be set to approximately 1:1.

Figure 26:
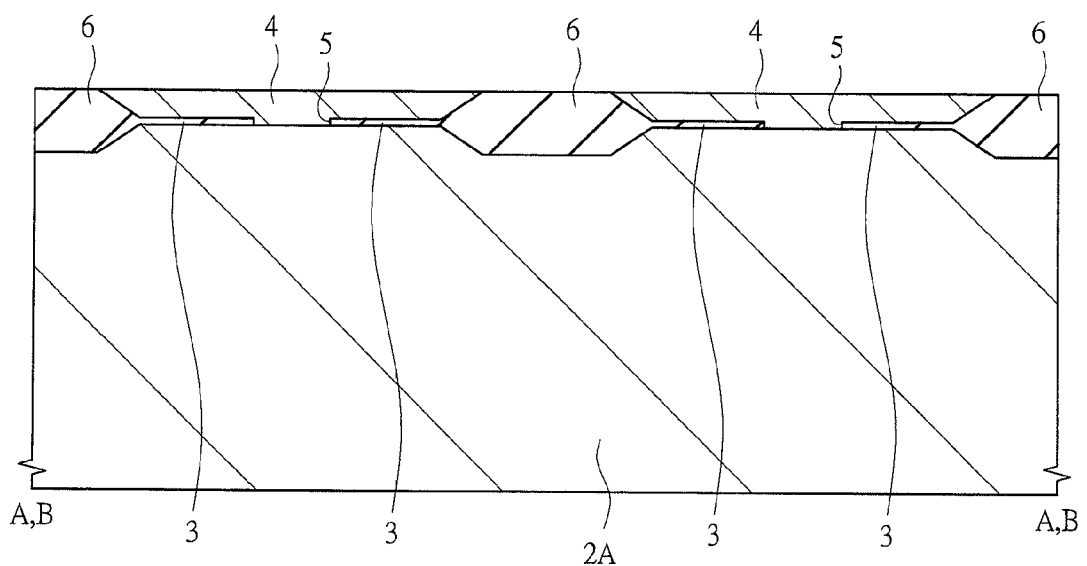
FIG. 26 is a cross-sectional view of the principal part in the manufacturing step of the IGBT continued from FIG. 25.

Next, as shown in FIG. 26, the n$^-$ type single-crystal silicon film 4A is polished by the CMP method using the field insulating film 6 as a stopper (polishing end point), thereby forming the surface semiconductor layers 4 whose thicknesses are defined by the level difference in the field insulating film 6.

In the above-described first embodiment, the thickness t of the surface semiconductor layer 4 is set to about 20 nm to 40 nm. However, since the surface of the surface semiconductor layer 4 is sacrificed by a predetermined thickness in the later step of forming the gate insulating film 10, the thickness of the surface semiconductor layer 4 has to be defined in this step in consideration of the amount of thickness (including the thickness of the gate insulating film 10 itself) sacrificed in the step of forming the gate insulating film 10.

More specifically, in the step of forming the gate insulating film 10, before forming the gate insulating film 10 itself, in order to remove foreign matters and others adhering to the surface of the surface semiconductor layer 4, a sacrifice oxide film is formed on the surface of the surface semiconductor layer 4 by thermal oxidation treatment of the substrate 2A, and after the sacrifice oxide layer is removed, the gate insulating film 10 is formed on the surface of the surface semiconductor layer 4 by another thermal oxidation treatment of the substrate 2A. Therefore, the thickness of the surface semiconductor layer 4 that remains after the above-described CMP step has to be defined with taking into consideration that the thickness of the surface semiconductor layer 4 corresponding to the thicknesses of the sacrifice oxide film and the gate insulating film 10 is lost.

For example, since the thickness of the gate insulating film 10 of the IGBT is about 100 nm, in the second embodiment, the thickness of about 100 nm to 300 nm, more preferably about 120 nm to 200 nm can be shown as the example of the thickness of the surface semiconductor layer 4 that remains after the CMP step. Furthermore, since the thickness of the surface semiconductor layer 4 that remains after the CMP step is determined by the level difference in the field insulating film 6, it goes without saying that the field insulating film 6 has to be formed so that the thickness of the surface semiconductor layer 4 that remains after the CMP step has such a value.

Next, the above-described sacrifice oxide film (not shown) is formed on the surface of the surface semiconductor layer 4 by performing the thermal treatment to the substrate 2A. The sacrifice oxide film is formed not only on the surface of the surface semiconductor layer 4, but also on the exposed surface of the substrate 2A (p type wells 12A).

Figure 27:
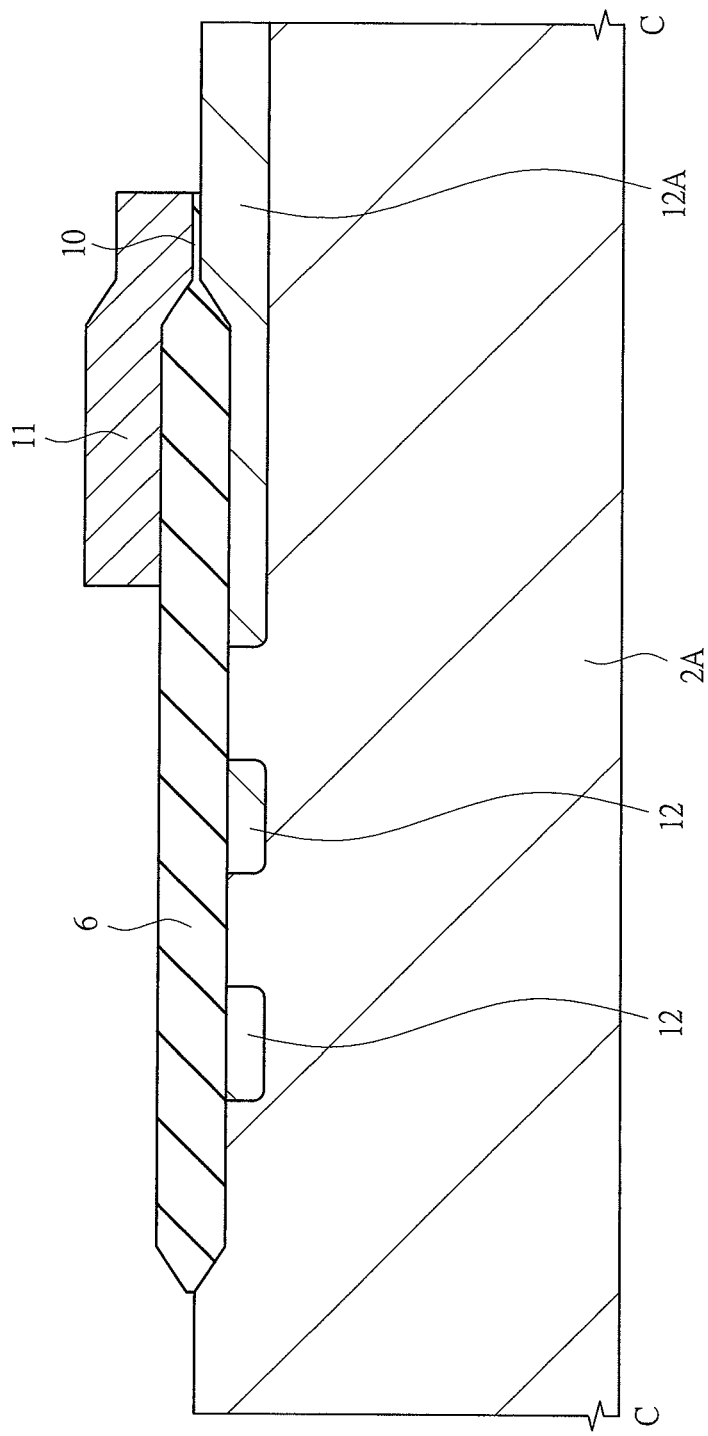
FIG. 27 is a cross-sectional view of the principal part in the manufacturing step of the IGBT of the second embodiment of the present invention.
Figure 28:
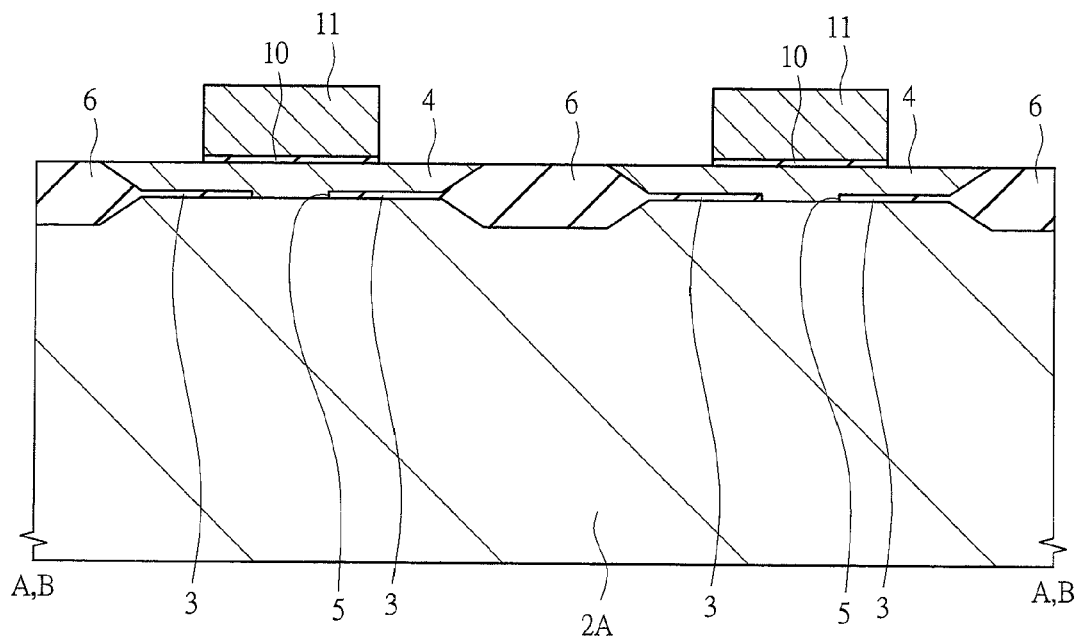
FIG. 28 is a cross-sectional view of the principal part in the manufacturing step of the IGBT continued from FIG. 26.

Next, as shown in FIG. 27 and FIG. 28, the sacrifice oxide film is removed by cleaning the substrate 2A, thereby obtaining clean surfaces of the surface semiconductor layer 4 and the substrate 2A (p type wells 12A). Subsequently, the substrate 2A is subjected to thermal treatment, thereby forming the gate insulating film 10 having a thickness of about 100 nm on the surfaces of the surface semiconductor layer 4 and the substrate 2A (p type wells 12A). Subsequently, a polycrystalline silicon film is deposited on the substrate 2A, and the polycrystalline silicon film is patterned by the etching using a photoresist film patterned by the photolithography technology as a mask. By this means, the gate electrode 11 is formed.

Figure 29:
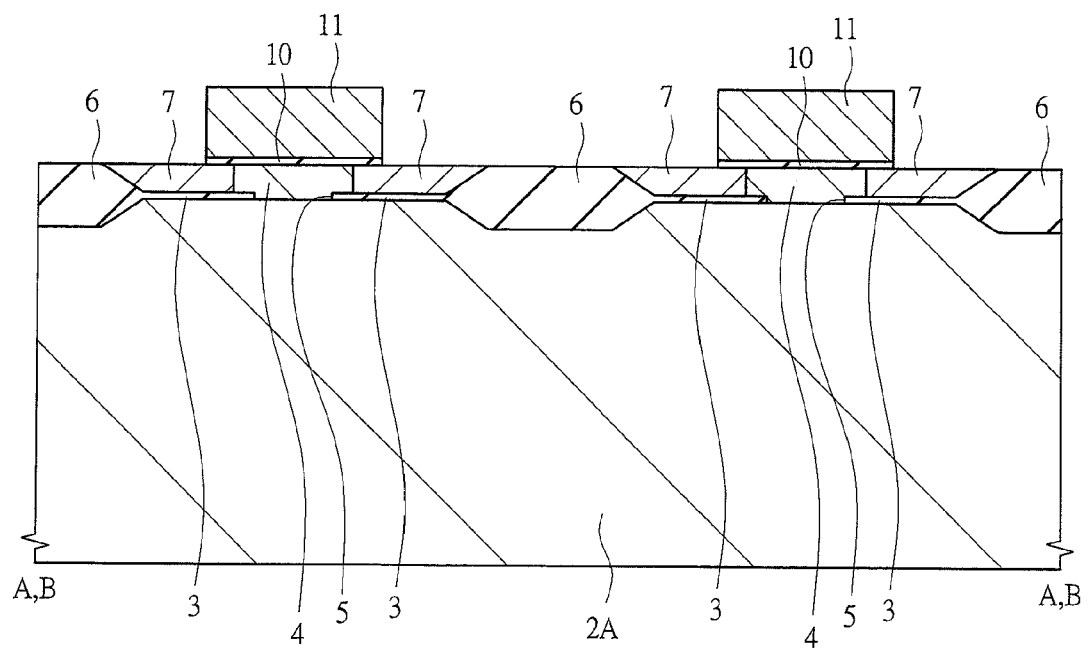
FIG. 29 is a cross-sectional view of the principal part in the manufacturing step of the IGBT continued from FIG. 28.

Next, as shown in FIG. 29, an impurity of p type conductivity (for example, B) is introduced into the surface semiconductor layer 4 in the presence of the gate electrode 11. Then, the substrate 2A is subjected to thermal treatment, thereby diffusing the impurity of p type conductivity and forming the p type channel forming layer 7.

Figure 30:
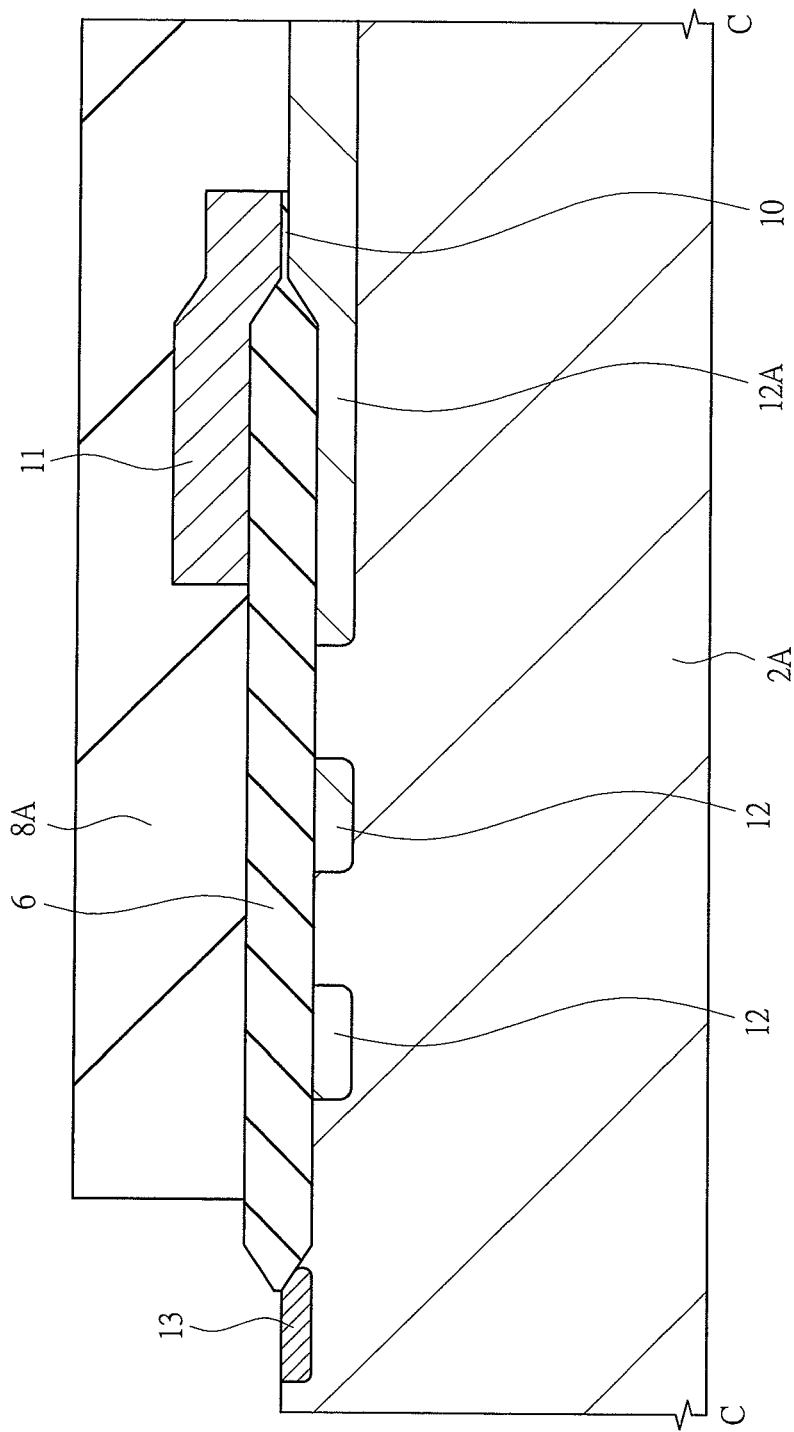
FIG. 30 is a cross-sectional view of the principal part in the manufacturing step of the IGBT of the second embodiment of the present invention.
Figure 31:
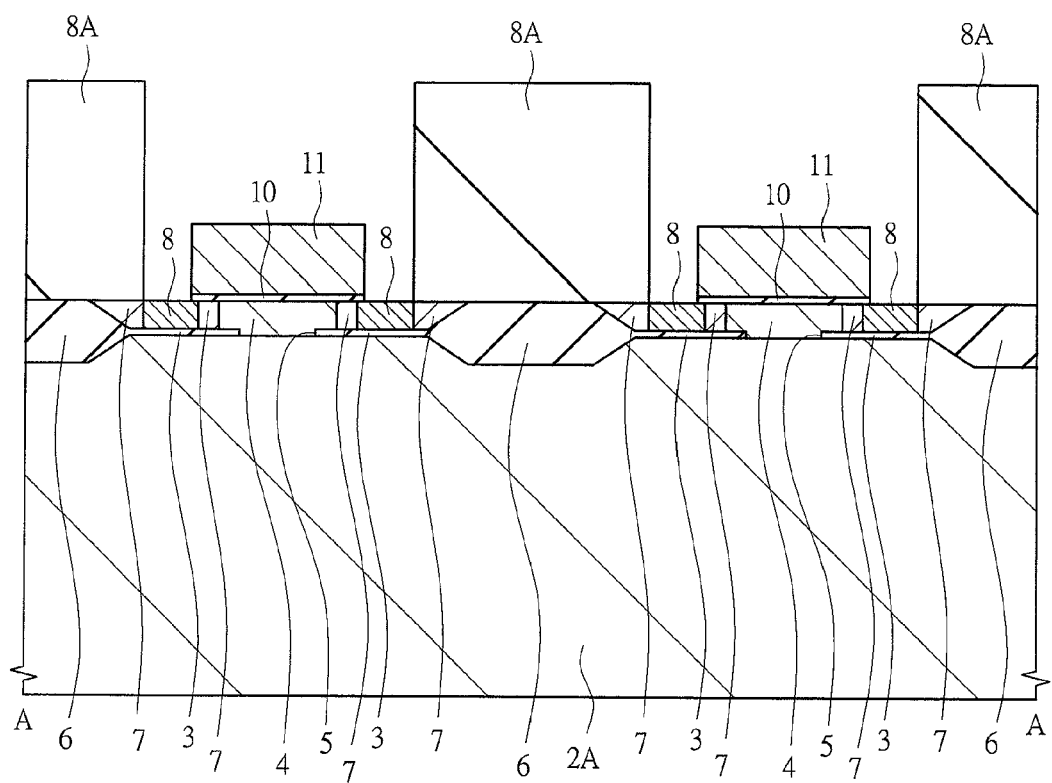
FIG. 31 is a cross-sectional view of the principal part in the manufacturing step of the IGBT of the second embodiment of the present invention.

Next, as shown in FIG. 30 and FIG. 31, an impurity of n type conductivity (for example, As (arsenic) or P (phosphorous)) is introduced into the p type channel forming layer 7 and the substrate 2A with using a photoresist film 8A patterned by the photolithography technology as a mask. Then, the substrate 2A is subjected to thermal treatment, thereby diffusing the impurity of n type conductivity and forming the $n^+$ type source layer 8 and the n type guard ring region 13.

Figure 32:
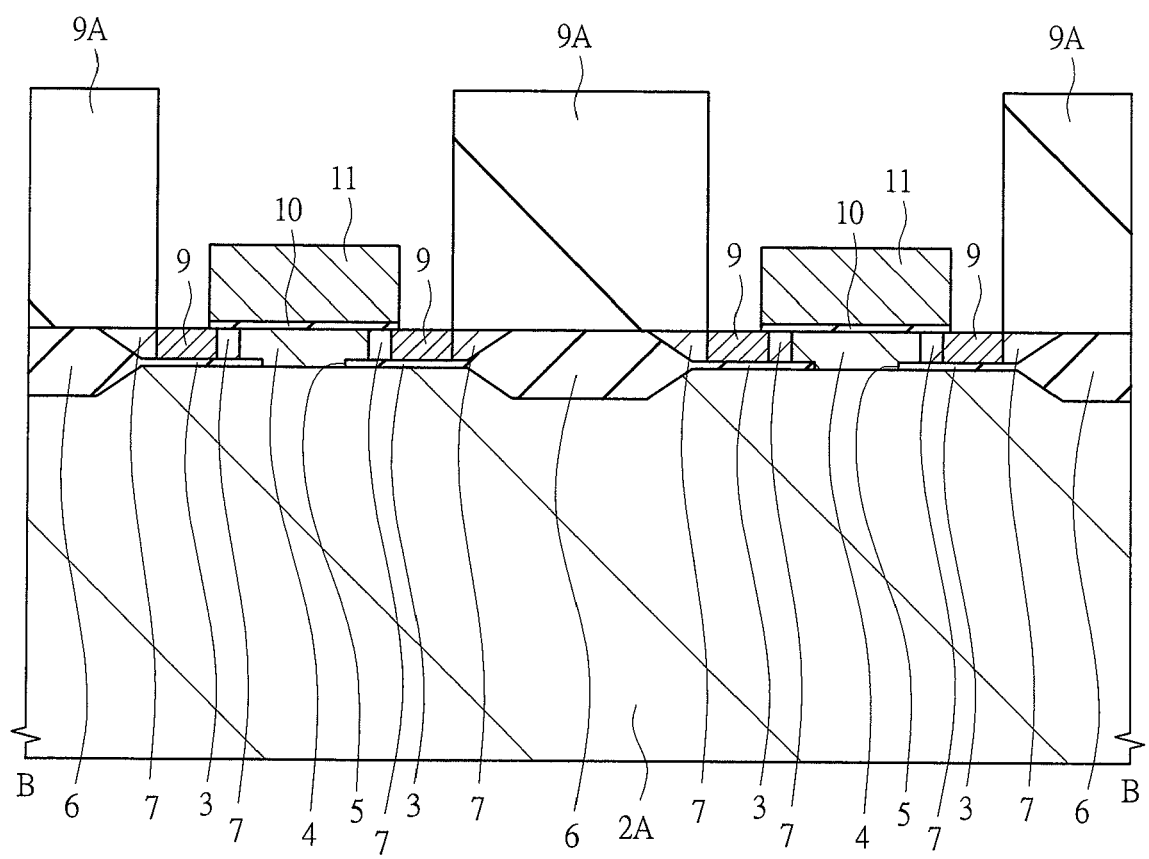
FIG. 32 is a cross-sectional view of the principal part in the manufacturing step of the IGBT of the second embodiment of the present invention.

Next, as shown in FIG. 32, an impurity of p type conductivity (for example, B) is introduced into the p type channel forming layer 7 with using a photoresist film 9A patterned by the photolithography technology as a mask. Then, the substrate 2A is subjected to thermal treatment, thereby diffusing the impurity of p type conductivity and forming the $p^+$ type emitter layer 9.

The above-described $n^+$ type source layer 8 and the $p^+$ type emitter layer 9 cannot be formed in the same cross section. Therefore, as shown in FIG. 19, the $n^+$ type source layer 8 and the $p^+$ type emitter layer 9 are alternately disposed in one stripe pattern in a plane. Moreover, in order to reduce the stress that acts in the vicinity of the end portion (bird's beak) of the field insulating film 6, the $p^+$ type emitter layer 9 is formed so that the p type channel forming layer 7 remains between the $p^+$ type emitter layer 9 and the field insulating film 6, and a p type region having a lower impurity concentration than that of the $p^+$ type emitter layer 9 is formed between the $p^+$ type emitter layer 9 and the field insulating film 6.

An IGBT element of the second embodiment can be formed by the steps described above.

Figure 33:
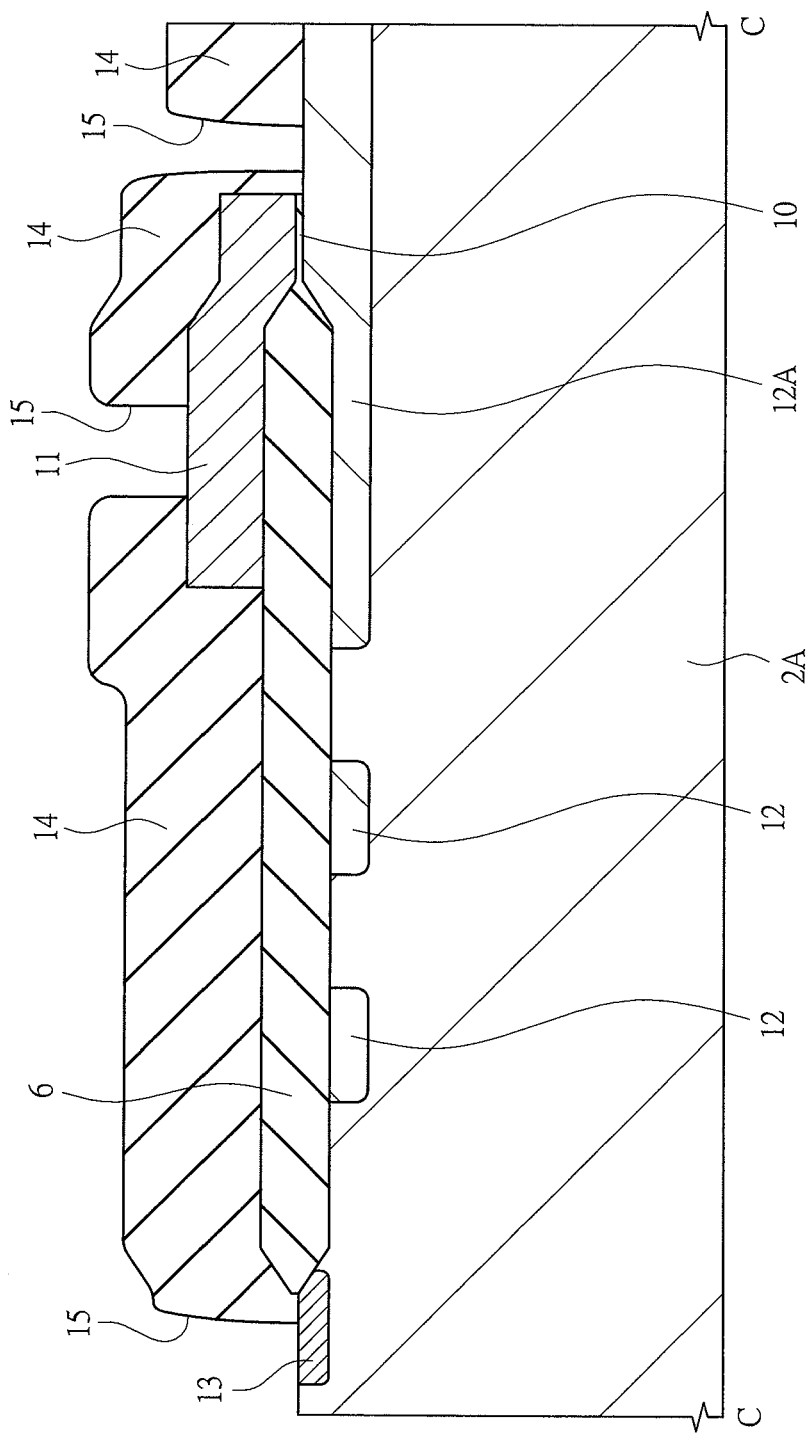
FIG. 33 is a cross-sectional view of the principal part in the manufacturing step of the IGBT continued from FIG. 30.
Figure 34:
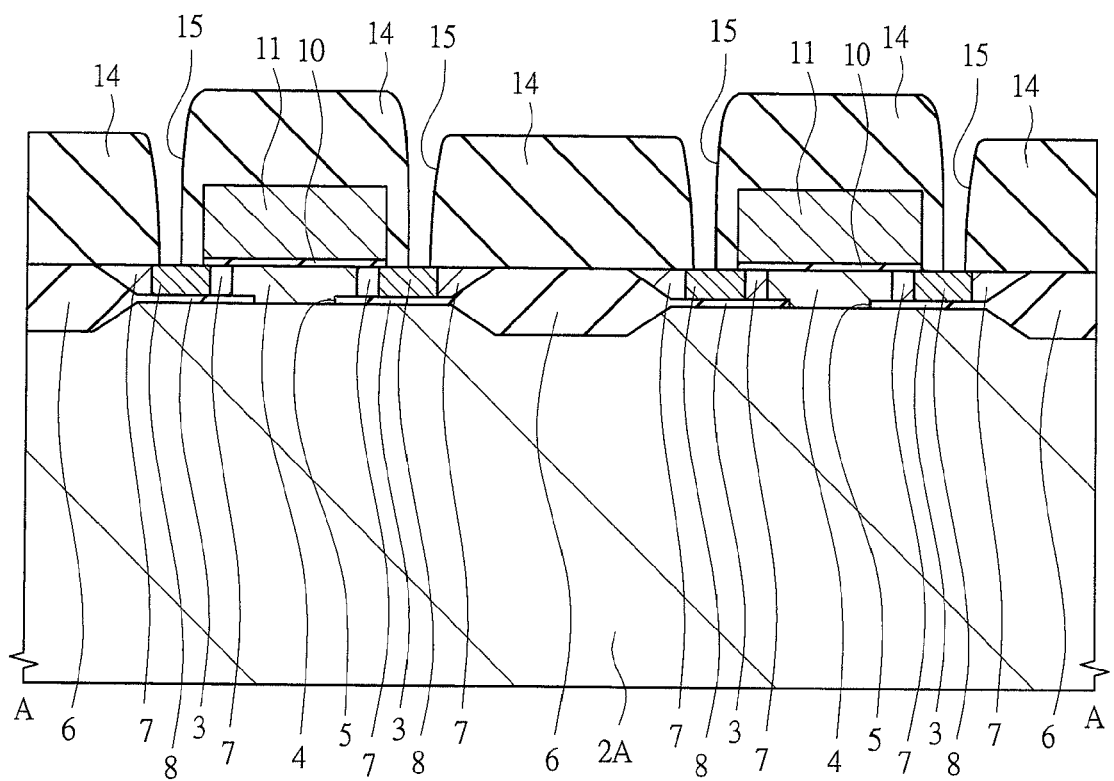
FIG. 34 is a cross-sectional view of the principal part in the manufacturing step of the IGBT continued from FIG. 31.
Figure 35:
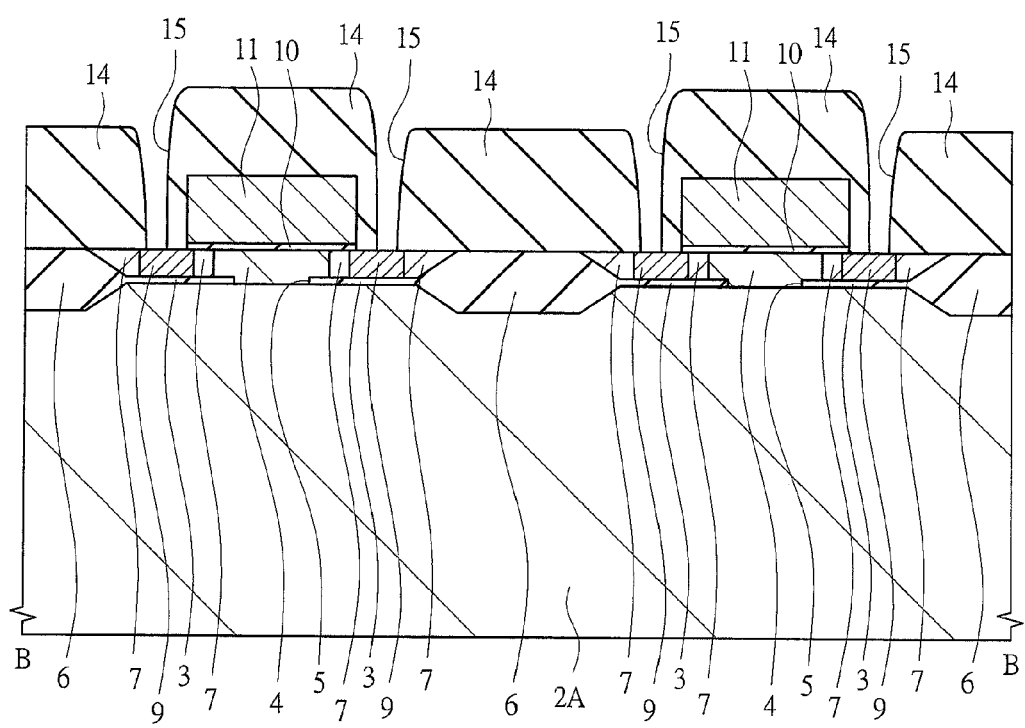
FIG. 35 is a cross-sectional view of the principal part in the manufacturing step of the IGBT continued from FIG. 32.

Next, as shown in FIG. 33 to FIG. 35, the insulating film 14 made of, for example, a PSG film is deposited on the main surface of the substrate 2A. Subsequently, the insulating film 14 is etched with using a photoresist film patterned by the photolithography technology as a mask, thereby forming the opening parts 15 which reach the $n^+$ type source layer 8, the $p^+$ type emitter layer 9, the gate electrode 11, the p type well 12 and the n type guard ring 13, respectively.

Figure 36:
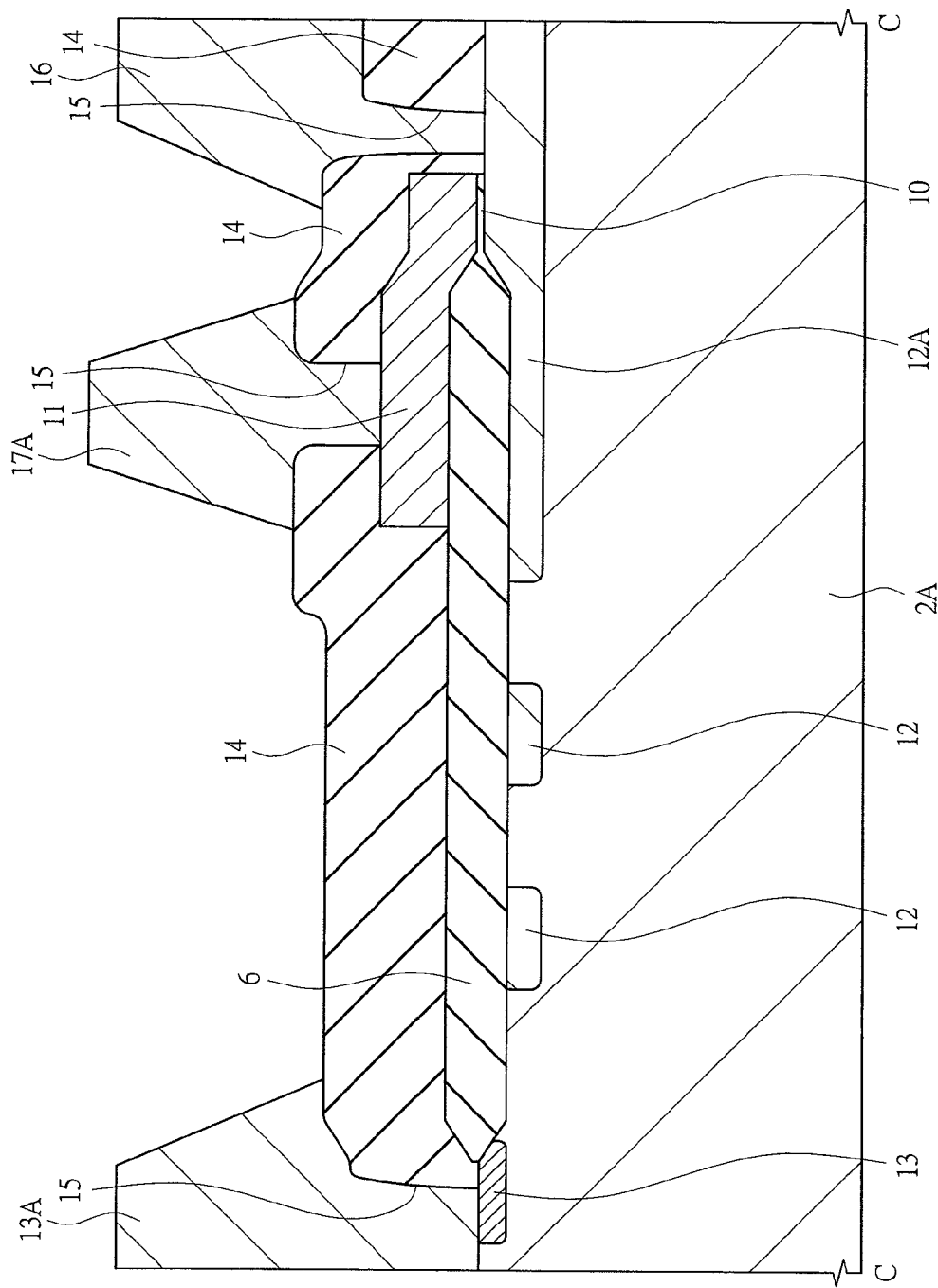
FIG. 36 is a cross-sectional view of the principal part in the manufacturing step of the IGBT continued from FIG. 33.
Figure 37:
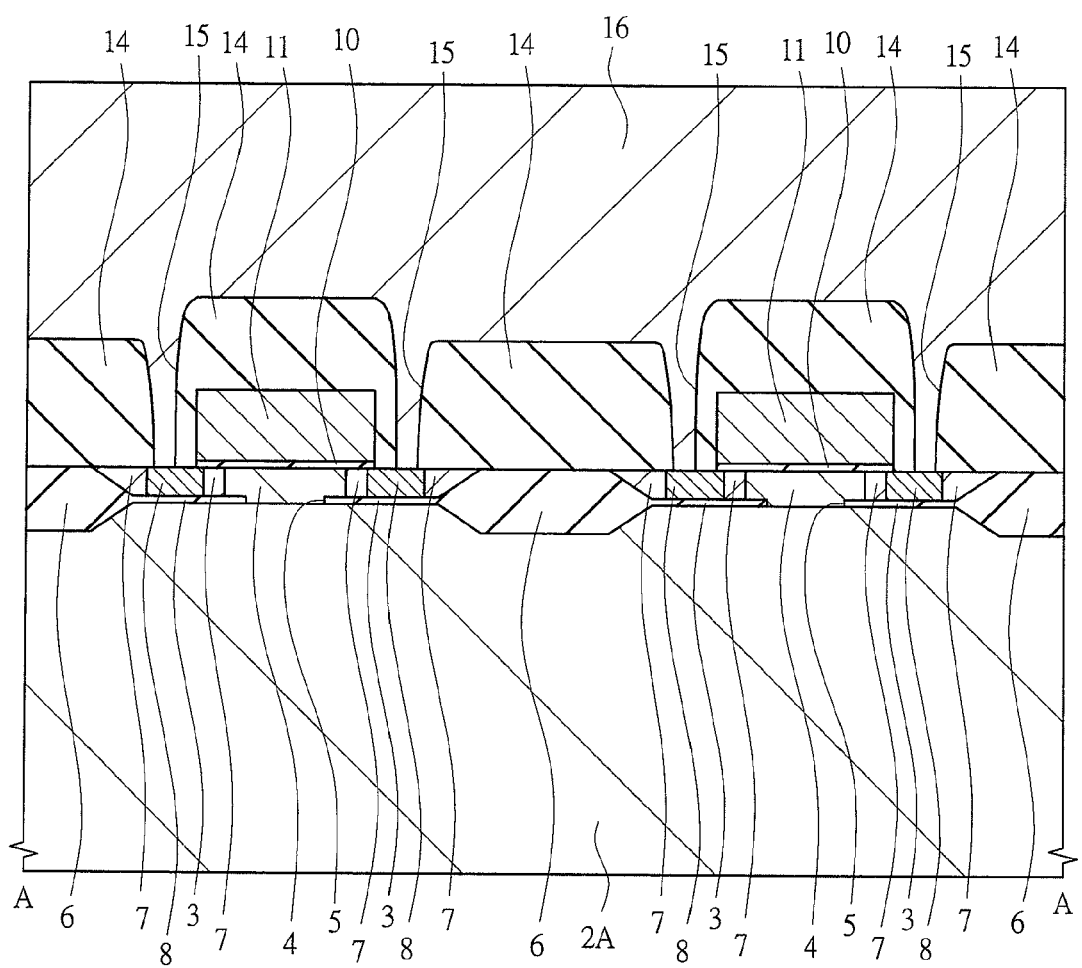
FIG. 37 is a cross-sectional view of the principal part in the manufacturing step of the IGBT continued from FIG. 34.
Figure 38:
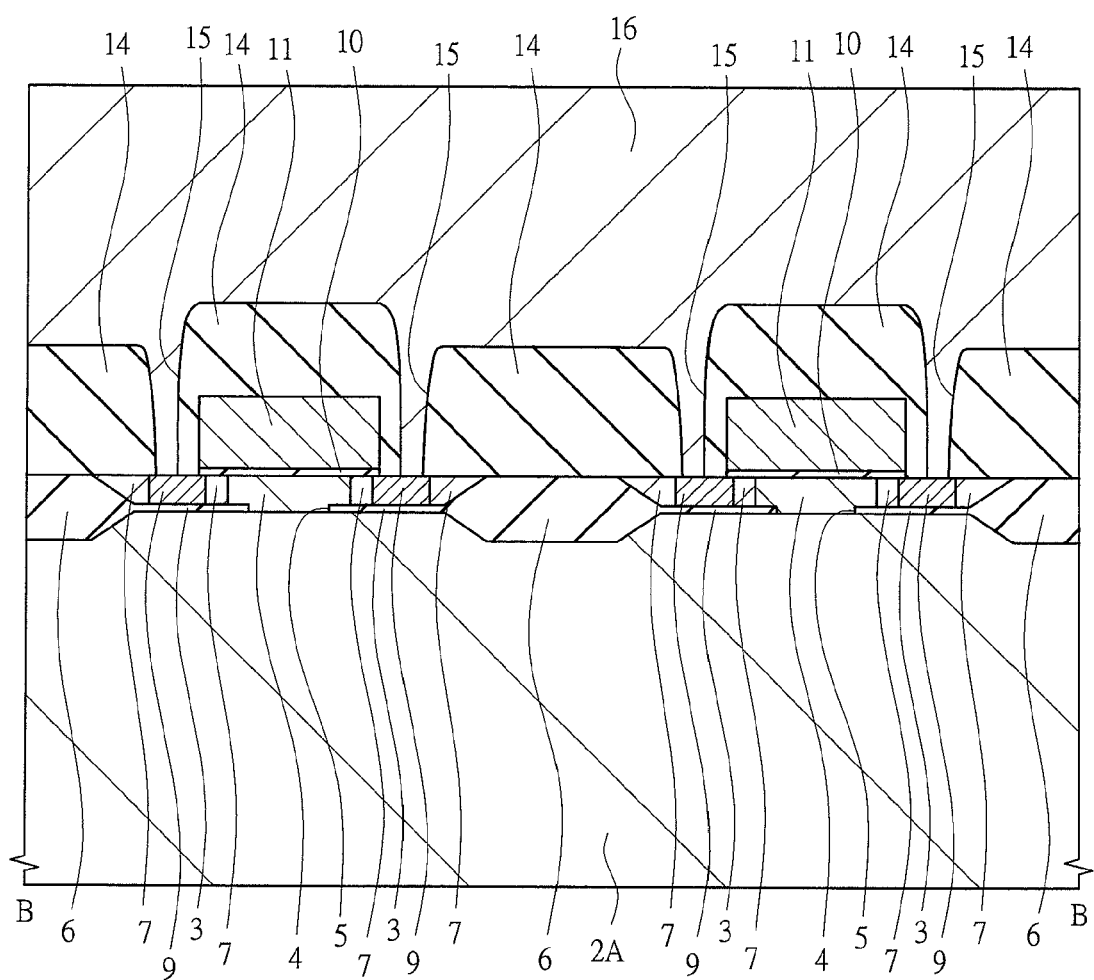
FIG. 38 is a cross-sectional view of the principal part in the manufacturing step of the IGBT continued from FIG. 35.

Next, as shown in FIG. 36 to FIG. 38, an Al (aluminum) film is deposited on the main surface of the substrate 2A by, for example, a sputtering method. Then, the Al film is etched with using a photoresist film patterned by the photolithography technology as a mask, thereby forming the emitter pad 16 electrically connected to the $n^+$ type source layer 8 and the $p^+$ type emitter layer 9, the gate pad 17 (see FIG. 19) electrically connected to the gate electrode 10, the gate finger 17A electrically connected to the gate electrode 10 and having a pattern (see FIG. 19) continued to the gate pad 17, and the guard ring electrode 13A electrically connected to the n type guard ring region 13.

Although omitted in the drawings, a polyimide film is deposited as a surface protective film on the main surface of the substrate 2A after the emitter pad 16, the gate pad 17, the gate finger 17A and the guard ring electrode 13A are formed. Then, opening parts which reach the emitter pad 16 and the gate pad 17 are formed in the polyimide film over the emitter pad 16 and over the gate pad 17. These opening parts are formed for electrically connecting the emitter pad 16 and the gate pad 17 to the corresponding leads, respectively, by using bonding wires after the substrate 2A is divided into individual chips 1 (see FIG. 19) and each chip 1 is mounted on a die pad of a lead frame.

Figure 39:
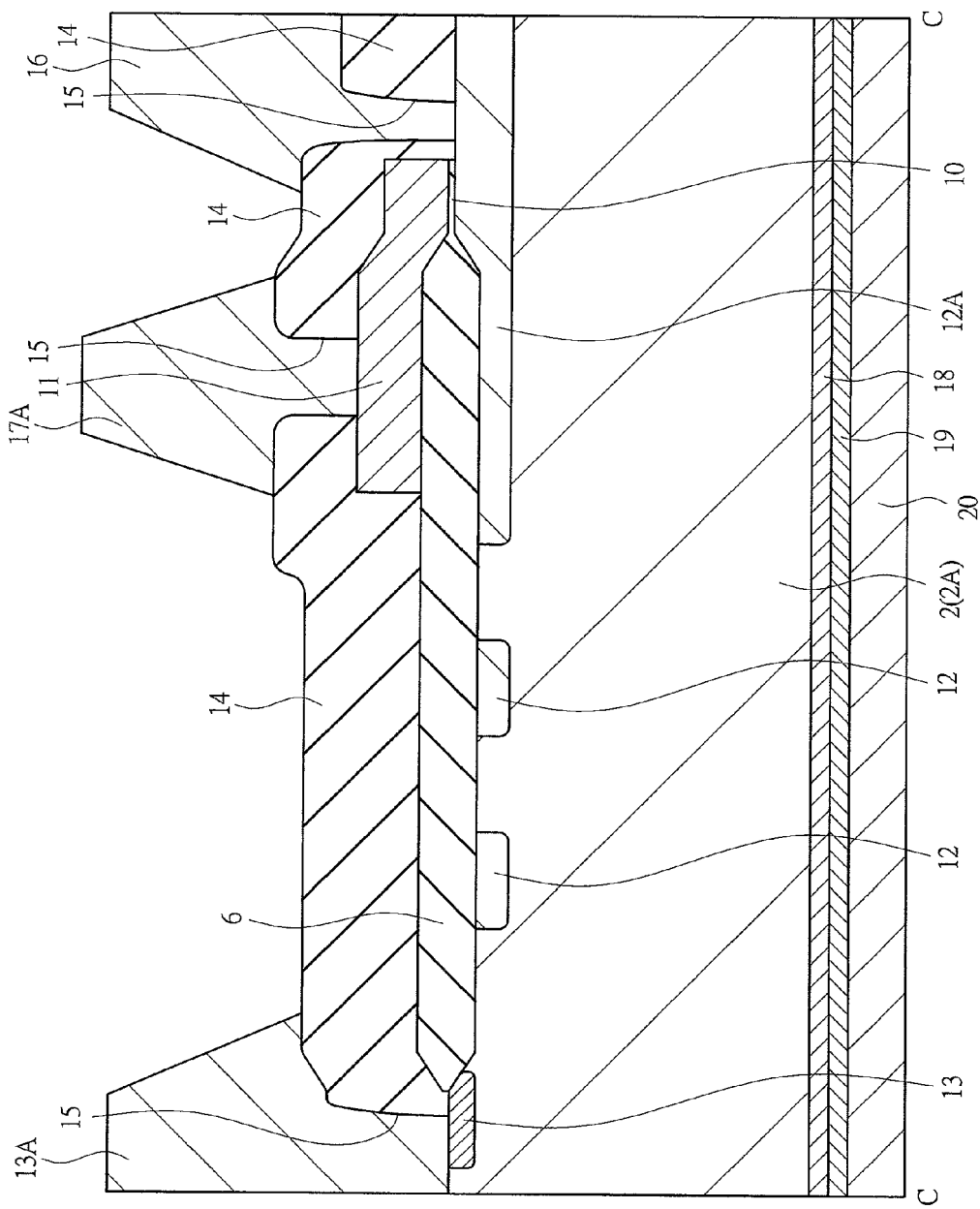
FIG. 39 is a cross-sectional view of the principal part in the manufacturing step of the IGBT continued from FIG. 36.
Figure 40:
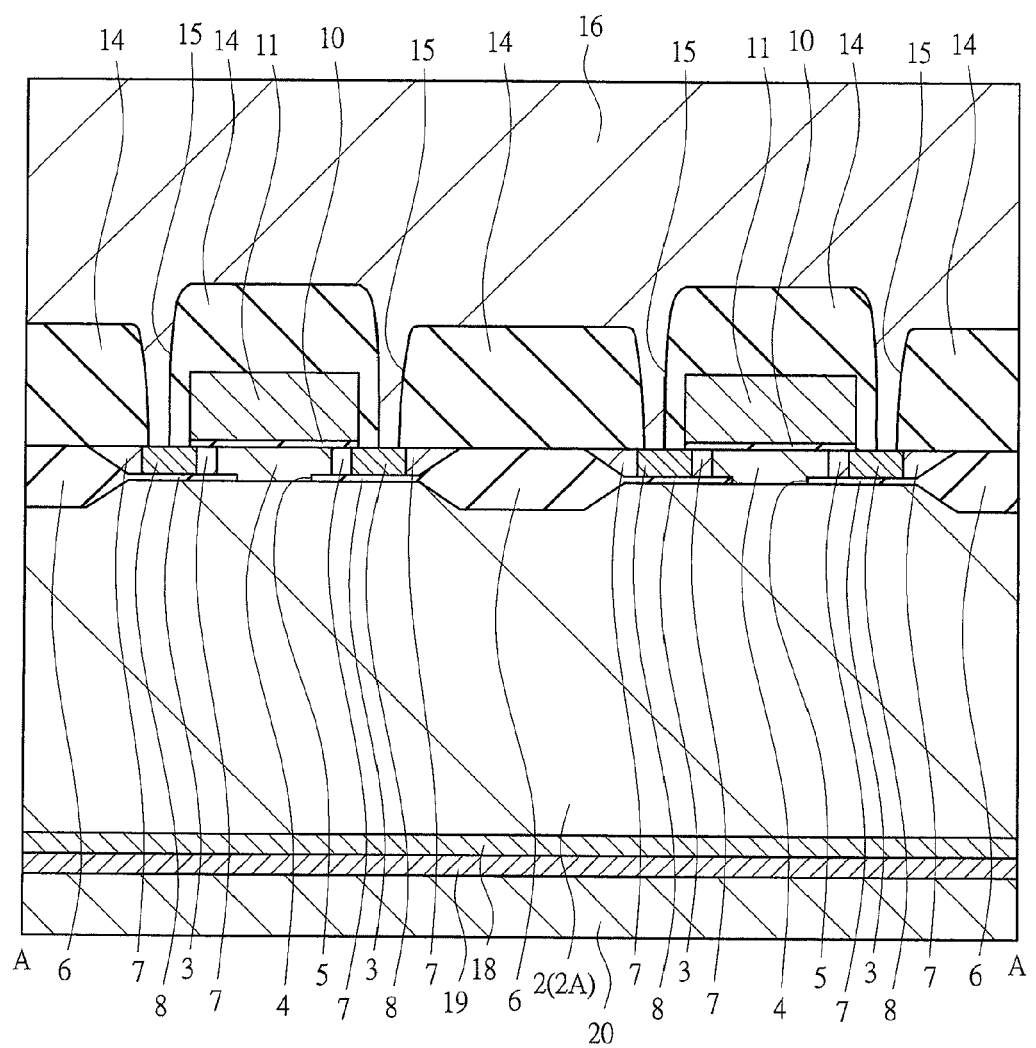
FIG. 40 is a cross-sectional view of the principal part in the manufacturing step of the IGBT continued from FIG. 37.
Figure 41:
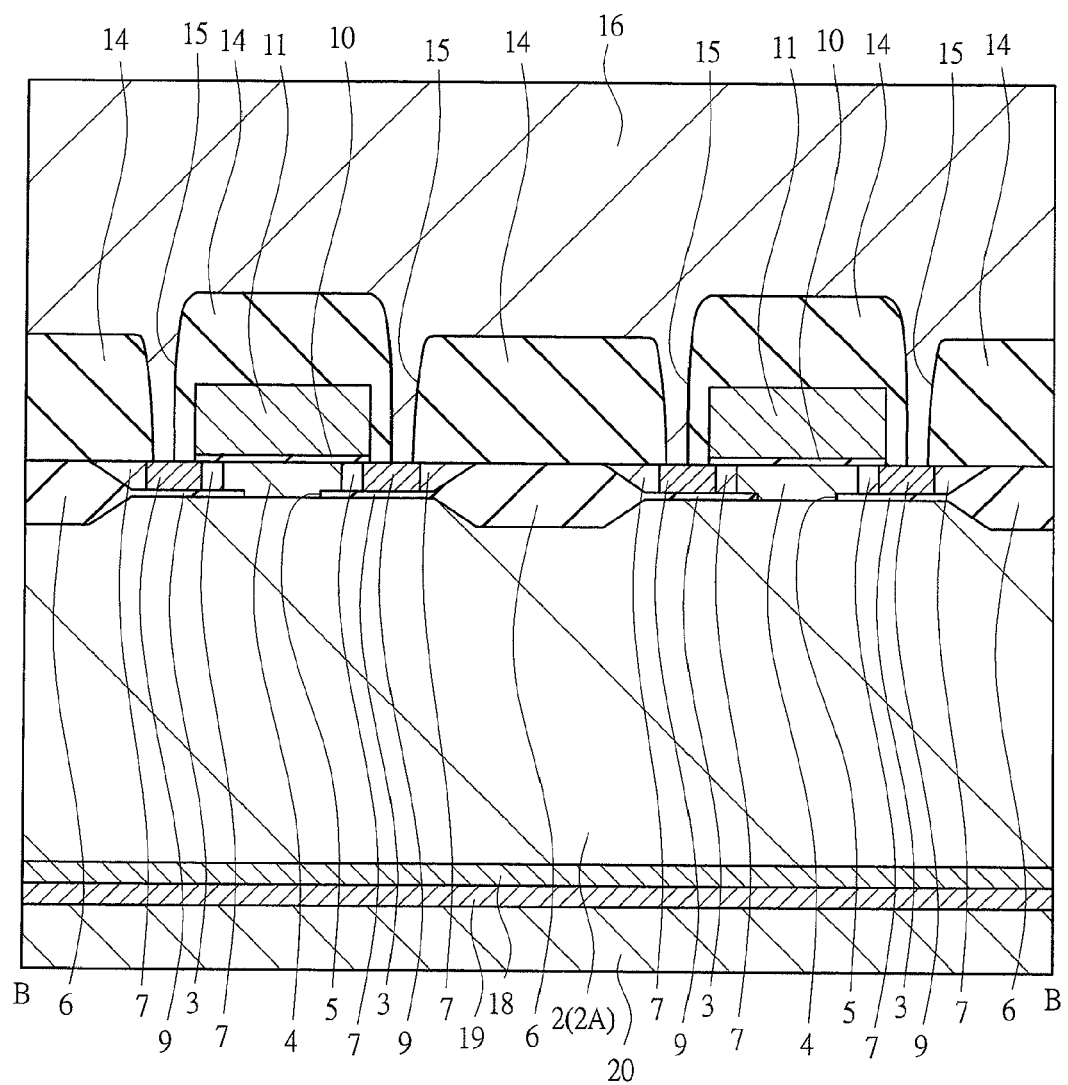
FIG. 41 is a cross-sectional view of the principal part in the manufacturing step of the IGBT continued from FIG. 38.

Next, as shown in FIG. 39 to FIG. 41, the rear surface of the substrate 2A is ground, thereby forming the base layer 2. As described in the first embodiment, the thickness of the base layer 2 is determined in accordance with the breakdown voltage of the IGBT, and the rear surface of the substrate 2A is ground until the thickness becomes about 60 μm to 100 μm if the breakdown voltage is 600 V and it is ground until the thickness becomes about 120 μm to 150 μm if the breakdown voltage is 1200 V. Subsequently, P and B are sequentially introduced into the rear surface of the base layer 2 (substrate 2A), thereby forming the $n^+$ type buffer layer 18 and the p type collector layer 19.

Next, the collector electrode 20 is formed on the rear surface of the base layer 2 (substrate 2A). The collector electrode 20 can be formed by stacking an Al film, a Ti film, a Ni film and an Au film in this order from the side close to the p type collector layer 19 by, for example, a sputtering method or a vapor deposition method. Alternatively, the collector electrode 20 in which an Ni film, a Ti film, a Ni film and an Au film are stacked in this order from the side close to the p type collector layer 19 or the collector electrode 20 in which a Ti film, a Ni film and an Au film are stacked in this order from the side close to the p type collector layer 19 may be employed.

Next, the substrate 2A is cut along dividing regions (dicing lines), thereby dividing the substrate into the pieces of individual chips 1 (see FIG. 19). Subsequently, after a lead frame is prepared and each piece of the chip 1 is mounted on a die pad of the lead frame, the emitter pad 16 and the gate pad 17 are electrically connected to the corresponding leads by using bonding wires. Then, the chip 1, the lead frame and the bonding wires are sealed by a sealing resin, thereby manufacturing the semiconductor device of the second embodiment.

Third Embodiment

Figure 42:
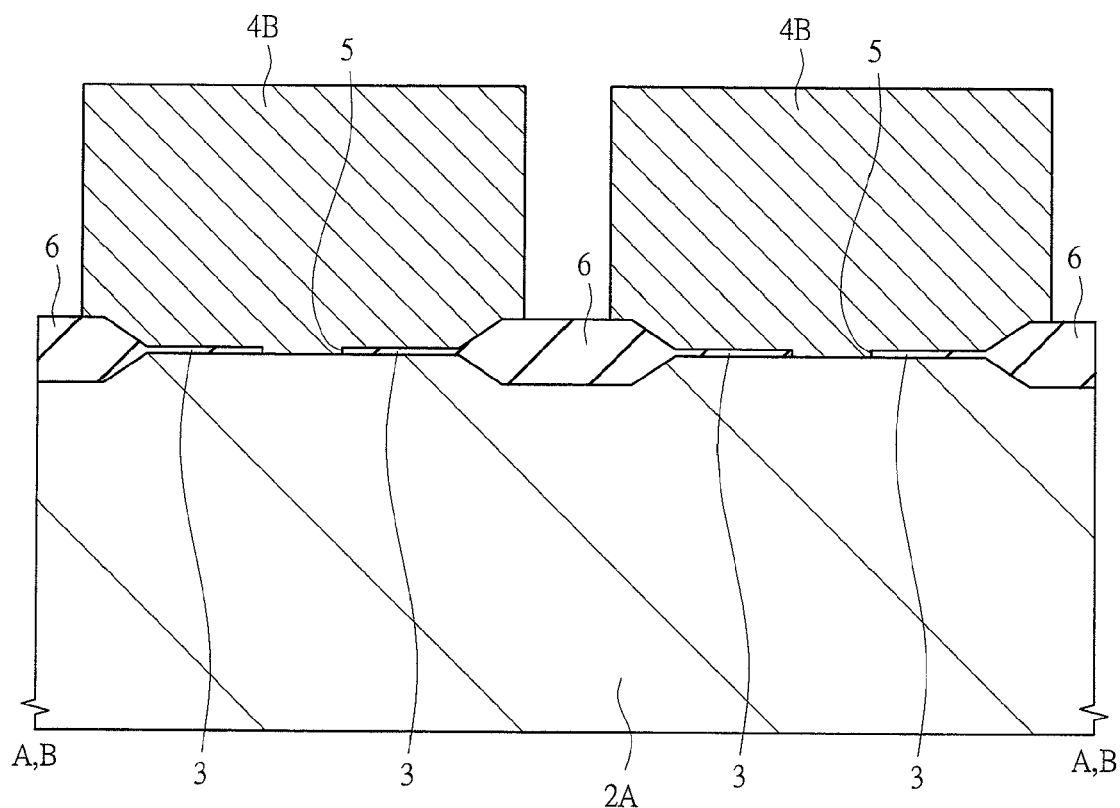
FIG. 42 is a cross-sectional view of the principal part in the manufacturing step of an IGBT which is a semiconductor device of a third embodiment of the present invention.

Next, a manufacturing method of an IGBT of a third embodiment will be described with reference to FIG. 42. Among the manufacturing steps of the IGBT described above in the second embodiment, up to the steps described with reference to FIG. 20 to FIG. 24 are the same in the manufacturing method of the third embodiment.

Next, instead of the n⁻ type single-crystal silicon film 4A shown in the above-described first embodiment, an n type single-crystal silicon film 4B having a higher n type impurity concentration than that of the n⁻ type single-crystal silicon film 4A and the substrate 2A is formed by the epitaxial method so that a silicon crystal is continued in a lattice level from the opening part 5 of the buried insulating film 3.

Then, through the steps described above in the second embodiment with reference to FIG. 26 to FIG. 41, a semiconductor device of the third embodiment is manufactured.

In the IGBT manufactured by the manufacturing method of the third embodiment as described above, the n type impurity concentration in the surface semiconductor layer 4 becomes higher than that of the IGBT of the above-described second embodiment. For example, when the surface semiconductor layer 4 and the p type channel forming layer 7 are formed to be somewhat thicker than desired thicknesses, there is concern that a hole current may flow into the emitter side from the collector side to reduce the switching operation speed of the IGBT. However, according to the third embodiment, since the n type impurity concentration in the surface semiconductor layer 4 is higher than that of the above-described second embodiment, the hole current can be suppressed by the surface semiconductor layer 4. In other words, according to the third embodiment, even when the thickness of the surface semiconductor layer 4 becomes unintentionally larger than a desired thickness, the IGBT having desired characteristics can be obtained.

The effects similar to those of the above-described second embodiment can be obtained also by the third embodiment described above.

Fourth Embodiment

Next, a manufacturing method of an IGBT of a fourth embodiment will be described with reference to FIG. 43 and FIG. 44. Among the manufacturing steps of the IGBT described above in the second embodiment, up to the steps described with reference to FIG. 20 to FIG. 24 are the same in the manufacturing method of the fourth embodiment.

Figure 43:
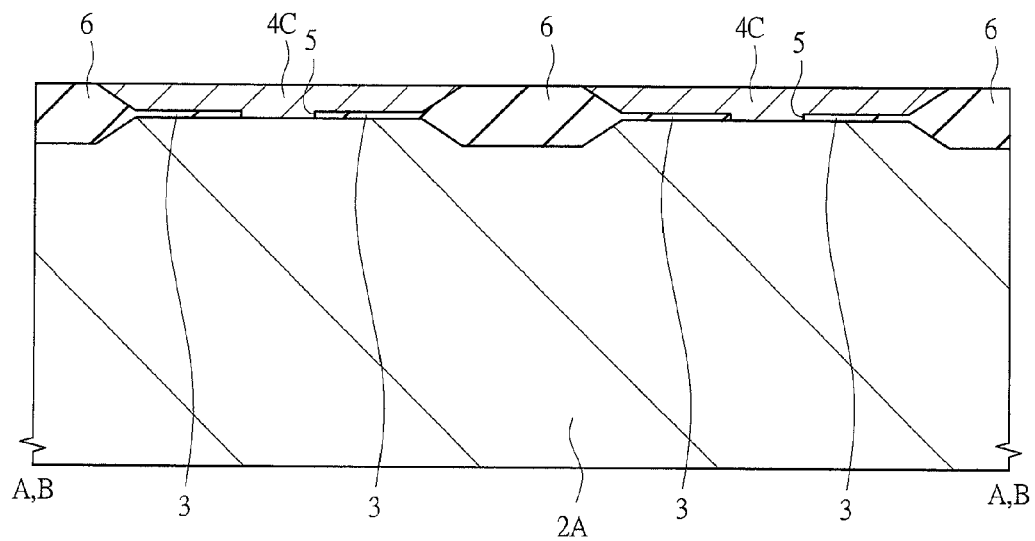
FIG. 43 is a cross-sectional view of the principal part in the manufacturing step of an IGBT which is a semiconductor device of a fourth embodiment of the present invention.

Next, as shown in FIG. 43, instead of the n⁻ type single crystal silicon film 4A shown in the above-described second embodiment, a p type single-crystal silicon film doped with an impurity of p type conductivity is formed by the epitaxial method so that a silicon crystal is continued in a lattice level from the opening part 5 of the buried insulating film 3. At this point, the concentration of the doped p type impurity is controlled to be optimum for determining a threshold voltage by a channel forming layer of the IGBT of the fourth embodiment. Subsequently, the p type single-crystal silicon film is polished by the CMP method using the field insulating film 6 as a stopper (polishing end point), thereby forming the p type channel forming layer 7A whose thickness is defined by the level difference of the field insulating film 6.

Figure 44:
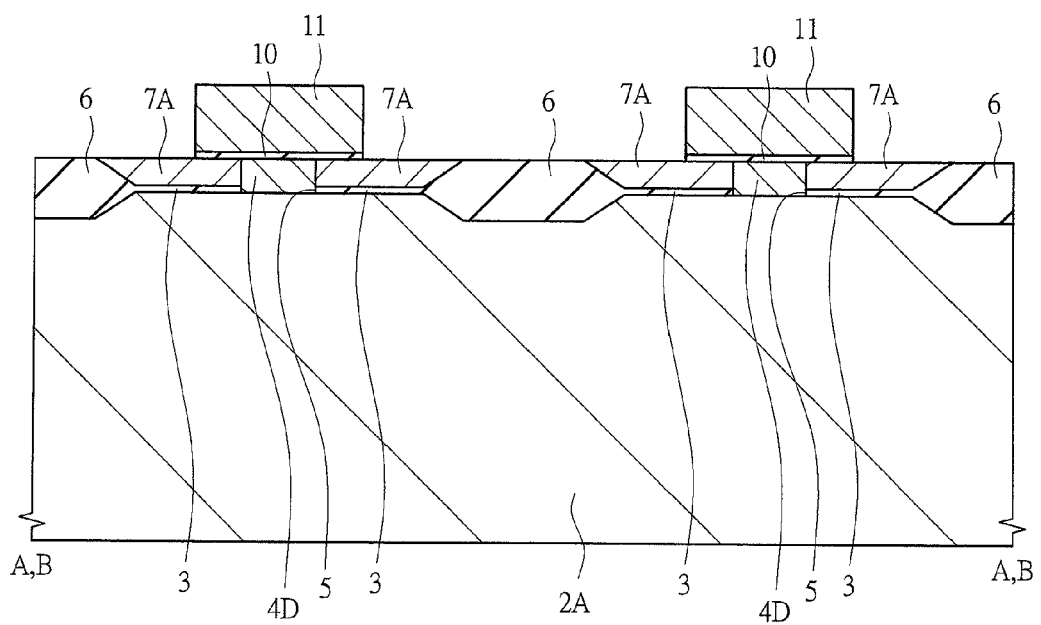
FIG. 44 is a cross-sectional view of the principal part in the manufacturing step of the IGBT continued from FIG. 43.

Next, as shown in FIG. 44, an impurity of n type conductivity (for example, P) is introduced into the center part of the p type channel forming layer 7A in the plane, in other words, into the p type channel forming layer 7A over the opening part 5 with using a photoresist film patterned by the photolithography technology as a mask, thereby forming a surface semiconductor layer 4D. The concentration of the n type impurity introduced in this process will be described later together with the reasons thereof.

Next, the gate insulating film 10 and the gate electrode 11 are formed by the steps similar to those described above in the second embodiment with reference to FIG. 27 and FIG. 28. Then, a semiconductor device of the fourth embodiment is manufactured through the steps described above with reference to FIG. 29 to FIG. 41 in the second embodiment.

In the IGBT manufactured by the manufacturing method of the fourth embodiment as described above, the base layer 2 has to be in contact with the n type surface semiconductor layer 4D below the opening part 5 provided in the buried insulating film 3. Therefore, in order to form the n type surface semiconductor layer 4D, an n type impurity having the concentration by which the p type corresponding to the conductivity type of the p type channel forming layer 7A can be cancelled out and changed to the n type has to be introduced. As a result, the impurity concentration in the surface semiconductor layer 4D becomes higher than the impurity concentration in the base layer 2, and the specific resistance of the surface semiconductor layer 4D becomes lower than that of the base layer 2. Moreover, since the concentration of the n type impurity is high in the surface semiconductor layer 4D, the hole current can be suppressed by the surface semiconductor layer 4D like in the above-described third embodiment. In other words, according to the fourth embodiment, like in the above-described third embodiment, the IGBT having desired characteristics can be obtained even when the thickness of the surface semiconductor layer 4D becomes unintentionally larger than a desired thickness.

Furthermore, the surface semiconductor layer 4D is as extremely thin as about 20 nm to 40 nm like in the surface semiconductor layer 4 of the above-described second embodiment. Therefore, when the p type channel forming layer 7 is formed by introducing the p type impurity into the surface semiconductor layer 4 after the formation of the surface semiconductor layer 4 like in the second embodiment, there is concern about troubles. For example, control of the impurity concentration in the p type channel forming layer 7 may become difficult, and variations in the impurity concentration may be increased.

On the other hand, according to the fourth embodiment, variations in the impurity concentration in the p type channel forming layer 7A are determined at the point of the epitaxial film formation of the p type single-crystal silicon film. More specifically, the variations in the impurity concentration are determined by the performance of the epitaxial furnace, and the variations in the impurity concentration can be suppressed compared with the method in which the impurity is introduced by ion implantation. As a result, effects such as the stabilization of threshold voltage of the IGBT of the fourth embodiment can be obtained.

The effects similar to those of the above-described second and third embodiments can be obtained also by the fourth embodiment described above.

Fifth Embodiment

Next, a manufacturing method of an IGBT of a fifth embodiment will be described with reference to FIG. 45 to FIG. 53.

In the manufacturing method of the fifth embodiment, instead of the field insulating film 6 formed by the LOCOS method shown in the above-described first embodiment, an insulating film deposited by, for example, thermal treatment or a CVD (Chemical Vapor Deposition) method is used. The planar pattern of the insulating film is the same as that of the field insulating film 6 shown in FIG. 19 of the above-described second embodiment.

Figure 45:
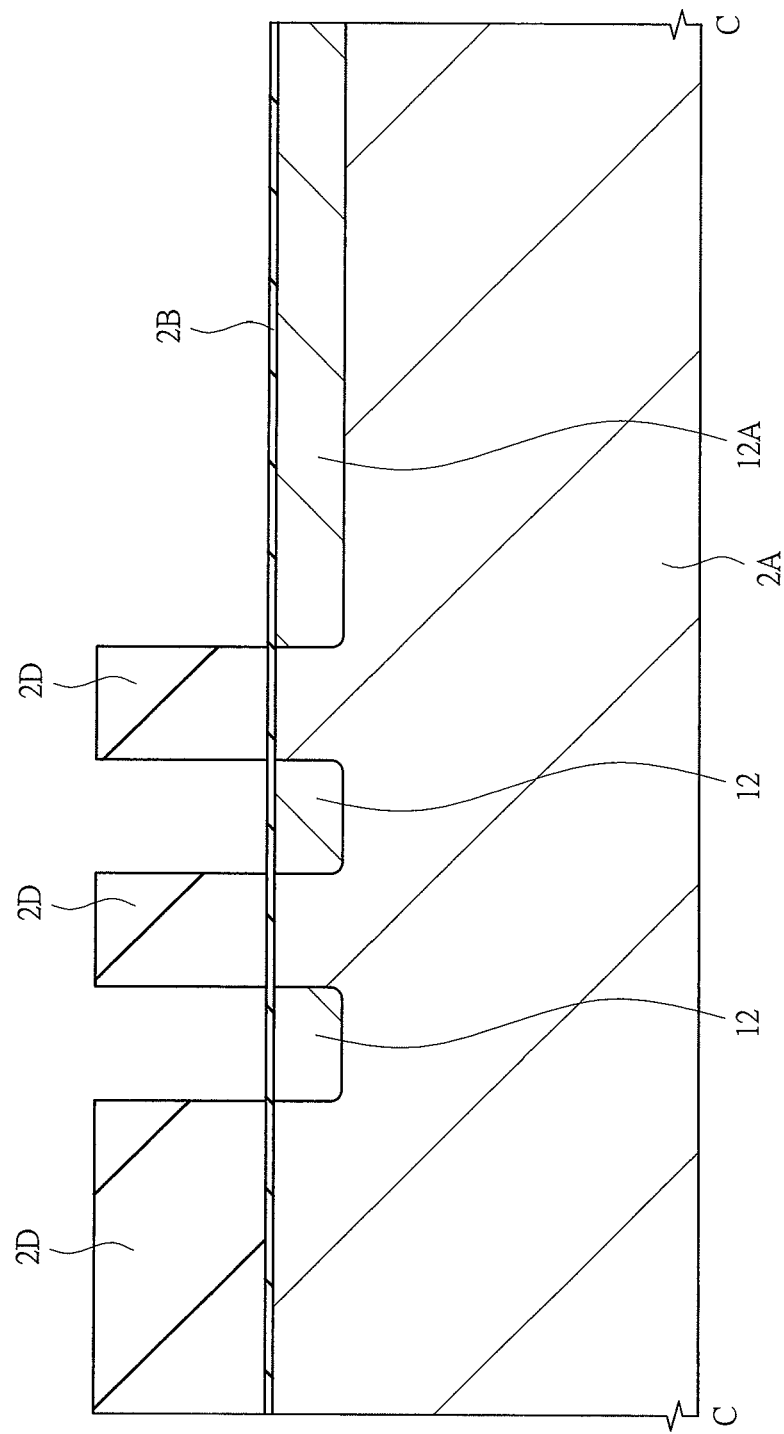
FIG. 45 is a cross-sectional view of the principal part for describing a manufacturing method of an IGBT which is a semiconductor device of a fifth embodiment of the present invention.
Figure 46:
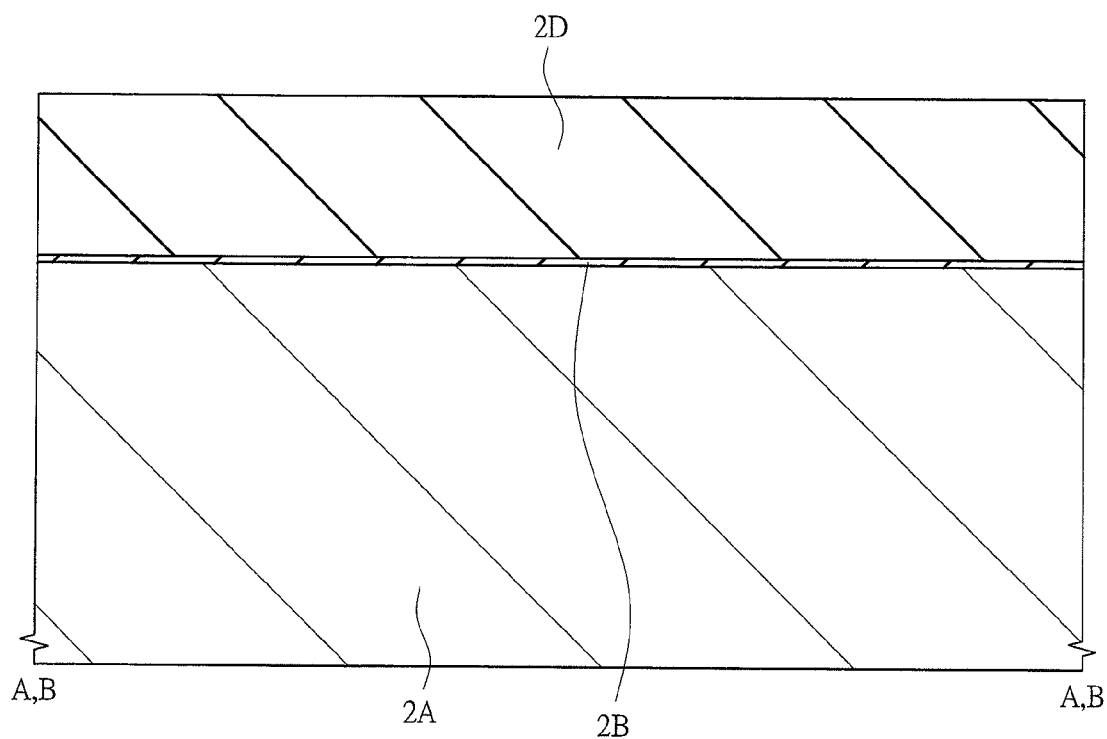
FIG. 46 is a cross-sectional view of the principal part for describing the manufacturing method of the IGBT which is the semiconductor device of the fifth embodiment of the present invention.

First, as shown in FIG. 45 and FIG. 46, the substrate 2A is subjected to thermal treatment, thereby forming the thin silicon oxide film 2B on the main surface of the substrate 2A. Next, an impurity of p type conductivity (for example, B) is introduced into the main surface of the substrate 2A with using a photoresist film 2D patterned by the photolithography technology as a mask, thereby forming the p type filed limiting rings 12 and the p type wells 12 (see also FIG. 19).

Figure 47:
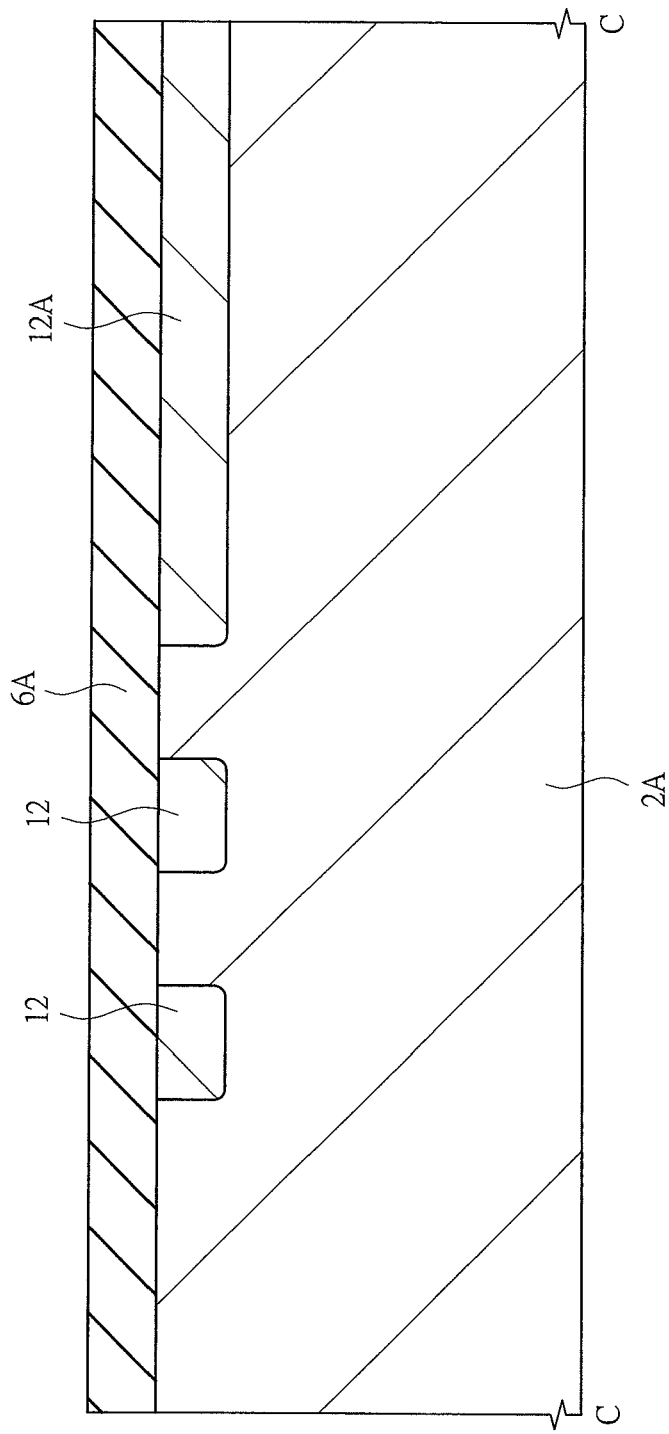
FIG. 47 is a cross-sectional view of the principal part in the manufacturing step of the IGBT continued from FIG. 45.
Figure 48:
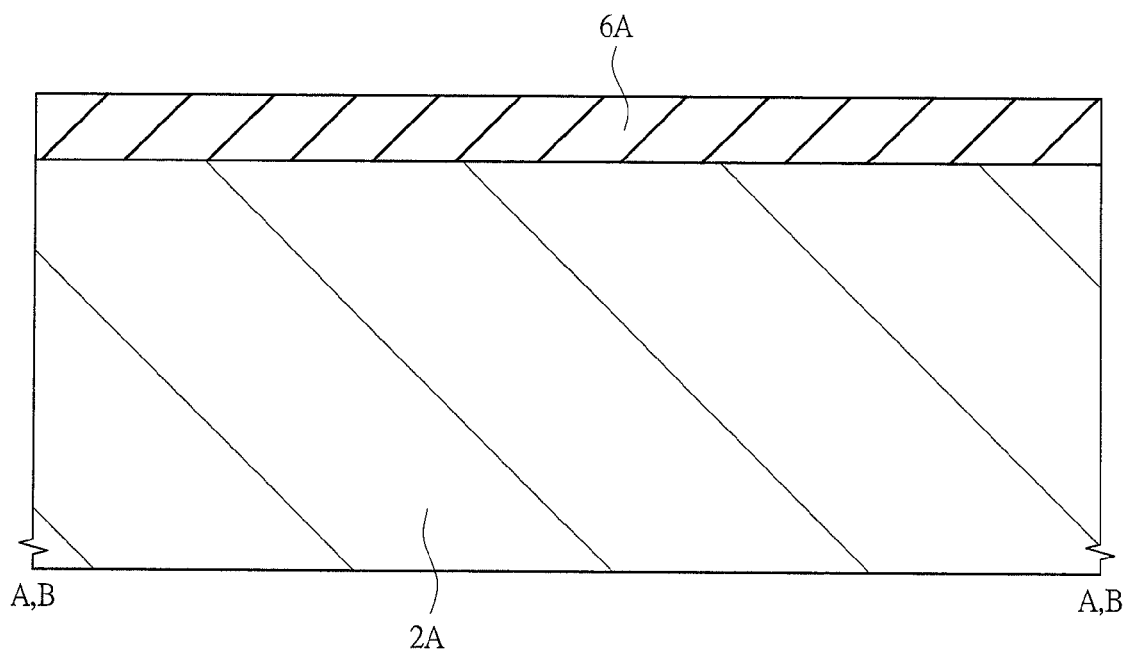
FIG. 48 is a cross-sectional view of the principal part in the manufacturing step of the IGBT continued from FIG. 46.

Next, as shown in FIG. 47 and FIG. 48, an insulating film (thick-film part of the buried insulating film) 6A having a film thickness of about 600 nm is formed on the substrate 2A by depositing a silicon oxide film by, for example, the thermal treatment of the substrate 2A or the CVD method. Similar to the field insulating film 6 of the above-described first embodiment, the thickness of the surface semiconductor layer 4 formed in a later step is determined by the thickness of the insulating film 6A, and also in the fifth embodiment, the film thickness of the insulating film 6A has to be adjusted so that the thickness of the surface semiconductor layer 4 becomes about 20 nm to 40 nm.

Figure 49:
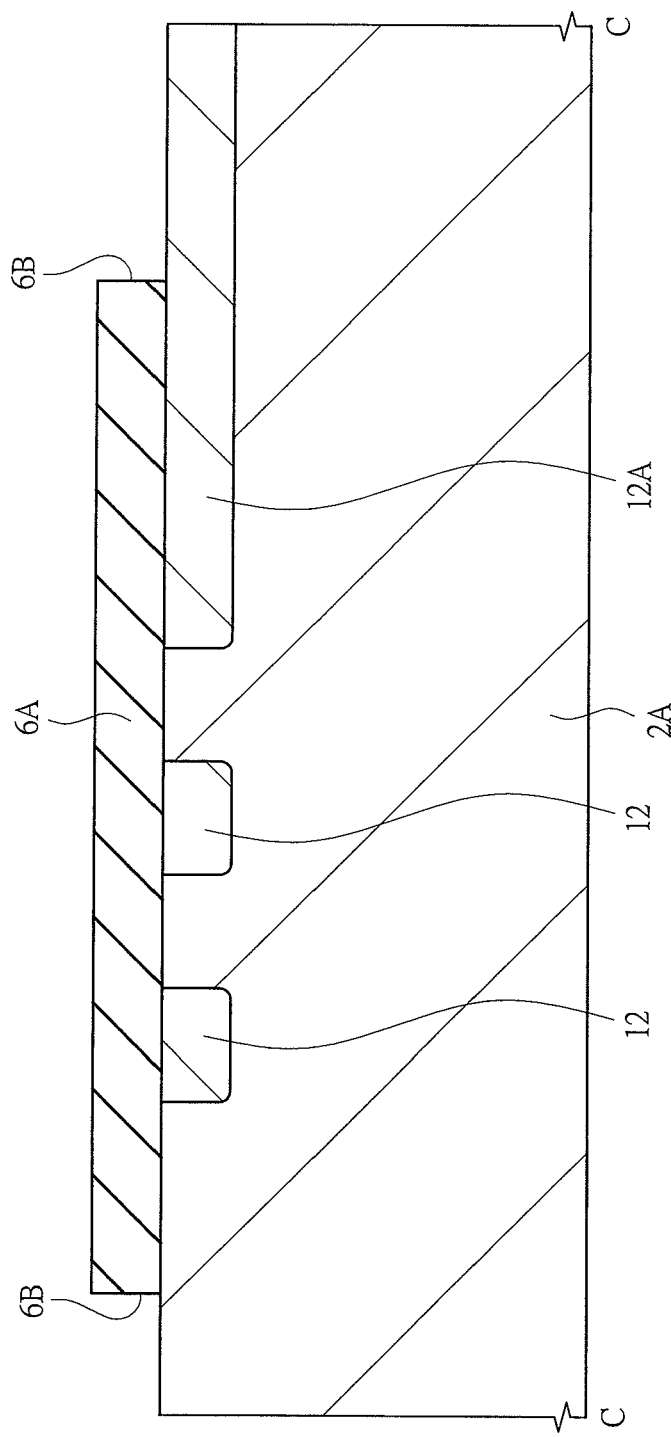
FIG. 49 is a cross-sectional view of the principal part in the manufacturing step of the IGBT continued from FIG. 47.
Figure 50:
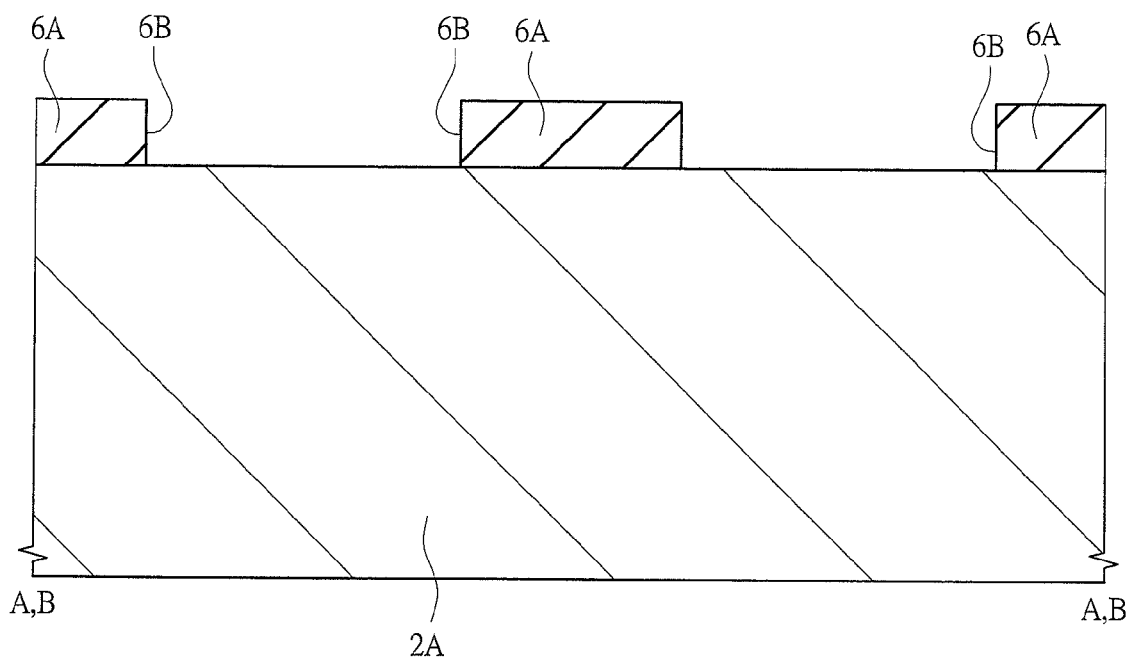
FIG. 50 is a cross-sectional view of the principal part in the manufacturing step of the IGBT continued from FIG. 48.

Next, as shown in FIG. 49 and FIG. 50, the insulating film 6A is patterned by the etching using a photoresist film patterned by the photolithography technology as a mask, thereby forming a plurality of opening parts 6B reaching the substrate 2A. In the fifth embodiment, the active regions of the main surface of the substrate 2A (regions in which the opening parts 6B are formed in the plane) are defined by the plurality of opening parts 6B and the remaining insulating film 6A.

Figure 51:
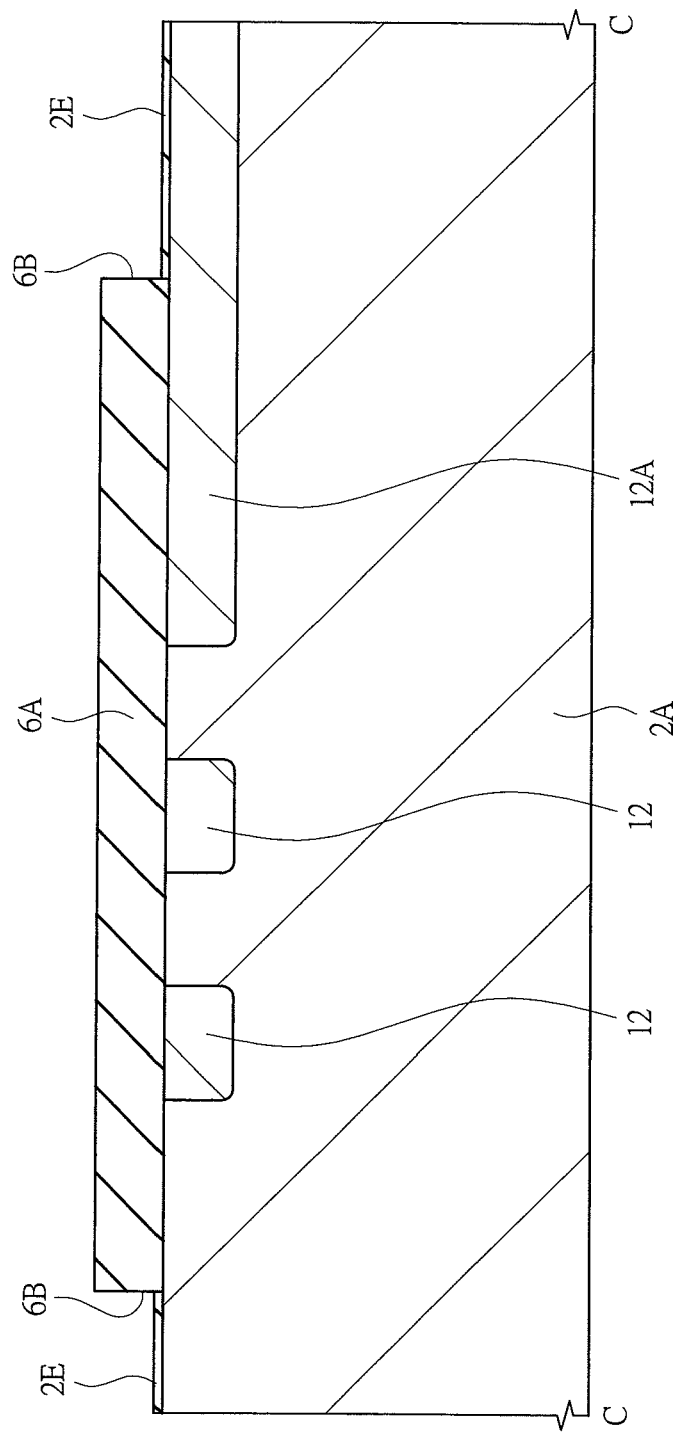
FIG. 51 is a cross-sectional view of the principal part in the manufacturing step of the IGBT continued from FIG. 49.
Figure 52:
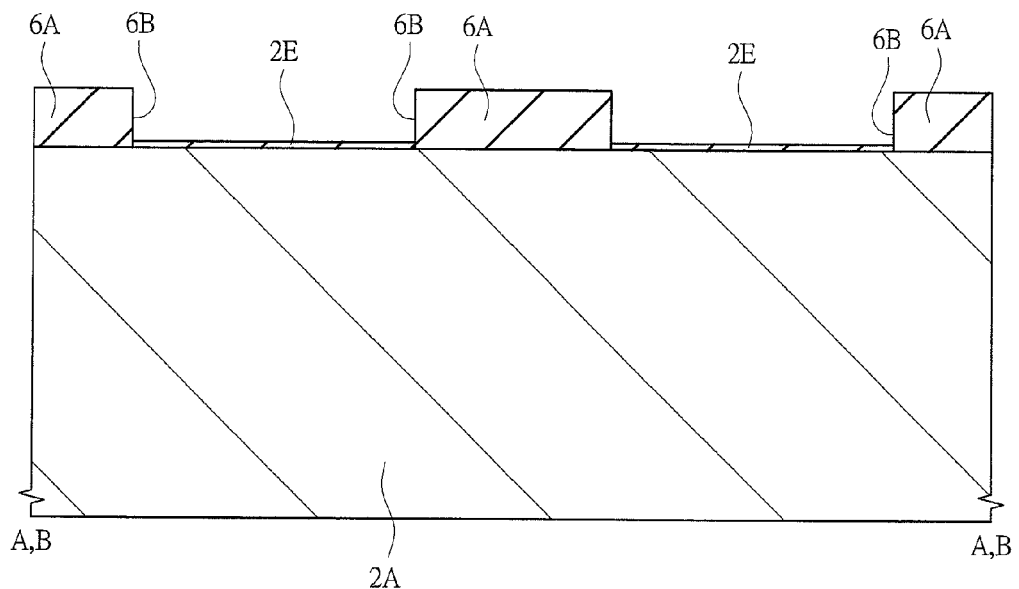
FIG. 52 is a cross-sectional view of the principal part in the manufacturing step of the IGBT continued from FIG. 50.
Figure 53:
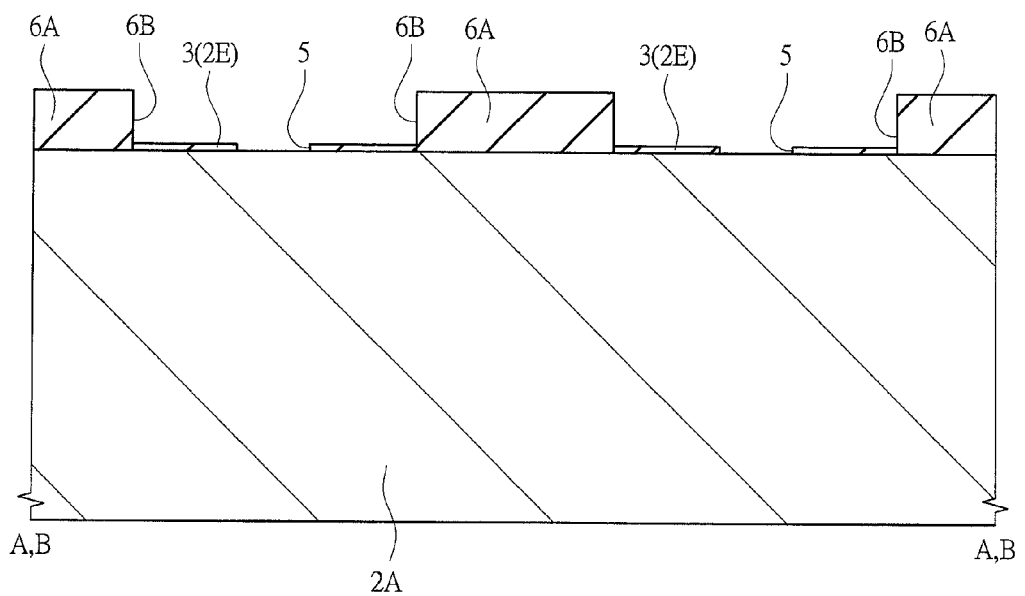
FIG. 53 is a cross-sectional view of the principal part in the manufacturing step of the IGBT continued from FIG. 52.

Next, as shown in FIG. 51 and FIG. 52, the substrate 2A is subjected to thermal treatment, thereby forming a thin silicon oxide film 2E on the surface of the substrate 2A exposed at the bottom part of each opening part 6B. Subsequently, as shown in FIG. 53, the silicon oxide films 2E are etched with using a photoresist film patterned by the photolithography technology as a mask, thereby forming the buried insulating films 3 (silicon oxide film 2E) each provided with the opening part 5. At this point, the surface of the substrate 2A is exposed from the bottom surface of the opening part 5.

Then, a semiconductor device of the fifth embodiment is manufactured through the steps similar to those described above with reference to FIG. 25 to FIG. 41 in the second embodiment.

The effects similar to those of the above-described second embodiment can be obtained also by the fifth embodiment as described above.

Sixth Embodiment

Next, a manufacturing method of an IGBT of a sixth embodiment will be described with reference to FIG. 54 to FIG. 57. In the manufacturing method of the sixth embodiment, up to the steps of forming the p type field limiting rings 12 and the p type wells 12A are the same as those of the fifth embodiment.

Figure 54:
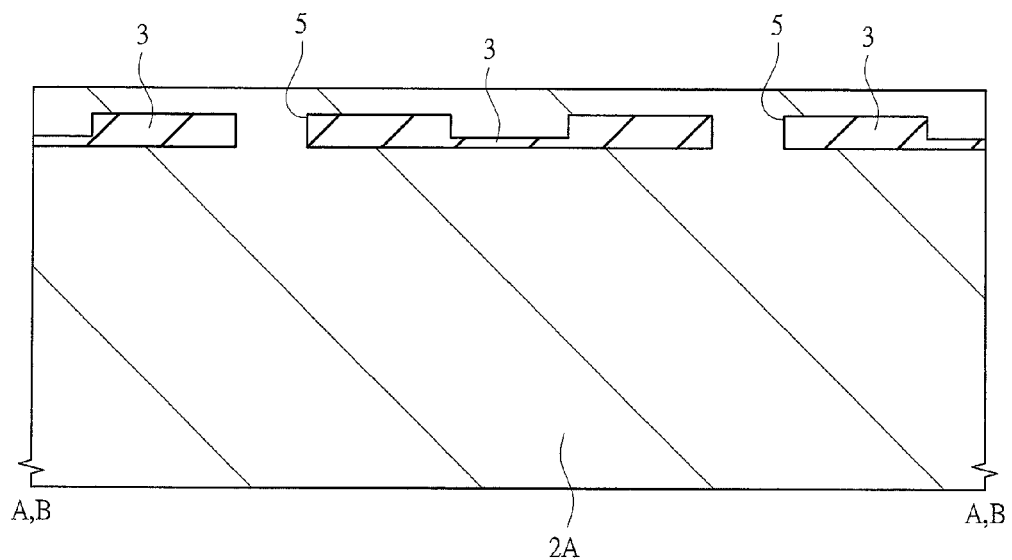
FIG. 54 is a cross-sectional view of the principal part for describing a manufacturing method of an IGBT which is a semiconductor device of a sixth embodiment of the present invention.

Next, as shown in FIG. 54, oxygen ions are selectively implanted into the main surface of the substrate 2A, thereby forming the buried insulating film 3 provided with a thick-film part having a large film thickness, a thin-film part having a smaller film thickness than that of the thick-film part and the opening part 5 in the substrate 2A. The thick-film part, the thin-film part and the opening part 5 of the buried insulating film 3 are formed by, for example, using two types of photoresist films as masks of the oxygen ion implantation and changing the ion implantation energy.

Figure 55:
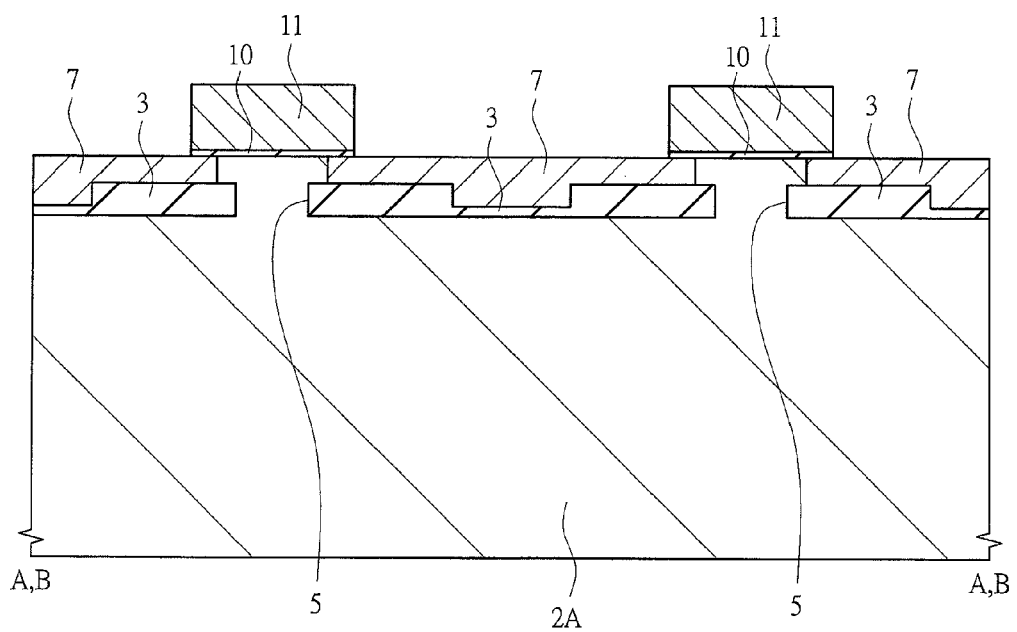
FIG. 55 is a cross-sectional view of the principal part in the manufacturing step of the IGBT continued from FIG. 54.

Next, as shown in FIG. 55, the gate insulating film 10 and the gate electrode 11 are formed by the steps similar to those of the second embodiment described above with reference to FIG. 27 and FIG. 28. Subsequently, after an impurity of p type conductivity (for example, B) is introduced into the main surface of the substrate 2A in the presence of the gate electrode 11, the substrate 2A is subjected to thermal treatment, thereby diffusing the impurity and forming the p type channel forming layer 7.

Figure 56:
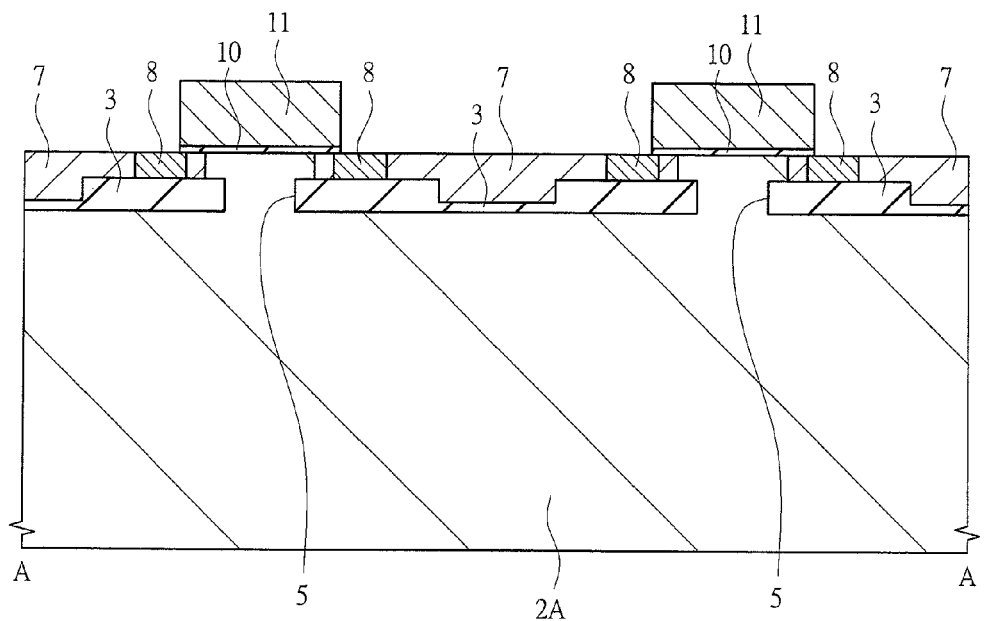
FIG. 56 is a cross-sectional view of the principal part in the manufacturing step of the IGBT continued from FIG. 55.
Figure 57:
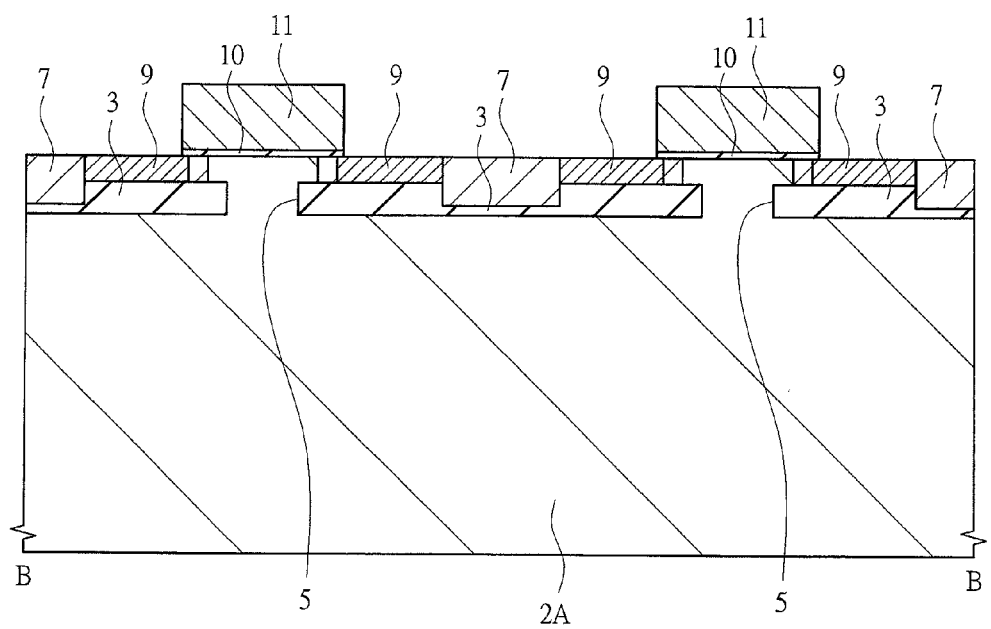
FIG. 57 is a cross-sectional view of the principal part in the manufacturing step of the IGBT which is the semiconductor device of the sixth embodiment of the present invention.

Next, as shown in FIG. 56 and FIG. 57, an impurity of n type conductivity (for example, As or P) is introduced into the p type channel forming layer 7 and the substrate 2B with using a photoresist film patterned by the photolithography technology as a mask by the steps similar to those of the second embodiment described above with reference to FIG. 30 and FIG. 31. Subsequently, the substrate 2A is subjected to thermal treatment, thereby diffusing the impurity and forming the $n^+$ type source layer 8 and the n type guard ring region 13 (see also FIG. 19).

Then, a semiconductor device of the sixth embodiment is manufactured through the steps similar to those of the second embodiment described above with reference to FIG. 32 to FIG. 41.

In the sixth embodiment, the part over the buried insulating film 3 in the substrate 2A corresponds to the surface semiconductor layers 4 and 4D described above in the second to fifth embodiments. More specifically, the buried insulating film 3 is formed so that the part over the thin-film part of the buried insulating film 3 in the substrate 2A has a thickness of 100 nm or less, more desirably about 40 to 20 nm, but this holds true for the vicinity of the gate electrode 11, and it may be thicker in other parts such as the part below the opening parts 15 (for example, see FIG. 1) which reach the $n^+$ type source layer 8 and the $p^+$ type emitter layer 9.

Since the silicon layer below the opening part 15 is also etched though slightly by the etching to form the opening part 15, if the thickness of the part over the buried insulating film 3 is reduced to about 20 nm to 40 nm, there is concern that the silicon layer between the opening part 15 and the buried insulating film 3 may be removed. Therefore, it is rather preferable that only the silicon layer between the opening part 15 and the buried insulating film 3 has a large thickness.

In the sixth embodiment, the buried insulating film 3 is formed by selectively implanting the oxygen ions into the main surface of the substrate 2A. Therefore, the thickness of the buried insulating film 3 can be locally increased by locally carrying out oxygen ion implantation plural times. Thus, the thickness of the part over the buried insulating film 3 in the substrate 2A can also be changed locally. As a result, since the thickness of the silicon layer between the opening part 15 and the buried insulating film 3 can be locally increased, the problem that the silicon layer between the opening part 15 and the buried insulating film 3 is removed when forming the opening part 15 can be prevented.

The effects similar to those of the above-described second embodiment can be obtained also by the sixth embodiment as described above.

Seventh Embodiment

Figure 58:
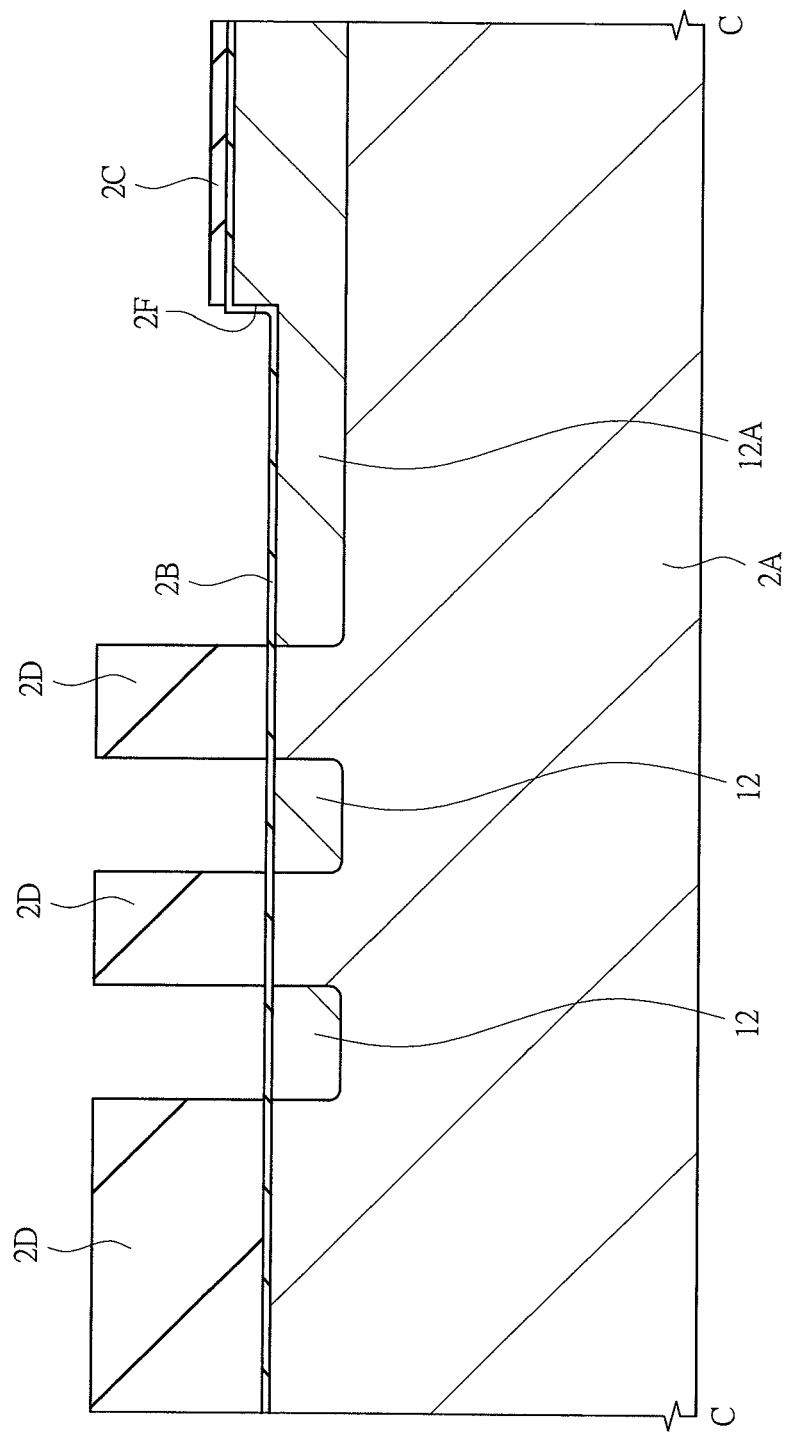
FIG. 58 is a cross-sectional view of the principal part for describing a manufacturing method of an IGBT which is a semiconductor device of a seventh embodiment of the present invention.

Next, a manufacturing method of an IGBT of a seventh embodiment will be described with reference to FIG. 58. The manufacturing method of the seventh embodiment is approximately the same as the manufacturing method of the above-described second embodiment, but a level difference 2F equivalent to the thickness of the field insulating film 6 is provided in advance on the main surface of the substrate 2A in the outer peripheral part of the chip 1 as shown in FIG. 58 so that the main surface of the substrate 2A in the outer peripheral part of the chip 1 is made lower than the other regions.

For example, when a difference is caused between the height of the field insulating film 6 formed in the outer peripheral part of the chip 1 and the height of the field insulating film 6 in the active region, in which the surface semiconductor layer 4 is formed, due to the influence of etching steps and others, particularly when the field insulating film 6 of the active region becomes lower than the field insulating film 6 formed in the outer peripheral part of the chip 1, there is concern that problems may occur in a CMP step to form the surface semiconductor layer 4.

More specifically, since this CMP step is carried out with using the field insulating film 6 as the end point of polishing, the polishing is ended based on the field insulating film 6 having the larger height. As a result, after the CMP step, the surface semiconductor layer 4 may remain in a non-preferred shape. For example, the surface semiconductor layer 4 may be extended over the field insulating film 6 of the active region.

Therefore, like in the seventh embodiment, the level difference 2F equivalent to the thickness of the field insulating film 6 is provided in advance on the main surface of the substrate 2A in the outer peripheral part of the chip 1 so that the main surface of the substrate 2A in the outer peripheral part of the chip 1 is made lower than the other regions. By this means, it is possible to prevent the field insulating film 6 of the active region from being lower than the field insulating film 6 formed in the outer peripheral part of the chip 1. As a result, the problem that the surface semiconductor layer 4 remains in the non-preferred shape can be prevented.

Eighth Embodiment

An eighth embodiment is an example of the application of the IGBTs described in the second to seventh embodiments above, and the IGBTs in the circuit diagrams shown in FIG. 59 and FIG. 60 described later correspond to the IGBTs described in the second to seventh embodiments above.

Figure 59:
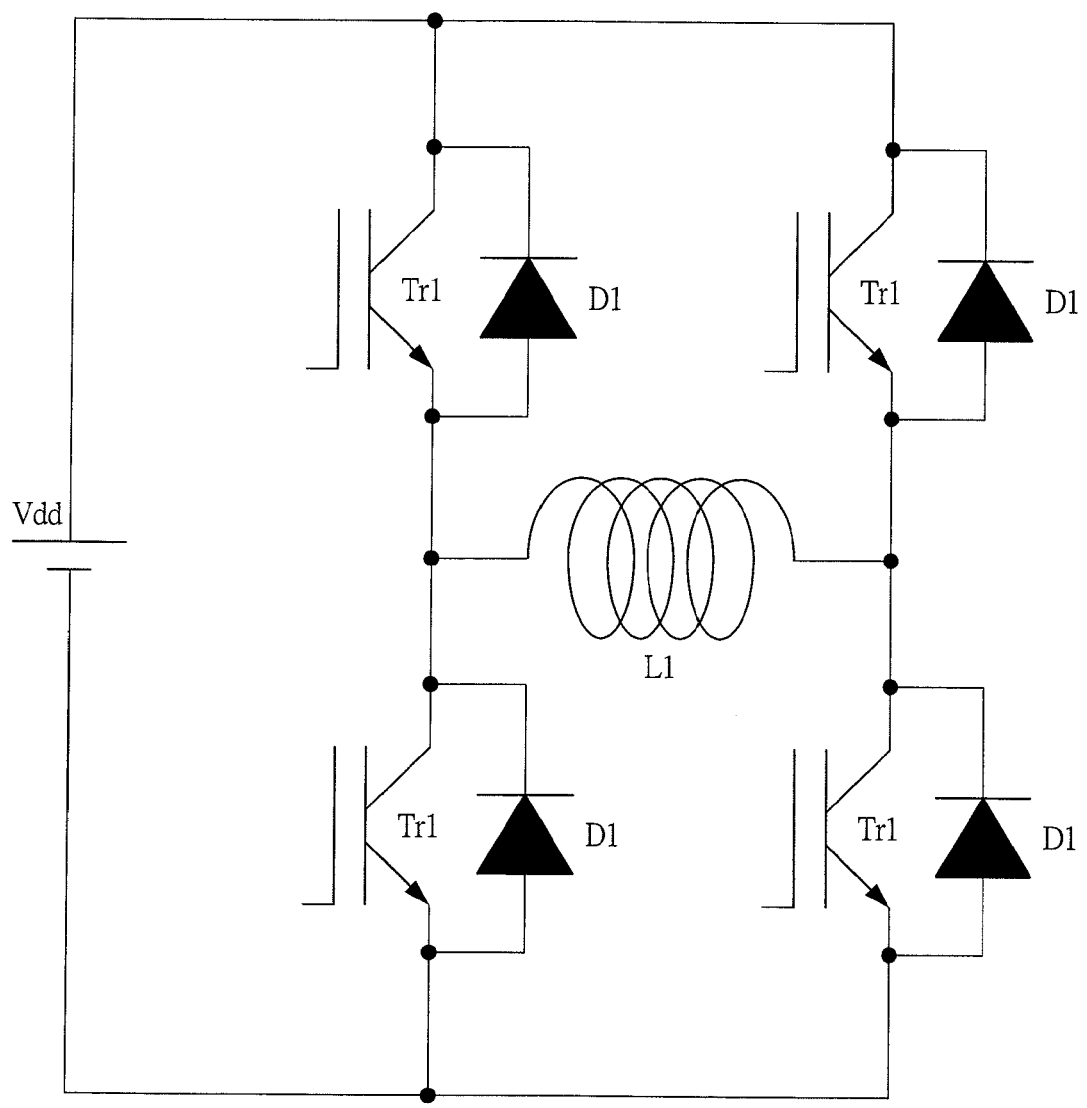
FIG. 59 is a basic circuit diagram of a single-phase inverter including an IGBT which is a semiconductor device of an eighth embodiment of the present invention.

FIG. 59 is a basic circuit diagram of a single-phase inverter. As shown in FIG. 59, a basic single-phase inverter is made up of a DC power supply Vdd, four IGBTs Tr1 and one coil L1. A free wheel diode D1 is connected in parallel to each of the four IGBTs Tr1 between the emitter and the collector thereof. When the load to which the IGBT Tr1 is electrically connected is a capacitive load or an inductive load, the mode for causing a load current to flow in the opposite direction of the on-switching direction is provided. However, the IGBT Tr1 alone does not have the function of causing the current of the opposite direction to flow. Therefore, the free wheel diode D1 is connected in the inverse parallel direction of the switching direction of the IGBT Tr1.

Figure 60:
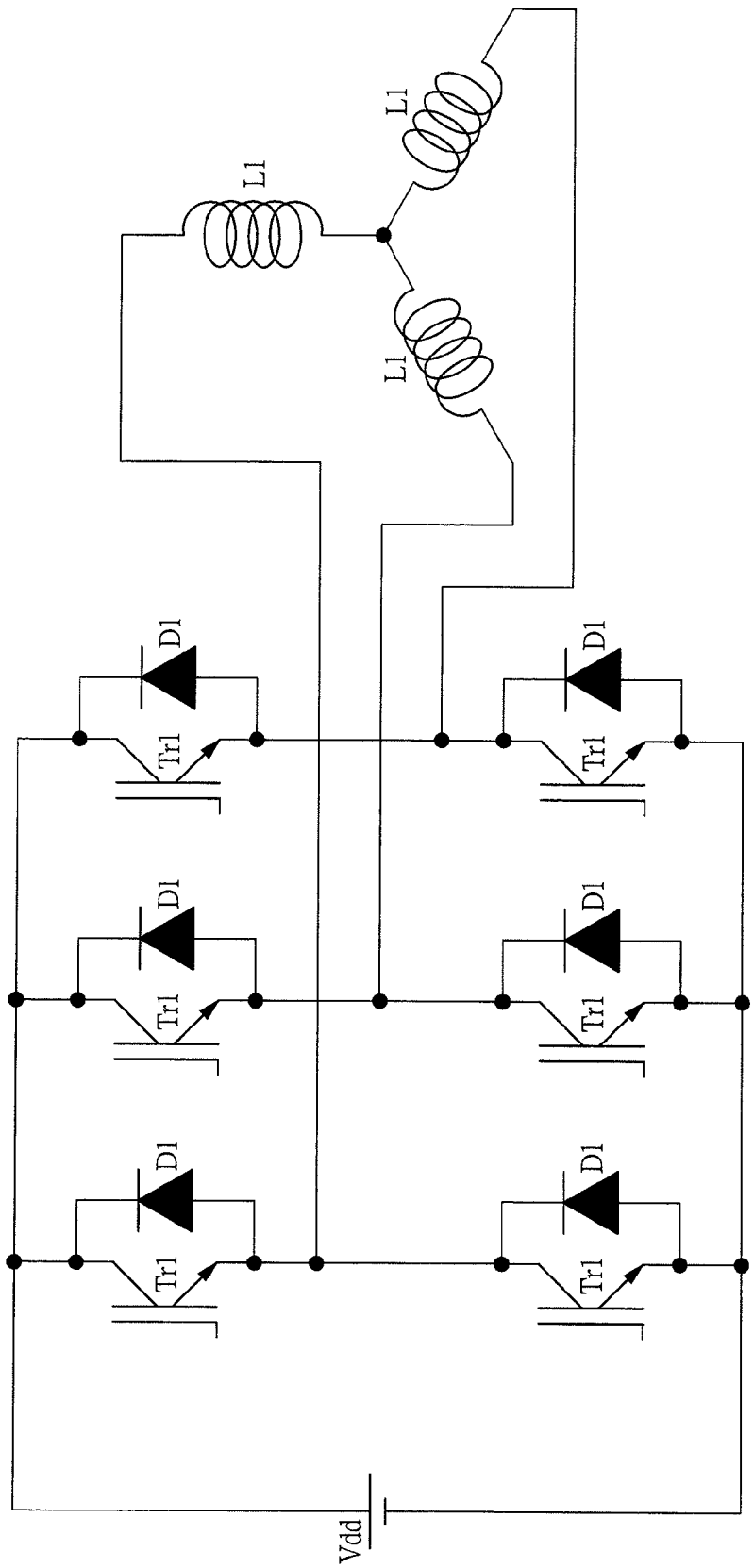
FIG. 60 is a basic circuit diagram of a three-phase inverter including the IGBT which is the semiconductor device of the eighth embodiment of the present invention.

Furthermore, FIG. 60 is a basic circuit diagram of a three-phase inverter used for motor drive and others. As shown in FIG. 60, a basic three-phase inverter is made up of a DC power supply Vdd, six IGBTs Tr1 and three coils L1. Similar to the case of the single-phase inverter (see FIG. 59), a free wheel diode D1 is connected in parallel to each of the six IGBTs Tr1 between the emitter and the collector thereof.

Ninth Embodiment

Figure 65:
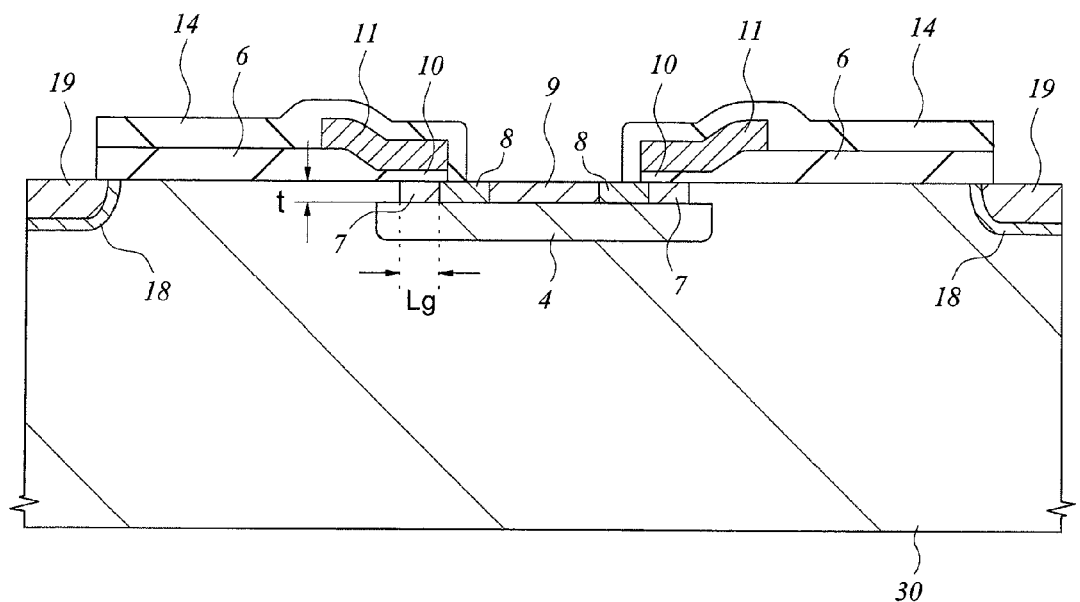
FIG. 65 is a cross-sectional view showing a lateral IGBT which is a semiconductor device of a ninth embodiment of the present invention.

The design of the emitter structure according to the present invention can be applied also to a lateral IGBT. FIG. 65 is a cross-sectional view of a lateral IGBT in which a high-resistance substrate 30 made of $n^-$ type single-crystal silicon is used and the p type collector layer 19, the $p^+$ type emitter layer 9 and the gate electrode 11 are formed on the approximately same plane as lateral devices. Moreover, in the region not shown in the drawing, a collector electrode is electrically connected to the surface of the p type collector layer 19, and an emitter electrode electrically connected to the $p^+$ type emitter layer 9 and the $n^+$ type source layer 8 is formed over the $p^+$ type emitter layer 9 and the $n^+$ type source layer 8.

Figure 66:
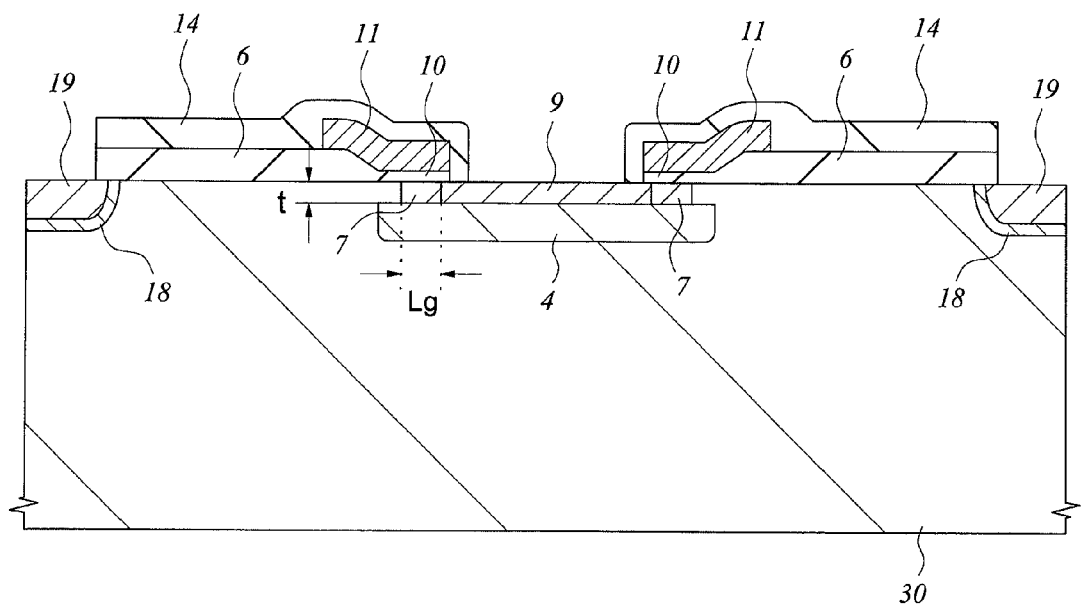
FIG. 66 is a cross-sectional view showing the lateral IGBT which is the semiconductor device of the ninth embodiment of the present invention.

In the case of the configuration described above, the $n^-$ type high-resistance substrate 30 should be at the same electric potential as that of the collector electrode. In the emitter region, the $n^+$ type source layer 8 should not be continuously formed in the depth direction (direction perpendicular to the paper surface), and the cross-sectional structure as shown in FIG. 66 in which the $n^+$ type source layer 8 is not provided in the depth direction should be present at the same time like in FIG. 19, FIG. 32, FIG. 35, FIG. 38 and FIG. 41. As a result, breakdown tolerance such as avalanche tolerance, load short-circuit tolerance and latch-up tolerance can be maintained.

Also in the lateral IGBT of such a configuration, when the thickness t of the p type channel forming layer 7 is set to 20 nm to 100 nm, more preferably 20 nm to 40 nm, the effects similar to those of the IGBT of the above-described first embodiment can be obtained.

Tenth Embodiment

Figure 67:
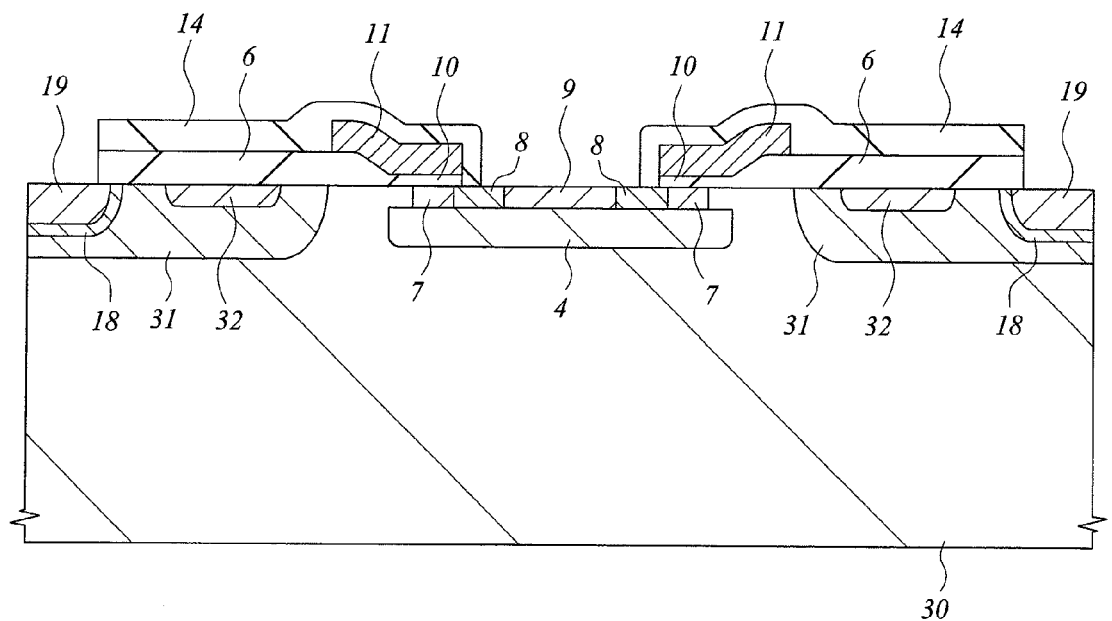
FIG. 67 is a cross-sectional view showing a lateral IGBT which is a semiconductor device of a tenth embodiment of the present invention.
Figure 68:
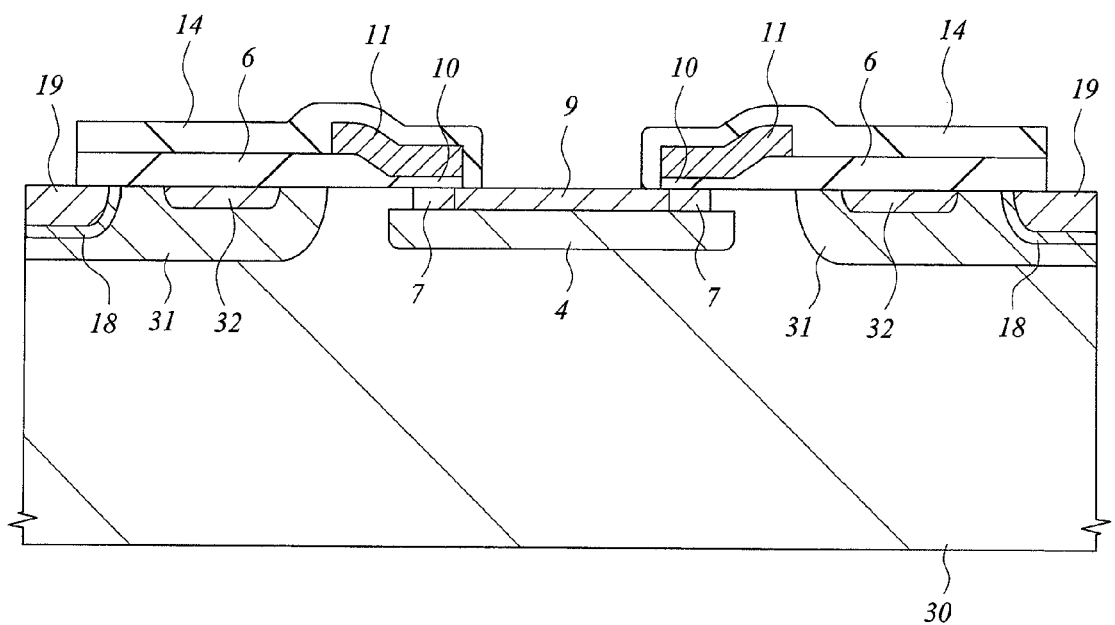
FIG. 68 is a cross-sectional view showing the lateral IGBT which is the semiconductor device of the tenth embodiment of the present invention.

FIG. 67 and FIG. 68 are cross-sectional views showing a lateral IGBT of a tenth embodiment of the present invention. The lateral IGBT of the tenth embodiment has a configuration in which a double resurf structure is introduced to the lateral IGBT of the above-described ninth embodiment.

More specifically, an n type diffusion layer 31 having an n type impurity concentration higher than that of the high-resistance substrate 30 and having the n type impurity concentration lower than that of the $n^+$ type buffer layer 18 and one or plural p type diffusion layers 32 disposed to be adjacent to the n type diffusion layer 31 and electrically connected to the n type diffusion layer 31 are formed in the part to be a carrier traveling region in the high-resistance substrate 30 constituting the n type base layer. According to the lateral IGBT having such a configuration, since the specific resistance of the carrier traveling region is further lowered by increasing the impurity concentration of the n type diffusion layer 31, the on-voltage Vice (sat) can be reduced.

Also in the lateral IGBT of such a configuration, when the thickness t of the p type channel forming layer 7 is set to 20 nm to 100 nm, more preferably 20 nm to 40 nm, the effects similar to those of the IGBT of the above-described first embodiment can be obtained.

Eleventh Embodiment

Figure 69:
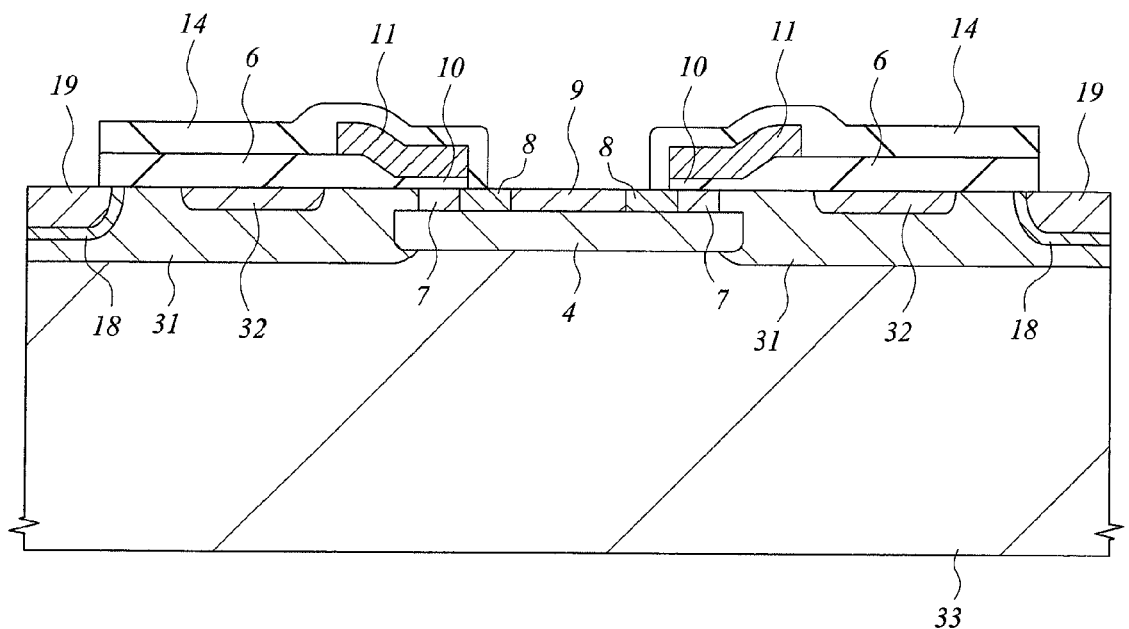
FIG. 69 is a cross-sectional view showing a lateral IGBT which is a semiconductor device of an eleventh embodiment of the present invention.
Figure 70:
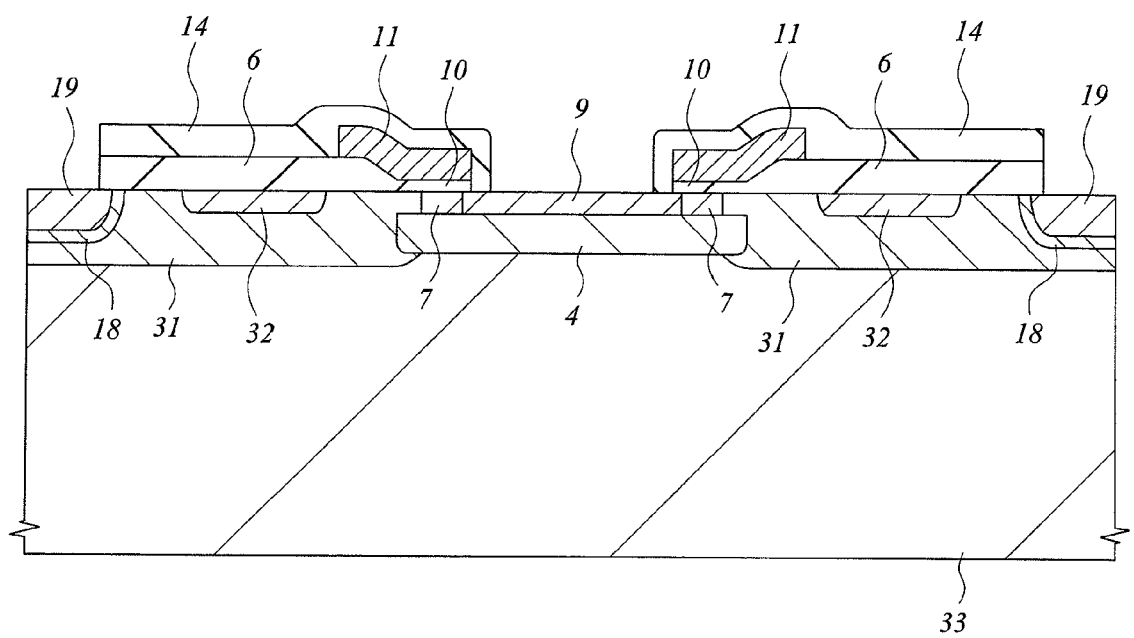
FIG. 70 is a cross-sectional view showing the lateral IGBT which is the semiconductor device of the eleventh embodiment of the present invention.

FIG. 69 and FIG. 70 are cross-sectional views showing a lateral IGBT of an eleventh embodiment of the present invention. The lateral IGBT of the eleventh embodiment uses a high-resistance substrate 33 made of a $p^-$ type single-crystal silicon as a high-resistance substrate. Furthermore, the n type diffusion layer 31 electrically connected to both the $n^+$ type buffer layer 18 and the surface semiconductor layer 4 and having an n type impurity concentration lower than that of the $n^+$ type buffer layer 18 is formed between the p type collector layer 19 and the $n^+$ type buffer layer 18 and the n type surface semiconductor layer 4. The n type diffusion layer 31 functions as an n type base region of the lateral IGBT.

In the case of such a configuration, the p type high-resistance substrate 33 should be at the same electric potential as that of the emitter electrode. Moreover, it is desired that the specific resistance of the carrier traveling region is further reduced by forming the p type diffusion layer 32 in the n type diffusion layer 31 and introducing the double resurf structure which increases the impurity concentration of the n type diffusion layer 31 like in the above-described tenth embodiment.

Also in the lateral IGBT of such a configuration, when the thickness t of the p type channel forming layer 7 is set to 20 nm to 100 nm, more preferably 20 nm to 40 nm, the effects similar to those of the IGBT of the above-described first embodiment can be obtained.

Twelfth Embodiment

In the lateral IGBT of the above-described ninth embodiment, the high-resistance substrate 30 has to be connected to the collector electrode in order to stabilize the electric potential of the n type high-resistance substrate 30. Also, in the lateral IGBT of the above-described eleventh embodiment, the high-resistance substrate 33 has to be connected to the emitter electrode in order to stabilize the electric potential of the p type high-resistance substrate 33.

However, in these configurations, the operation of the lateral IGBT is readily affected by the electric potential connected to the high-resistance substrate 30 (or the high-resistance substrate 33). Particularly, in the case of the lateral IGBT of the eleventh embodiment in which the p type high-resistance substrate 33 is used, a part of the hole current may flow out to the high-resistance substrate 33 and deteriorate the carrier accumulation effect.

Figure 71:
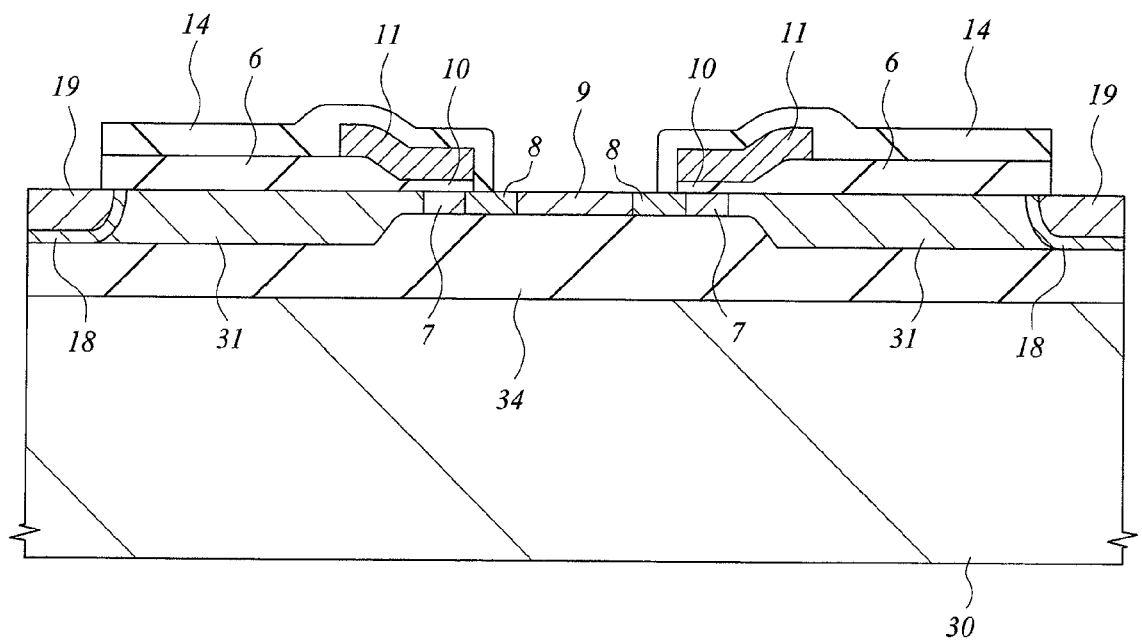
FIG. 71 is a cross-sectional view showing a lateral IGBT which is a semiconductor device of a twelfth embodiment of the present invention.
Figure 72:
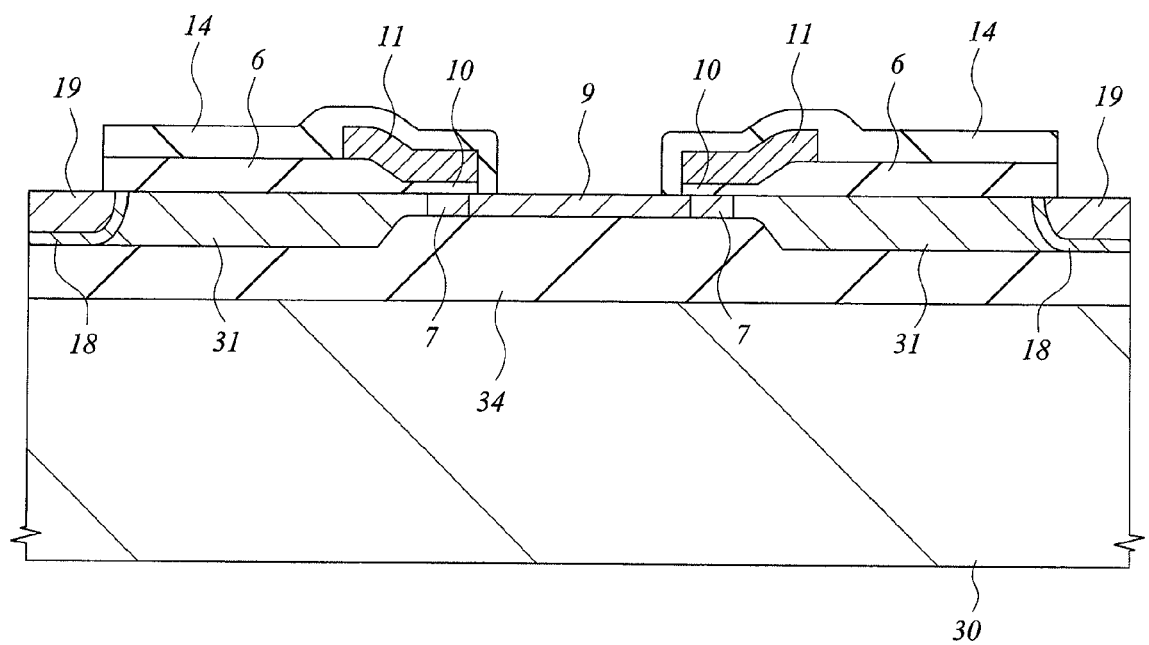
FIG. 72 is a cross-sectional view showing the lateral IGBT which is the semiconductor device of the twelfth embodiment of the present invention.

Therefore, it is more desirable as a device structure of a lateral IGBT that an insulating layer 34 having a buried structure made of a silicon oxide or the like is provided between the n type diffusion layer (high-resistance SOI region) 31 to be the n type base layer and the high-resistance substrate 30 (or the high-resistance substrate 33) and only the p type channel forming region 7 is formed to be thinner as shown in FIG. 71 and FIG. 72.

In the case of such a configuration, since the n type diffusion layer (high-resistance SOI region) 31 to be the n type base layer is insulated from the high-resistance substrate 30 (or the high-resistance substrate 33), the carrier accumulation effect of the vertical IGBT described above in the first to eighth embodiments can be obtained.

Figure 73:
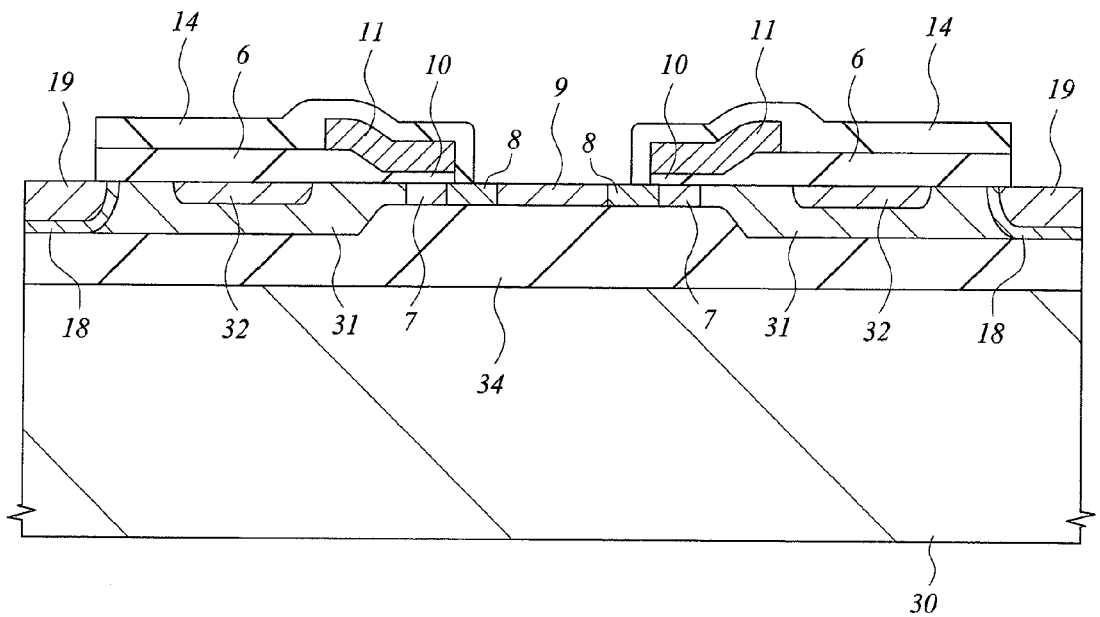
FIG. 73 is a cross-sectional view showing a lateral IGBT which is a semiconductor device of a thirteenth embodiment of the present invention.
Figure 74:
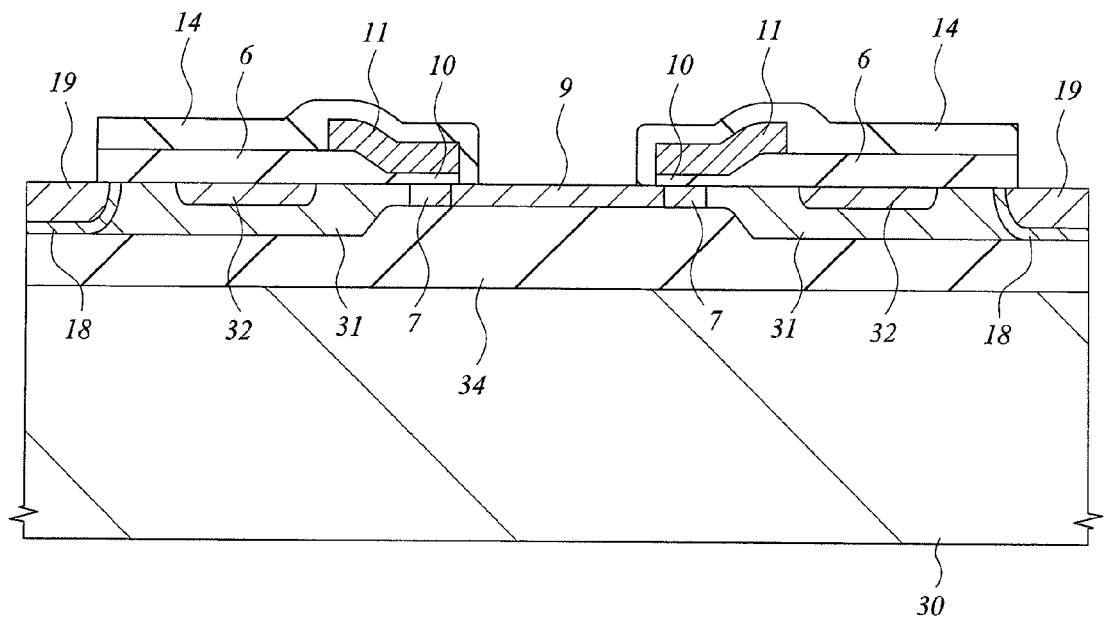
FIG. 74 is a cross-sectional view showing the lateral IGBT which is the semiconductor device of the thirteenth embodiment of the present invention.
Figure 75:
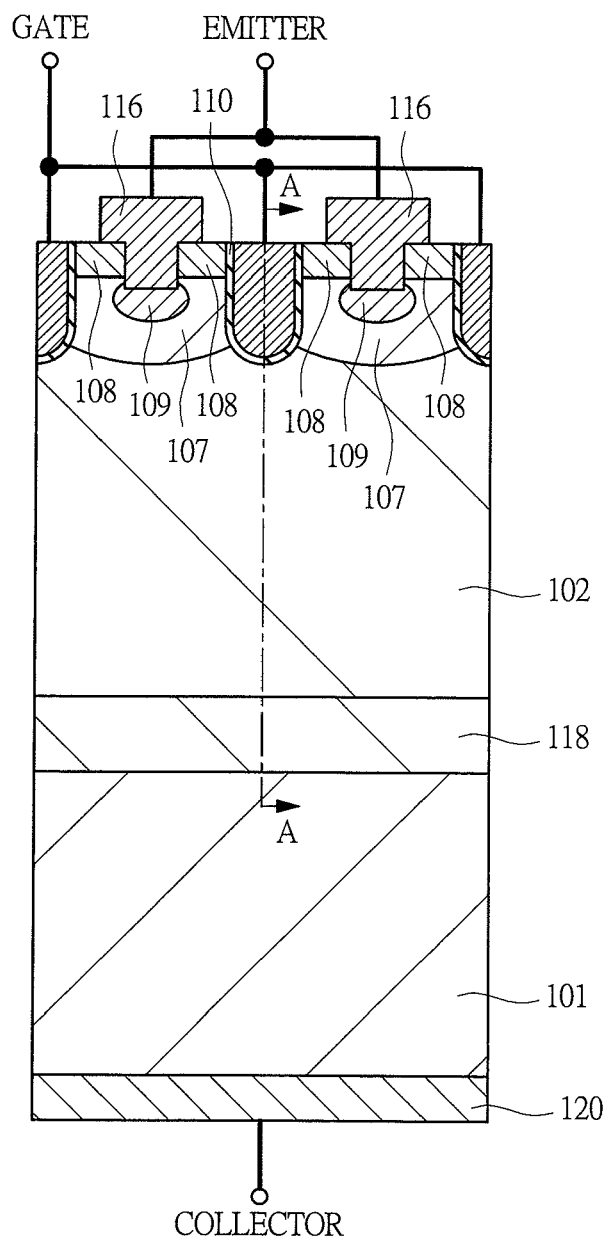
FIG. 75 is an explanatory drawing showing a cross section of the principal part showing an example of a trench gate IGBT and a carrier density in a substrate thereof studied by the inventors of the present invention.
Figure 76:
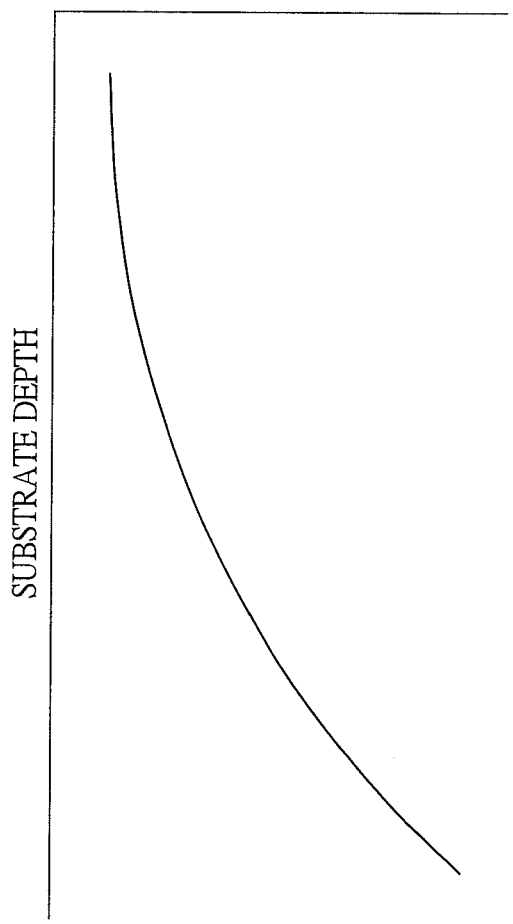
FIG. 76 is an explanatory drawing showing the relation between the substrate depth and the carrier density in the trench gate IGBT studied by the inventors of the present invention.

Furthermore, it is desired that the specific resistance of the carrier traveling region is further reduced by forming the p type diffusion layer 32 in the n type diffusion layer 31 and introducing the double resurf structure which increases the impurity concentration of the n type diffusion layer 31 as shown in FIG. 73 and FIG. 74.

Also in the lateral IGBT of such a SOI structure, when the thickness t of the p type channel forming layer 7 is set to 20 nm to 100 nm, more preferably 20 nm to 40 nm, the effects similar to those of the IGBT of the above-described first embodiment can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described embodiments, the case in which the buried insulating film is made of a silicon oxide film has been described, but the film may be made of a silicon nitride film instead of the silicon oxide film.

Moreover, also in the lateral IGBTs of the above-described ninth to eleventh embodiments, the p type channel forming layer 7 may be sandwiched by the plurality of buried insulating films 6 and the gate insulating film 10 and the p type channel forming layer 7 and the $n^+$ type source layer 8 may be formed on the thin-film part 3 of the buried insulating film 6 like in the vertical IGBTs of the above-described first to eighth embodiments. In that case, the opening part (separation part) 5 may be formed in each of the thin-film parts 3 of the plurality of buried insulating films 6 so that the n type base layer and the surface semiconductor layer 4 are in contact with each other at the opening part (separation part) 5.

Moreover, in the case of an IGBT, a free wheel diode and the IGBT are often paired and sealed in a package. More specifically, since the pair of the IGBT Tr1 and parallelly connected D1 shown in the circuit diagrams of FIG. 59 and FIG. 60 is used as a unit, they are often sealed in the same package. FIG. 81 is a cross-sectional view showing a principal part of a package structure in which these two chips (IGBT Tr1, D1) are mounted on a lead frame 43 and bonded by Au wires 44. The reference numerals 41, 42 and 43 in the drawing denote a p type diffusion layer, an n type diffusion layer and an $n^+$ type diffusion layer, respectively.

The lateral IGBTs can be applied not only to high-breakdown-voltage driver ICS for power control, but also to high-breakdown-voltage ICs (HVIC) and others.

INDUSTRIAL APPLICABILITY

The semiconductor device and the manufacturing method of the same of the present invention can be applied to various inverters such as motor-drive inverters in, for example, rail cars and hybrid cars.

What is claimed is:

1. A semiconductor device including an IGBT, the IGBT comprising:
   (a) a p type collector layer;
   (b) an n type buffer layer formed over the p type collector layer;
   (c) an n type base layer formed over the n type buffer layer and having a higher resistance than that of the n type buffer layer;
   (d) a surface semiconductor layer formed over the n type base layer via a buried insulating film having an opening part and electrically connected to the n type base layer in the opening part;
   (e) a p type channel forming layer formed in a part of the surface semiconductor layer;
   (f) a gate insulating film formed on the p type channel forming layer;
   (g) a p type emitter layer formed in the surface semiconductor layer so as to be electrically connected to the p type channel forming layer and having a higher p type impurity concentration than that of the p type channel forming layer;
   (h) an n type source layer formed in a part of the surface semiconductor layer and electrically connected to both the p type channel forming layer and the p type emitter layer;
   (i) a gate electrode formed over the gate insulating film;
   (j) a collector electrode formed below the p type collector layer and electrically connected to the p type collector layer; and (k) an emitter electrode formed over the p type emitter layer and the n type source layer and electrically connected to the p type emitter layer and the n type source layer, wherein, in a region in which the p type channel forming layer is sandwiched by the buried insulating film and the gate insulating film, a thickness of the p type channel forming layer in the region is 20 nm to 100 nm.

2. The semiconductor device according to claim 1, wherein the p type channel forming layer is sandwiched by the buried insulating film and the gate insulating film, the buried insulating film includes a thick-film part having a large film thickness and a thin-film part having a film thickness smaller than that of the thick-film part, a surface of the thick-film part is in the same plane as a surface of the surface semiconductor layer, and the p type channel forming layer and the n type source layer are formed over the thin-film part.

3. The semiconductor device according to claim 1, wherein the n type base layer and the surface semiconductor layer are made of single-crystal silicon.

4. The semiconductor device according to claim 1, wherein a composition ratio of a current flowing to the emitter electrode when the IGBT is on includes 20% or less of a hole current and 80% or more of an electron current.

5. The semiconductor device according to claim 1, wherein the p type collector layer has a thickness of 5 μm or less.

6. The semiconductor device according to claim 1, wherein the thickness of the p type channel forming layer in the region is 20 nm to 40 nm.

7. The semiconductor device according to claim 1, wherein, with respect to increase in a bias voltage, an output current when the IGBT is in an on-state exhibits saturability by characteristics of a MOS channel.

8. The semiconductor device according to claim 1, wherein, with respect to increase in a bias voltage, an output current when the IGBT is in an on-state exhibits saturability by limitation of an injection efficiency of carriers from the p type collector layer to the n type base layer via the n type buffer layer.

9. The semiconductor device according to claim 1, wherein a cell pitch of a MOS pattern constituting an emitter structure of the IGBT is 10 μm or less.

10. The semiconductor device according to claim 1, wherein a length of the p type channel forming layer along a carrier traveling direction is 1 μm or less.

11. The semiconductor device according to claim 1, wherein the gate electrode is made of p type polycrystalline silicon, and when a gate bias voltage is 0 V or a floating potential, a built-in potential of the gate electrode exerts an influence in a direction to promote conversion of a channel region to a p type via the gate insulating film and reduces resistance of the channel region with respect to holes, thereby facilitating outflow of a hole current to the emitter electrode and increasing breakdown tolerance of the IGBT.

12. A semiconductor device including an IGBT, the IGBT comprising:
(a) a p type collector layer;
(b) an n type buffer layer formed over the p type collector layer;
(c) an n type base layer formed over the n type buffer layer;
(d) a plurality of buried insulating films selectively formed in the n type base layer;
(e) a p type channel forming layer formed in the n type base layer over the plurality of buried insulating films;
(f) a p type emitter layer formed in the n type base layer over the plurality of buried insulating films so as to be in contact with the p type channel forming layer and having a higher p type impurity concentration than that of the p type channel forming layer;
(g) an n type source layer formed in the n type base layer over the plurality of buried insulating films;
(h) a gate insulating film formed on a part of a surface of the n type base layer over the plurality of buried insulating films and on a part of the p type channel forming layer;
(i) a gate electrode formed over the gate insulating film;
(j) a collector electrode formed below the p type collector layer and electrically connected to the p type collector layer; and
(k) an emitter electrode formed over the p type emitter layer and the n type source layer and electrically connected to the p type emitter layer and the n type source layer, wherein a thickness of the p type channel forming layer is 20 nm to 100 nm.

13. The semiconductor device according to claim 12, wherein each of the plurality of buried insulating films includes a thick-film part having a large film thickness and a thin-film part having a film thickness smaller than that of the thick-film part, and a part connecting the p type emitter layer and the n type source layer with the emitter electrode is formed on the thick-film part of the plurality of buried insulating films.

14. The semiconductor device according to claim 12, wherein the n type base layer is made of single-crystal silicon.

15. The semiconductor device according to claim 12, wherein a composition ratio of a current flowing to the emitter electrode when the IGBT is on includes 20% or less of a hole current and 80% or more of an electron current.

16. A manufacturing method of a semiconductor device including an IGBT, the method comprising:
(a) a step of forming a buried insulating film including a thick-film part having a large film thickness and a thin-film part having a smaller film thickness than that of the thick-film part on a main surface of an n type substrate to be an n type base layer of the IGBT;
(b) a step of forming a separation part reaching the substrate in the thin-film part of the buried insulating film;
(c) a step of forming an n type surface semiconductor layer filling the separation part and having a thickness of 20 nm to 100 nm over the thin-film part of the buried insulating film;
(d) a step of forming a gate insulating film of the IGBT selectively on a part of a surface of the n type surface semiconductor layer;
(e) a step of forming a gate electrode of the IGBT over the gate insulating film;
(f) a step of forming a p type channel forming layer of the IGBT in the n type surface semiconductor layer;
(g) a step of forming a p type emitter layer of the IGBT having a p type impurity concentration higher than that of the p type channel forming layer in the n type surface semiconductor layer so that the p type emitter layer is in contact with the p type channel forming layer;
(h) a step of forming an n type source layer of the IGBT in the n type surface semiconductor layer;

(i) a step of forming the n type base layer of the IGBT made of the n type substrate by grinding the n type substrate from its rear surface;

(j) a step of forming an n type buffer layer of the IGBT on a rear surface of the n type base layer;

(k) a step of forming a p type collector layer of the IGBT on a rear surface of the n type buffer layer;

(l) a step of forming a collector electrode of the IGBT electrically connected to the p type collector layer on a rear surface of the p type collector layer; and (m) a step of forming an emitter electrode of the IGBT electrically connected to the p type emitter layer and the n type source layer over the p type emitter layer and the n type source layer.

17. The manufacturing method of the semiconductor device according to claim 16, wherein the n type surface semiconductor layer has a higher n type impurity concentration than that of the n type substrate, and formation of the n type surface semiconductor layer is carried out by an epitaxial method so that a crystal is continued in a lattice level from the n type substrate in the separation part.

18. The manufacturing method of the semiconductor device according to claim 16, wherein a surface of the thick-film part of the buried insulating film is formed so as to be in the same plane as a surface of the n type surface semiconductor layer.

19. The manufacturing method of the semiconductor device according to claim 16, wherein the n type substrate and the n type surface semiconductor layer are made of single-crystal silicon.

20. The manufacturing method of the semiconductor device according to claim 16, wherein the n type surface semiconductor layer is formed by forming a p type silicon film in the separation part by an epitaxial method so that a crystal is continued in a lattice level from the n type substrate and then introducing an n type impurity into the p type silicon film.

21. The manufacturing method of the semiconductor device according to claim 16, wherein the n type substrate is separated into a plurality of chip regions, an active region and an outer peripheral part surrounding the active region are defined on each main surface of the plurality of chip regions, the step (a) includes:

(a1) a step of forming a level difference on each main surface of the plurality of chip regions so that the outer peripheral part is lower than the active region in each of the plurality of chip regions, and the step (a1) is carried out before the step of forming the buried insulating film on the main surface of the n type substrate.

22. The manufacturing method of the semiconductor device according to claim 21, wherein the level difference is equivalent to the thickness of the thick-film part of the buried insulating film.

23. The manufacturing method of the semiconductor device according to claim 16, wherein a thickness of the p type collector layer is 5 μm or less.

24. The manufacturing method of the semiconductor device according to claim 16, wherein, in the step (c), a thickness of the n type surface semiconductor layer formed on the thin-film part of the buried insulating film is 20 nm to 40 nm.

25. A manufacturing method of a semiconductor device including an IGBT, the method comprising:

(a) a step of selectively forming a buried insulating film including a thick-film part having a large film thickness and a separation part and a thin-film part having a smaller film thickness than that of the thick-film part in an n type substrate to be an n type base layer of the IGBT by introducing oxygen ions into the n type substrate from a main surface of the n type substrate;

(b) a step of selectively forming a gate insulating film of the IGBT in a part of the main surface of the n type substrate having the buried insulating film formed therein;

(c) a step of forming a gate electrode of the IGBT over the gate insulating film;

(d) a step of forming a p type channel forming layer of the IGBT in the n type substrate over the buried insulating film;

(e) a step of forming a p type emitter layer of the IGBT having a higher p type impurity concentration than that of the p type channel forming layer in the n type substrate over the buried insulating film so that the p type emitter layer is in contact with the p type channel forming layer;

(f) a step of forming an n type source layer of the IGBT in the n type substrate over the buried insulating film;

(g) a step of forming the n type base layer of the IGBT formed of the n type substrate by grinding the n type substrate from its rear surface;

(h) a step of forming an n type buffer layer of the IGBT on a rear surface of the n type base layer;

(i) a step of forming a p type collector layer of the IGBT on a rear surface of the n type buffer layer;

(j) a step of forming a collector electrode of the IGBT electrically connected to the p type collector layer on a rear surface of the p type collector layer; and (k) a step of forming an emitter electrode of the IGBT electrically connected to the p type emitter layer and the n type source layer over the p type emitter layer and the n type source layer, wherein the buried insulating film is formed so that a distance from the main surface of the n type substrate to the thin-film part of the buried insulating film becomes 20 nm to 100 nm, and a part connecting the p type emitter layer and the n type source layer with the emitter electrode is formed on the thick-film part of the buried insulating film.

26. The manufacturing method of the semiconductor device according to claim 25, wherein the n type substrate is made of single-crystal silicon.

27. The manufacturing method of the semiconductor device according to claim 25, wherein the buried insulating film is formed so that the distance from the main surface of the n type substrate to the thin-film part of the buried insulating film becomes 20 nm to 40 nm.

28. A semiconductor device including a lateral IGBT formed in a surface region of an n type high-resistance semiconductor substrate, the lateral IGBT comprising:

(a) a p type collector layer formed in the surface region of the high-resistance semiconductor substrate;

(b) an n type buffer layer formed in a vicinity of a pn junction between the high-resistance semiconductor substrate and the p type collector layer and having a higher n type impurity concentration than that of the high-resistance semiconductor substrate;

(c) a surface semiconductor layer formed apart from the p type collector layer and the n type buffer layer by a distance appropriate for maintaining a breakdown voltage and electrically connected to the high-resistance semiconductor substrate;

(d) a p type channel forming layer formed in a part of the surface semiconductor layer;

(e) an insulating film partially made of a gate insulating film and formed so as to sandwich at least a part of the p type channel forming layer;

(f) a p type emitter layer formed in the surface semiconductor layer so as to be electrically connected to the p type channel forming layer and having a higher p type impurity concentration than that of the p type channel forming layer;

(g) an n type source layer formed in the surface semiconductor layer and electrically connected to both the p type channel forming layer and the p type emitter layer;

(h) a gate electrode formed over the gate insulating film;

(i) a collector electrode formed on a surface of the p type collector layer and electrically connected to the p type collector layer; and (j) an emitter electrode formed over the p type emitter layer and the n type source layer and electrically connected to both the p type emitter layer and the n type source layer, wherein, in a region in which the p type channel forming layer is sandwiched by the insulating film, a thickness of a thinnest part of the p type channel forming layer is 20 nm to 100 nm.

29. The semiconductor device according to claim 24,
wherein an n type diffusion layer having an n type impurity concentration higher than that of the high-resistance semiconductor substrate and lower than that of the n type buffer layer is formed between the p type collector layer and the n type buffer layer and the surface semiconductor layer, and
a p type diffusion layer is formed in the n type diffusion layer.

30. The semiconductor device according to claim 28,
wherein the thickness of the thinnest part of the p type channel forming layer is 20 nm to 40 nm.

31. The semiconductor device according to claim 28,
wherein the p type channel forming layer is sandwiched by a plurality of buried insulating films and the gate insulating film,
each of the plurality of buried insulating films includes a thick-film part having a large film thickness and a thin-film part having a smaller film thickness than that of the thick-film part,
a surface of the thick-film part is in the same plane as a surface of the surface semiconductor layer, and
the p type channel forming layer and the n type source layer are formed over the thin-film part.

32. The semiconductor device according to claim 31,
wherein a separation part is formed in each of the thin-film parts of the plurality of buried insulating films, and
the n type base layer and the surface semiconductor layer are in contact with each other in the separation part of the thin-film part.

33. The semiconductor device according to claim 28,
wherein the n type diffusion layer and the surface semiconductor layer are made of single-crystal silicon.

34. The semiconductor device according to claim 28,
wherein a composition ratio of a current flowing to the emitter electrode when the lateral IGBT is on includes 20% or less of a hole current and 80% or more of an electron current.

35. A semiconductor device including a lateral IGBT formed in a surface region of a p type high-resistance semiconductor substrate, the lateral IGBT comprising:

(a) a p type collector layer formed in the surface region of the high-resistance semiconductor substrate;

(b) an n type buffer layer formed in a vicinity of a pn junction between the high-resistance semiconductor substrate and the p type collector layer;

(c) an n type surface semiconductor layer formed apart from the p type collector layer and the n type buffer layer by a distance appropriate for maintaining a breakdown voltage;

(d) an n type diffusion layer formed between the p type collector layer and the n type buffer layer and the surface semiconductor layer, electrically connected to both the n type buffer layer and the surface semiconductor layer, and having a lower n type impurity concentration than that of the n type buffer layer;

(e) a p type channel forming layer formed in a part of the surface semiconductor layer;

(f) an insulating film partially made of a gate insulating film and formed so as to sandwich at least a part of the p type channel forming layer;

(g) a p type emitter layer formed so as to be electrically connected to the p type channel forming layer in the surface semiconductor layer and having a higher p type impurity concentration than that of the p type channel forming layer;

(h) an n type source layer formed in the surface semiconductor layer and electrically connected to both the p type channel forming layer and the p type emitter layer;

(i) a gate electrode formed over the gate insulating film;

(j) a collector electrode formed on a surface of the p type collector layer and electrically connected to the p type collector layer; and (k) an emitter electrode formed over the p type emitter layer and the n type source layer and electrically connected to both the p type emitter layer and the n type source layer, wherein, in a region in which the p type channel forming layer is sandwiched by the insulating film, a thickness of a thinnest part of the p type channel forming layer is 20 nm to 100 nm.

36. The semiconductor device according to claim 35,
wherein a p type diffusion layer is formed in the n type diffusion layer.

37. A semiconductor device including a lateral IGBT formed in an n type high-resistance SOI region provided in a surface region of a semiconductor substrate, the lateral IGBT comprising:

(a) a p type collector layer formed in the high-resistance SOI region;

(b) an n type buffer layer formed in a vicinity of a pn junction between the high-resistance SOI region and the p type collector layer and having a higher n type impurity concentration than that of the high-resistance SOI region;

(c) a surface semiconductor layer formed apart from the p type collector layer and the n type buffer layer by a distance appropriate for maintaining a breakdown voltage and electrically connected to the high-resistance SOI region;

(d) a p type channel forming layer formed in a part of the surface semiconductor layer;

(e) an insulating film partially made of a gate insulating film and formed so as to sandwich at least a part of the p type channel forming layer;

(f) a p type emitter layer formed so as to be electrically connected to the p type channel forming layer in the surface semiconductor layer and having a higher p type impurity concentration than that of the p type channel forming layer;
(g) an n type source layer formed in a part of the surface semiconductor layer and electrically connected to both the p type channel forming layer and the p type emitter layer;
(h) a gate electrode formed over the gate insulating film;
(i) a collector electrode formed on a surface of the p type collector layer and electrically connected to the p type collector layer; and
(j) an emitter electrode formed over the p type emitter layer and the n type source layer and electrically connected to both the p type emitter layer and the n type source layer,
wherein, in a region in which the p type channel forming layer is sandwiched by the insulating film, a thickness of a thinnest part of the p type channel forming layer is 20 nm to 100 nm.

38. The semiconductor device according to claim 37, wherein a p type diffusion layer is formed between the p type collector layer and the n type buffer layer and the surface semiconductor layer in the high-resistance SOI region.

* * * * *